(12) United States Patent
Fujiwara et al.

(10) Patent No.: US 9,704,724 B2
(45) Date of Patent: Jul. 11, 2017

(54) PHOTOSENSITIVE RESIN COMPOSITION AND METHOD FOR PRODUCING SEMICONDUCTOR DEVICE

(71) Applicant: TORAY Industries, Inc., Tokyo (JP)

(72) Inventors: Takenori Fujiwara, Otsu (JP); Yugo Tanigaki, Otsu (JP); Mitsuhito Suwa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 14/352,255

(22) PCT Filed: Dec. 21, 2012

(86) PCT No.: PCT/JP2012/083186
§ 371 (c)(1),
(2) Date: Apr. 16, 2014

(87) PCT Pub. No.: WO2013/099785
PCT Pub. Date: Jul. 4, 2013

(65) Prior Publication Data
US 2014/0242787 A1  Aug. 28, 2014

(30) Foreign Application Priority Data
Dec. 26, 2011 (JP) ................. 2011-282963

(51) Int. Cl.
*H01L 21/426* (2006.01)
*G03F 7/075* (2006.01)
(Continued)

(52) U.S. Cl.
CPC .......... *H01L 21/426* (2013.01); *G03F 7/0045* (2013.01); *G03F 7/0047* (2013.01);
(Continued)

(58) Field of Classification Search
CPC ...... G03F 77/075; G03F 7/0754; G03F 7/075; G03F 7/0757; G03F 7/0233;
(Continued)

(56) References Cited

U.S. PATENT DOCUMENTS 3,655,457 A * 4/1972 Duffy ................ H01L 21/00
148/DIG. 151
4,889,901 A * 12/1989 Shama et al. ............. 526/279
(Continued)

FOREIGN PATENT DOCUMENTS

JP        05088372 A  *  4/1993  ............. G03F 7/00
JP        10-189476 A     7/1998
(Continued)

OTHER PUBLICATIONS

International Search Report issued in PCT/JP2012/083186 mailed Jan. 29, 2013.
(Continued)

*Primary Examiner* — Caridad Everhart
(74) *Attorney, Agent, or Firm* — Birch, Stewart, Kolasch & Birch, LLP

(57) ABSTRACT

Disclosed is a photosensitive resin composition which exhibits positive or negative photosensitivity and is used as a mask in an ion implantation step, the photosensitive resin composition including, as a resin, (A) a polysiloxane. The photosensitive resin composition of the present invention has high heat resistance and is capable of controlling a pattern shape, and also has excellent ion implantation mask performance, thus enabling application to a low-cost high-temperature ion implantation process.

14 Claims, 3 Drawing Sheets

(51) Int. Cl.
*G03F 7/038* (2006.01)
*G03F 7/004* (2006.01)
*G03F 7/022* (2006.01)
*G03F 7/023* (2006.01)
*G03F 7/027* (2006.01)
*G03F 7/032* (2006.01)

(52) U.S. Cl.
CPC .............. *G03F 7/022* (2013.01); *G03F 7/027* (2013.01); *G03F 7/0233* (2013.01); *G03F 7/032* (2013.01); *G03F 7/038* (2013.01); *G03F 7/0388* (2013.01); *G03F 7/0757* (2013.01)

(58) Field of Classification Search
CPC ...... G03F 7/0045; G03F 7/0047; G03F 7/038; G03F 7/032; G03F 7/0758; G03F 7/0388; H01L 21/438; H01L 21/428; H01L 21/02126; H01L 21/426
USPC .................. 438/551, 948; 427/219
See application file for complete search history.

(56) References Cited

U.S. PATENT DOCUMENTS

| | | | | |
|---|---|---|---|---|
| 5,114,826 | A * | 5/1992 | Kwong | G03F 7/0387 252/600 |
| 5,260,172 | A * | 11/1993 | Ito | G03F 7/094 430/271.1 |
| 5,393,641 | A * | 2/1995 | Ito et al. | 430/270.1 |
| 6,296,985 | B1 * | 10/2001 | Mizutani et al. | 430/270.1 |
| 6,387,590 | B1 * | 5/2002 | Mizutani et al. | 430/270.1 |
| 6,420,247 | B1 | 7/2002 | Charles et al. | |
| 8,828,642 | B2 * | 9/2014 | Kamogawa | G02B 1/04 430/270.1 |
| 2001/0049108 | A1 * | 12/2001 | McGall | C12Q 1/6837 435/6.11 |
| 2004/0197698 | A1 * | 10/2004 | Tamaki | G02B 6/122 430/270.1 |
| 2006/0063342 | A1 | 3/2006 | Fujikawa et al. | |
| 2007/0032002 | A1 | 2/2007 | Nonaka et al. | |
| 2008/0213549 | A1 * | 9/2008 | Lee | G03F 7/0233 428/195.1 |
| 2008/0311514 | A1 * | 12/2008 | Nakashima | C08G 77/045 430/281.1 |
| 2009/0081579 | A1 * | 3/2009 | Allen | C08G 77/60 430/270.1 |
| 2009/0269697 | A1 * | 10/2009 | Kato et al. | 430/270.1 |
| 2010/0028804 | A1 * | 2/2010 | Iwato | G03F 7/0045 430/270.1 |
| 2010/0216925 | A1 * | 8/2010 | Yano | 524/178 |
| 2011/0008730 | A1 * | 1/2011 | Hanamura | C08G 77/12 430/270.1 |
| 2012/0052439 | A1 * | 3/2012 | Wu | G03F 7/0233 430/270.1 |
| 2012/0141936 | A1 * | 6/2012 | Wu | G03F 7/40 430/270.1 |
| 2012/0178022 | A1 * | 7/2012 | Kamogawa et al. | 430/270.1 |
| 2012/0196225 | A1 * | 8/2012 | Li | G03F 7/0757 430/270.1 |
| 2012/0237873 | A1 | 9/2012 | Fujiwara et al. | |
| 2012/0276483 | A1 * | 11/2012 | Ogihara et al. | 430/319 |
| 2013/0158148 | A1 * | 6/2013 | Tsugane | C08F 299/08 522/28 |
| 2013/0158193 | A1 * | 6/2013 | Herzig | 524/588 |

FOREIGN PATENT DOCUMENTS

| | | |
|---|---|---|
| JP | 2003-530691 A | 10/2003 |
| JP | 2006-41166 A | 2/2006 |
| JP | 2006-324585 A | 11/2006 |
| JP | 2007-41361 A | 2/2007 |
| JP | 2007-42803 A | 2/2007 |
| JP | 2008-107529 A | 5/2008 |
| JP | 2008-108869 A | 5/2008 |
| JP | 2008-208342 A | 9/2008 |
| JP | 2009-42422 A | 2/2009 |
| JP | 2010-32996 A | 2/2010 |
| JP | 2010-33005 A | 2/2010 |
| WO | WO 2004/097914 A1 | 11/2004 |
| WO | WO 2011/040248 A1 | 4/2011 |
| WO | WO 2011/078106 A1 | 6/2011 |
| WO | WO 2011/129210 A1 | 10/2011 |
| WO | WO 2011/155382 A1 | 12/2011 |
| WO | WO2012020599 A1 * | 2/2012 ............ C08F 299/08 |

OTHER PUBLICATIONS

Written Opinion of the International Searching Authority issued in PCT/JP2012/083186 mailed Jan. 29, 2013.
European Search Report, dated Oct. 7, 2015, for European Application No. 12861162.1.

* cited by examiner

--PRIOR ART--

PHOTOSENSITIVE RESIN COMPOSITION AND METHOD FOR PRODUCING SEMICONDUCTOR DEVICE

TECHNICAL FIELD

The present invention relates to a photosensitive resin composition. More particularly, the present invention relates to a photosensitive resin composition for an ion implantation mask, which is preferably used in wide bandgap semiconductors such as silicon carbide (SiC).

BACKGROUND ART

Most of power devices have recently been made of a semiconductor Si. However, it is impossible to expect a power device using the semiconductor Si to make remarkable progress in future since its performance approaches performance limit due to physical properties of Si. When the semiconductor SiC is used as a material of the power device, a miniature power device with low loss and high efficiency is obtained, thus enabling simplification of cooling. Therefore, the semiconductor SiC is greatly expected to serve as a next generation power semiconductor material in future.

When producing a device using SiC, local doping technology is indispensable. However, it is difficult to perform doping by a diffusion method, as the local doping technology to SiC, because of very small diffusion coefficient of impurities against SiC. Therefore, ion implantation technology as another local doping method functions as an important process. There is a need to perform high concentration doping by high dose ion implantation so as to form a low resistance layer in the device using SiC. However, high dose ion implantation into SiC at room temperature had a problem that an implantation layer becomes continuous amorphous and satisfactory recrystallization does not proceed even if high temperature annealing is performed, thus failing to form a low resistance layer.

In order to solve such problem, there exists high temperature implantation technology in which a sample is heated to about 200 to 800° C. during ion implantation. Because of being exposed to high temperature, a silicon dioxide ($SiO_2$) film formed by a chemical vapor deposition (CVD) method is formed as an ion implantation mask used in high temperature implantation technology. In patterning of the ion implantation mask, a wet etching method using a photoresist as a mask, or a dry etching method such as a reactive ion etching (RIE) method is employed (see, for example, Patent Literature 1).

This process will be described with reference to FIG. 10. First, (1) a $SiO_2$ film 22 is deposited on a SiC substrate 21 by a CVD method. Next, (2) a photosensitive resist 23 is formed on the $SiO_2$ film 22. Then, (3) mask exposure and development, which constitute a conventional photolithography processing step, are performed to form a pattern of the photosensitive resist. Then, (4) the $SiO_2$ film is etched with hydrofluoric acid or the like to thereby perform patterning of a desired $SiO_2$ film. Then, (5) the photosensitive resist is removed by $O_2$ ashing. Then, (6) ion implantation is performed, and (7) the $SiO_2$ film is removed by a wet process using hydrofluoric acid or the like.

Since this ion implantation mask process is a very complicated and high cost process, a simple low cost process is needed. Use of a mask such as a $SiO_2$ film may cause a problem that ions are implanted into the region other than an opening of the mask, through the mask, by performing high energy ion implantation.

In order to solve the problem of the former, there is disclosed a method in which a chemically amplified photoresist is applied as an ion implantation mask layer and ion implantation is performed at room temperature (see, for example, Patent Literature 2). In order to solve the problem of the latter, there is disclosed a method in which a metal thin film of titanium or molybdenum having high mask performance is applied as an ion implantation mask layer (see, for example, Patent Literature 3).

There is also disclosed technology in which a polyimide resin film is used as an ion implantation mask for the purpose of providing a method for producing a semiconductor device, which enables ion implantation performed by accelerating ions with high energy at high temperature, and is capable of easily implanting impurities into a semiconductor substrate, particularly a SiC semiconductor substrate, in a region selective manner, to a sufficient depth (see, for example, Patent Literature 4).

CITATION LIST

Patent Literature

[Patent Literature 1]
Japanese Unexamined Patent Publication (Kokai) No. 2006-324585 (Paragraph 0011)
[Patent Literature 2]
Japanese Unexamined Patent Publication (Kokai) No. 2008-108869
[Patent Literature 3]
Japanese Unexamined Patent Publication (Kokai) No. 2007-42803
[Patent Literature 4]
PCT International Publication No. WO 2004/97914

SUMMARY OF INVENTION

Technical Problem

The chemically amplified photoresist disclosed in Patent Literature 2 achieves low cost, but has a problem of not being able to perform high temperature ion implantation.

Titanium or molybdenum disclosed in Patent Literature 3 has heat resistance and mask performance enough to perform high temperature ion implantation, while the process is a high cost process similarly to Patent Literature 1 because of removing an optional place.

The polyimide disclosed in Patent Literature 4 has a problem of not being able to form a rectangular pattern shape because of its large shrinkage ratio during firing of about 30%, leading to low resolution. Therefore, a boundary of ion implantation becomes blurred at a boundary between a masked area and an unmasked area.

As mentioned above, technology for low cost and high temperature ion implantation process has not yet been established.

The present invention has been made in view of the above-mentioned circumstances, and an object thereof is to provide a photosensitive resin composition which has high heat resistance and is capable of controlling a pattern shape, and also has excellent ion implantation mask performance, thus enabling application to a low-cost high-temperature ion implantation process.

Solution to Problem

In order to achieve the above object, in the present invention, there is applied a photosensitive resin composition which exhibits positive or negative photosensitivity and is used as a mask in an ion implantation step, the photosensitive resin composition including, as a resin, (A) a polysiloxane.

Another aspect of the present invention is directed to a photosensitive resin composition including (A) a polysiloxane, (C) inorganic particles, and (D) a naphthoquinone diazide compound, wherein the polysiloxane (A) is a polysiloxane obtained by hydrolyzing one or more organosilane(s) selected from an organosilane represented by the general formula (1) and an organosilane represented by the general formula (2), and an organosilane having an acidic group, followed by dehydration condensation, and the content of the inorganic particles (C) is 15% by weight or more based on the whole solid content excluding a solvent in the photosensitive resin composition:

[Chemical Formula 1]

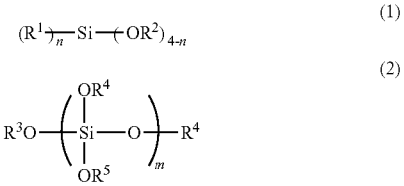

wherein $R^1$ in the organosilane represented by the general formula (1) represents a group selected from hydrogen, an alkyl group having 1 to 10 carbon atoms, a cycloalkyl group having 1 to 10 carbon atoms, an alkenyl group having 2 to 10 carbon atoms and an aryl group having 6 to 15 carbon atoms, and a plurality of $R^1$(s) may be respectively the same or different; $R^2$ represents a group selected from hydrogen, an alkyl group having 1 to 6 carbon atoms, an acyl group having 2 to 6 carbon atoms and an aryl group having 6 to 15 carbon atoms, and a plurality of $R^2$(s) may be respectively the same or different; these alkyl groups, acyl groups, and aryl group may be either a non-substitution product or a substitution product; and n represents an integer of 1 to 3; and wherein $R^3$ to $R^6$, in the organosilane represented by the general formula (2), each independently represents a group selected from hydrogen, an alkyl group having 1 to 6 carbon atoms, an acyl group having 2 to 6 carbon atoms and an aryl group having 6 to 15 carbon atoms; these alkyl groups, acyl groups and aryl groups may be either a non-substitution product or a substitution product; and m represents an integer of 1 to 8.

The present invention also includes a method for producing a semiconductor device, which includes steps of forming a pattern of the above photosensitive resin composition on a semiconductor substrate; firing the pattern of the resin composition to obtain a fired pattern; implanting ions into the region of the semiconductor substrate where the fired pattern does not exist, using the fired pattern as an ion implantation mask.

Advantageous Effects of Invention

The photosensitive resin composition of the present invention can be suitably used as a mask in an ion implantation step. According to the photosensitive resin composition of the present invention, it is possible to realize a process-saving high temperature ion implantation process as compared with a conventional ion implantation mask process. According to a method for producing a semiconductor device of the present invention, it is possible to provide a process for producing a power semiconductor with high productivity at low cost as compared with a conventional ion implantation mask process.

DESCRIPTION OF EMBODIMENTS

The photosensitive resin composition of the present invention includes, as a resin, (A) a polysiloxane. The polysiloxane is a heat-resistant resin, and is allowed to undergo dehydration condensation by subjecting to high temperature firing to form a high heat-resistant siloxane bond (Si—O). Employment of high heat resistance enables imparting of a function of serving as a mask material to ion implantation at high temperature. The photosensitive resin composition of the present invention is capable of controlling a pattern shape, and also maintaining a rectangular shape or a shape similar to the rectangular shape even after firing.

Figure 9:
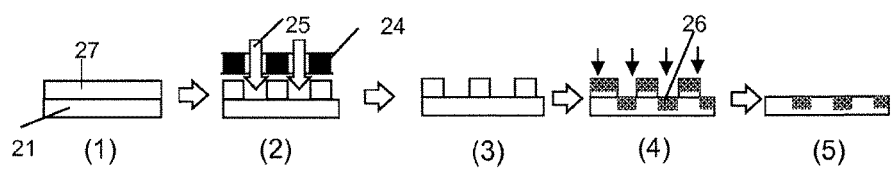
FIG. 9 is a process chart showing an ion implantation process when a photosensitive resin composition of the present invention is used as an ion implantation mask.
Figure 10:
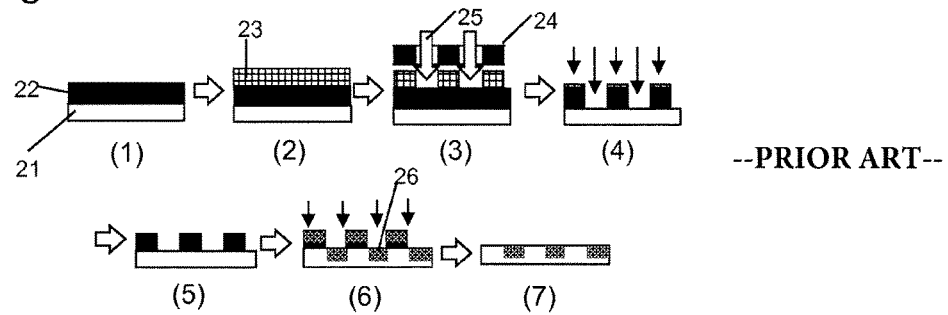
FIG. 10 is a process chart showing an ion implantation process when a conventional $SiO_2$ film is used as an ion implantation mask.

An ion implantation process using the photosensitive resin composition of the present invention will be described with reference to FIG. 9. First, (1) a film of a photosensitive resin composition 27 of the present invention is formed on a SiC substrate 21. Next, (2) mask exposure and development, which constitute a conventional photolithography processing step, are performed by irradiating with ultraviolet rays 25 through a photomask 24 having a desired pattern, thus forming a pattern of the photosensitive resist of the present invention. Then, (3) the photosensitive resin composition thus formed into a pattern of the present invention is fired at high temperature. Then, (4) ion implantation is performed to form an ion implanted region 26, and (5) a fired film of the photosensitive resin composition of the present invention is removed by a wet process using hydrofluoric acid or the like.

As mentioned above, use of the photosensitive resin composition of the present invention enables remarkable simplification of the process as compared with a conventional process, leading to low cost process. Low cost process is also achieved in view of the fact that an expensive CVD device, which was required when employing a SiO$_2$ film as an ion implantation mask, is no longer required.

When a fired film is formed using the photosensitive resin composition of the present invention, the firing temperature is preferably 200° C. or higher, more preferably 300° C. or higher, still more preferably 400° C. or higher, and particularly preferably 500° C. or higher. The firing temperature of higher than 1,000° C. may cause large film shrinkage ratio, leading to the occurrence of cracking in the fired film. The film may be sometimes exposed to high temperature during firing or ion implantation, and thus a resin used in the photosensitive resin composition of the present invention is preferably a polysiloxane because of having high heat resistance. Regarding the polysiloxane, 1% weight-loss temperature of the fired film is preferably 200° C. or higher. Since the film may be exposed to high-temperature vacuum during ion implantation, the 1% weight-loss temperature of the polysiloxane fired film is more preferably 300° C. or higher, and still more preferably 400° C. or higher. If the 1% weight-loss temperature of the polysiloxane fired film is lower than 200° C., a gas may be generated from the fired film when exposed to high-temperature vacuum, leading to contamination of an ion implantation apparatus. The weight-loss temperature can be determined by measuring the 1% weight-loss temperature (Td1%) in which a weight loss becomes 1% under the conditions where a fired film is maintained in a nitrogen atmosphere at 30° C. for 10 minutes using a thermogravimeter "TGA-50" (trade name, manufactured by Shimadzu Corporation), and then the temperature is raised to 800° C. at a temperature rise rate of 10° C./min.

The polysiloxane (A) used in the photosensitive resin composition of the present invention is preferably a polysiloxane obtained by hydrolyzing one or more organosilane(s) selected from an organosilane represented by the below-mentioned general formula (1) and an organosilane represented by the below-mentioned general formula (2), followed by dehydration condensation.

[Chemical Formula 2]

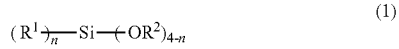
(1)

In the general formula (1), R$^1$ represents a group selected from hydrogen, an alkyl group having 1 to 10 carbon atoms, a cycloalkyl group having 1 to 10 carbon atoms, an alkenyl group having 2 to 10 carbon atoms and an aryl group having 6 to 15 carbon atoms, and a plurality of R$^1$(s) may be respectively the same or different. These alkyl groups, cycloalkyl groups, alkenyl groups, and aryl groups may be either a non-substitution product or a substitution product, which can be selected according to properties of the composition.

Specific examples of the alkyl group include a methyl group, an ethyl group, an n-propyl group, an isopropyl group, an n-butyl group, a t-butyl group, an n-hexyl group, an n-decyl group and the like. Specific examples of the cycloalkyl group include a cyclopentyl group, a cyclohexyl group and the like. Examples of the substituent thereof include halogen, an epoxy group, a glycidyl group, an oxetanyl group, a carboxy group, an amino group, a mercapto group, an isocyanate group, a succinic anhydride residue and the like. Specific examples of the substituted alkyl group include a trifluoromethyl group, a 3,3,3-trifluoropropyl group, a 3-glycidoxypropyl group, a 2-(3,4-epoxycyclohexyl)ethyl group, a [(3-ethyl-3-oxetanyl)methoxy] propyl group, a 1-carboxy-2-carboxypentyl group, a 3-aminopropyl group, a 3-mercaptopropyl group, a 3-isocyanatepropyl group, a group having the following structure and the like.

[Chemical Formula 3]

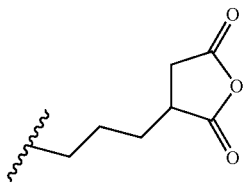

Specific examples of the alkenyl group and a substitution product thereof include a vinyl group, an allyl group, a 3-acryloxypropyl group, a 3-methacryloxypropyl group, a 2-methacryloxyethyl group, a 2-acryloxyethyl group and the like. Specific examples of the aryl group and a substitution product thereof include a phenyl group, a 4-tolyl group, a 4-hydroxyphenyl group, a 4-methoxyphenyl group, a 4-t-butylphenyl group, a 1-naphthyl group, a 2-naphthyl group, a 4-styryl group, a 2-phenylethyl group, a 1-(4-hydroxyphenyl)ethyl group, a 2-(4-hydroxyphenyl)ethyl group, a 4-hydroxy-5-(4-hydroxyphenylcarbonyloxy)pentyl group and the like. However, R$^1$ is not limited to these specific examples.

R$^2$ in the general formula (1) represents hydrogen, an alkyl group having 1 to 6 carbon atoms, an acyl group having 2 to 6 carbon atoms, or an aryl group having 6 to 15 carbon atoms, and a plurality of R$^2$(s) may be respectively the same or different. These alkyl groups, acyl groups and aryl groups may be either a non-substitution product or a substitution product, which can be selected according to properties of the composition.

Specific examples of the alkyl group include a methyl group, an ethyl group, an n-propyl group, an isopropyl group, an n-butyl group and the like. Specific examples of the acyl group include an acetyl group and the like. Specific examples of the aryl group include a phenyl group, a 4-tolyl group, a 4-hydroxyphenyl group, a 4-methoxyphenyl group, a 4-t-butylphenyl group, a 1-naphthyl group and the like. However, R$^2$ is not limited to these specific examples.

n in the general formula (1) represents an integer of 1 to 3. The organosilane is a trifunctional silane when n=1, a difunctional silane when n=2, or a monofunctional silane when n=3.

Specific examples of the organosilane represented by the general formula (1) include a trifunctional silane such as methyltrimethoxysilane, methyltriethoxysilane, methyl tri-n-propoxysilane, methyltriisopropoxysilane, methyl tri-n-butoxysilane, ethyltrimethoxysilane, ethyitriethoxysilane, ethyl tri-n-propoxysilane, ethyltriisopropoxysilane, ethyl tri-n-butoxysilane, n-propyltrimethoxysilane, n-propyltriethoxysilane, isopropyltrimethoxysilane, isopropyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-acryloxypropyltriethoxysilane, 3-acryloxypropylmethyldimethoxysilane, 3-acryloxypropylmethyldiethoxysilane, phenyltrimethoxysilane, phenyltriethoxysilane, 4-tolyltrimethoxysilane, 4-hydroxyphenyltrimethoxysilane, 4-methoxyphenyltrimethoxysilane, 4-t-butylphenyltrimethoxysilane, 1-naphthyltrimethoxysilane, 4-styryltrimethoxysilane, 2-phenylethyltrimethoxysilane, 4-hydroxybenzyltrimethoxysilane, 1-(4-hydroxyphenyl)ethyltrimethoxysilane, 2-(4-hydroxyphenyl)ethyltrimethoxysilane, 4-hydroxy-5-(4-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-aminopropyltrimethoxysilane, 3-aminopropyltriethoxysilane, 3-mercaptopropyltrimethoxysilane, 3-trimethoxysilylpropylsuccinic acid, or 3-trimethoxysilylpropylsuccinicanhydride; a difunctional silane such as dimethyldimethoxysilane, dimethyldiethoxysilane, dimethyldiacetoxysilane, diethyldimethoxysilane, diethyldiethoxysilane, di-n-propyldimethoxysilane, di-n-propyldiethoxysilane, diisopropyldimethoxysilane, diisopropyldiethoxysilane, di-n-butyldimethoxysilane, diphenyldimethoxysilane, (3-glycidoxypropyl)methyldimethoxysilane, (3-glycidoxypropyl)methyldiethoxysilane, dicyclopentyldimethoxysilane, cyclohexylmethyldimethoxysilane, methylvinyldimethoxysilane, or divinyldiethoxysilane; and a monofunctional silane such as trimethylmethoxysilane, tri-n-butylethoxysilane, (3-glycidoxypropyl)dimethylmethoxysilane, or (3-glycidoxypropyl)dimethylethoxysilane. These organosilanes may be used alone, or two or more organosilanes may be used in combination. Among these organosilanes, a monofunctional silane or a difunctional silane is preferably used from the view point of cracking resistance during firing, and a trifunctional silane is preferably used in view of hardness.

When positive photosensitivity is imparted, 1-naphthyltrimethoxysilane is particularly preferably used from the viewpoint of an improvement in resolution. It is considered that 1-naphthyltrimethoxysilane enables generation of three silanol groups in a stage of hydrolysis in the polymerization of a polysiloxane, while all three silanol groups do not undergo the reaction in a stage of the subsequent dehydration condensation due to steric hindrance of a 1-naphthyl group, leading to remaining of one or more silanol groups. Therefore, in the below-mentioned exposure step, the exposed area exhibits more improved solubility in an alkali developing solution due to the residual silanol derived from a 1-naphthylsilane unit. On the other hand, the unexposed area exhibits more suppressed solubility in an alkali developing solution due to hydrophobicity of a 1-naphthyl group. Therefore, it is assumed that inclusion of the 1-naphthylsilane unit increases a difference in solubility in an alkali developing solution between the exposed area and the unexposed area, thus improving a dissolution contrast ratio, leading to an improvement in resolution.

Preferred content ratio of an organosilane unit represented by the general formula (1) is as follows. The content ratio of a monofunctional silane unit to the whole silane monomer in the polysiloxane is preferably from 0 to 10 mol %, and more preferably from 0 to 5 mol %, in terms of a molar ratio of Si atoms to the number of moles of Si atoms derived from the organosilane of the whole polysiloxane. The content ratio of a monofunctional silane unit of more than 10 mol % may cause a decrease in molecular weight of the polysiloxane. The content ratio of a difunctional silane unit to the whole silane monomer is preferably from 0 to 60 mol %, and more preferably from 0 to 40 mol %, in terms of a molar ratio of Si atoms to the number of moles of Si atoms derived from the organosilane of the whole polysiloxane. The content ratio of a difunctional silane unit of more than 60 mol % may cause a decrease in glass transition temperature of the polysiloxane and reflow of a pattern during firing, thus failing to form a rectangular pattern. The content ratio of a trifunctional silane unit to the whole silane monomer is preferably from 50 to 100 mol %, and more preferably from 60 to 100 mol %, in terms of a molar ratio of Si atoms to the number of moles of Si atoms derived from the organosilane of the whole polysiloxane. The content ratio of a trifunctional silane unit of less than 50 mol % may cause a decrease in hardness after firing.

The content ratio of the organosilane unit represented by the general formula (1) can be determined by using $^1$H-NMR, $^{13}$C-NMR, $^{29}$Si-NMR, IR, TOF-MS, an elemental analysis method and an ash measurement in combination.

[Chemical Formula 4]

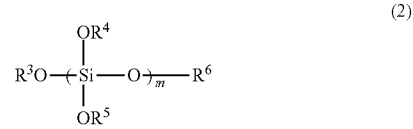

(2)

In the general formula (2), $R^3$ to $R^6$ each independently represents a group selected from hydrogen, an alkyl group having 1 to 6 carbon atoms, an acyl group having 2 to 6 carbon atoms and an aryl group having 6 to 15 carbon atoms. These alkyl groups, acyl groups and aryl groups may be either a non-substitution product or a substitution product, which can be selected according to properties of the composition.

Specific examples of the alkyl group include a methyl group, an ethyl group, an n-propyl group, an isopropyl group, an n-butyl group and the like. Specific examples of the acyl group include an acetyl group and the like. Specific examples of the aryl group include a phenyl group and the like. However, $R^3$ to $R^6$ are not limited to these specific examples. m in the general formula (2) represents an integer of 1 to 8.

When using the organosilane represented by the general formula (2), it is possible to obtain a photosensitive resin composition having excellent sensitivity and resolution while maintaining high heat resistance and transparency.

It is desired that the polysiloxane is transparent to active chemical rays for exposure as much as possible. Therefore, an absorbance in i-line (wavelength of 365 nm) of a prebaked film formed by using a polysiloxane solution (solid component concentration of 35 to 45%) is preferably 0.1 or less, and more preferably 0.08 or less, per 1 μm. The absorbance of 0.1 or less gives an advantage that sensitivity is improved when exposed to active chemical rays of 365 nm wavelength since the absorption of a photosensitive resin composition to active chemical rays of 365 nm wavelength decreases. As used herein, the prebaked film refers to a film having a thickness of 1 to 10 μm which is obtained by coating "TEMPAX glass substrate" (trade name, manufactured by AGC TECHNO GLASS Co., Ltd.) with a polysiloxane solution under the conditions of an optional rotational speed and time using a spin coater "MS-A100" (trade name, manufactured by MIKASA CO., LTD.), followed by baking at 100° C. for 2 to 4 minutes using a hot plate "SCW-636" (trade name, manufactured by DAINIPPON SCREEN MFG. CO., LTD.).

The content ratio of an organosilane unit represented by the general formula (2) in the polysiloxane is preferably 30 mol % or less, and more preferably 20 mol % or less, in terms of a molar ratio of Si atoms to the number of moles of Si atoms derived from the organosilane of the whole polysiloxane. If the content ratio is within the above preferred range, resolution and pattern shape are improved when a pattern is formed using a photosensitive resin composition, thus obtaining a pattern having a shape closer to a rectangular shape. This is because incorporation of the organosilane unit represented by the general formula (2) into the polysiloxane may cause an increase in glass transition temperature of a film, leading to suppression of reflow of a pattern during firing. The content ratio of the organosilane unit represented by the general formula (2) of more than 30 mol % may sometimes cause cracking in the fired film. The content ratio of the organosilane unit represented by the general formula (2) can be determined by using $^{1}$H-NMR, $^{13}$C-NMR, $^{29}$Si-NMR, IR, TOF-MS, an elemental analysis method and an ash measurement in combination.

Specific examples of the organosilane represented by the general formula (2) include a tetrafunctional silane such as tetramethoxysilane, tetraethoxysilane, tetra-n-propoxysilane, tetraisopropoxysilane, tetra-n-butoxysilane, or tetraacetoxysilane; and a silicate compound such as "Methyl Silicate 51" (trade name, manufactured by Fuso Chemical Co., Ltd.), "M Silicate 51", "Silicate 40", "Silicate 45" (all of which are trade names, manufactured by Tama Chemicals Co., Ltd.), or "Methyl Silicate 51", "Methyl Silicate 53A", "Ethyl Silicate 40", "Ethyl Silicate 48" (all of which are trade names, manufactured by COLCOAT CO., Ltd.). These organosilanes may be used alone, or two or more organosilanes may be used in combination.

The photosensitive resin composition of the present invention preferably includes (C) inorganic particles. As used herein, inclusion of inorganic particles includes both of an aspect in which the photosensitive resin composition merely includes inorganic particles, and an aspect in which a polysiloxane, which is obtained by reacting one or more organosilane(s) selected from an organosilane represented by the above-mentioned general formula (1) and an organosilane represented by the above-mentioned general formula (2) with inorganic particles, is used as the polysiloxane (A) used in the photosensitive resin composition. The inorganic particles are particles made of a metal compound or a semiconductor compound. Examples of the metal or semiconductor include elements selected from the group consisting of silicon, lithium, sodium, magnesium, potassium and calcium. Examples of the metal compound or semiconductor compound include halide, oxide, nitride, hydroxide, carbonate, sulfate, nitrate, metasilicate and the like of the metal or semiconductor.

The reaction of an organosilane with inorganic particles means that an organosilane is hydrolyzed in the presence of inorganic particles, followed by dehydration condensation to obtain an inorganic particle-containing polysiloxane. Hereinafter, the polysiloxane obtained by reacting an organosilane with inorganic particles is referred to as an inorganic particle-containing polysiloxane. When inorganic particles are silica particles, the obtained product is referred to as a silica particle-containing polysiloxane. The polysiloxane obtained without being reacted with inorganic particles is referred to as a polysiloxane containing no inorganic particles. The reaction of an organosilane with inorganic particles enables an improvement in pattern shape when a pattern is formed using a photosensitive resin composition, thus obtaining a pattern having a shape closer to a rectangular shape. This is because incorporation of inorganic particles into a polysiloxane may cause an increase in glass transition temperature of a film, leading to suppression of reflow of a pattern during firing. Because of its small shrinkage during firing, inorganic particles enables suppression of the production of shrinkage stress, leading to an improvement in cracking resistance during firing. When using an inorganic particle-containing polysiloxane, a polysiloxane is bonded to inorganic particles having poor solubility in an alkali developing solution, thus improving alkali solubility of inorganic particles. Therefore, use of the inorganic particle-containing polysiloxane enables an improvement in resolution as compared with an aspect in which the photosensitive resin composition merely includes inorganic particles.

The number average particle diameter of inorganic particles is preferably from 1 to 200 nm, and still more preferably from 5 to 70 nm. Control of the number average particle diameter to 1 nm or more enables an improvement in cracking resistance during firing. Control of the number average particle diameter to 200 nm or less enables suppression of light scattering, leading to suppression of deterioration of sensitivity during patterning exposure and deterioration of transparency of a fired film. Herein, the number average particle diameter of inorganic particles can be determined by measuring laser scattering due to Brownian motion of inorganic particles in a chemical solution (dynamic light scattering method) using a submicron particle size distribution analyzer "N4-PLUS" (trade name, manufactured by Beckman Coulter, Inc.).

Specific examples of inorganic particles (C) include silica particles, lithium fluoride particles, lithium chloride particles, lithium bromide particles, lithium oxide particles, lithium carbonate particles, lithium sulfate particles, lithium nitrate particles, lithium metasilicate particles, lithium hydroxide particles, sodium fluoride particles, sodium chloride particles, sodium bromide particles, sodium carbonate particles, sodium hydrogen carbonate particles, sodium sulfate particles, sodium nitrate particles, sodium metasilicate particles, sodium hydroxide particles, magnesium fluoride particles, magnesium chloride particles, magnesium bromide particles, magnesium oxide particles, magnesium carbonate particles, magnesium sulfate particles, magnesium nitrate particles, magnesium hydroxide particles, potassium fluoride particles, potassium chloride particles, potassium bromide particles, potassium carbonate particles, potassium sulfate particles, potassium nitrate particles, calcium fluoride particles, calcium chloride particles, calcium bromide particles, calcium oxide particles, calcium carbonate particles, calcium sulfate particles, calcium nitrate particles, calcium hydroxide particles, strontium fluoride particles, barium fluoride particles, lanthanum fluoride particles and the like.

Among these inorganic particles, silica particles are preferable from the viewpoint of compatibility with a polysiloxane Regarding an ion implantation mask using a $SiO_2$ film by a conventional CVD method, the ion implantation mask is removed in a wet process using hydrofluoric acid after ion implantation. In order to apply to the wet process, silica particles are more preferable in view of the fact that silicon compound particles soluble in hydrofluoric acid are preferable.

In order to make the reaction with a resin as a matrix easier, inorganic particles preferably have a functional group capable of reacting with a resin, such as a hydroxy group, on a surface of each particle. When inorganic particles have satisfactory reactivity with a resin as a matrix, inorganic particles are incorporated into a polysiloxane during firing, thus suppressing the production of shrinkage stress, leading to an improvement in cracking resistance during firing.

Specific examples of silica particles include "methanol silica sol" having a number average particle diameter (hereinafter referred to as a particle diameter) of 10 to 20 nm in which methanol is used as a dispersion medium, "IPA-ST" having a particle diameter of 10 to 20 nm in which isopropyl alcohol is used as a dispersion medium, "IPA-ST-UP" having a particle diameter of 40 to 100 nm in which isopropyl alcohol is used as a dispersion medium, "IPA-ST-L" having a particle diameter of 45 to 100 nm in which isopropyl alcohol is used as a dispersion medium, "IPA-ST-ZL" having a particle diameter of 70 to 100 nm in which isopropyl alcohol is used as a dispersion medium, "EG-ST" having a particle diameter of 10 to 20 nm in which ethylene glycol is used as a dispersion medium, "NPC-ST-30" having a particle diameter of 10 to 20 nm in which n-propylcellosolve is used as a dispersion medium, "DMAC-ST" having a particle diameter of 10 to 20 nm in which dimethylacetamide is used as a dispersion medium, "EG-ST having a particle diameter of 10 to 20 nm in which ethylene glycol is used as a dispersion medium, "MEK-ST" having a particle diameter of 10 to 20 nm in which methyl ethyl ketone is used as a dispersion medium, "MIBK-ST" having a particle diameter of 10 to 20 nm in which methyl isobutyl ketone is used as a dispersion medium, "XBA-ST" having a particle diameter of 10 to 20 nm in which a mixed solvent of xylene and n-butanol is used as a dispersion medium, "PMA-ST" having a particle diameter of 10 to 20 nm in which propylene glycol monomethyl ether acetate is used as a dispersion medium, "PGM-ST" having a particle diameter of 10 to 20 nm in which propylene glycol monomethyl ether is used as a dispersion medium, "SNOWTEX (registered trademark) XS" having a particle diameter of 4 to 6 nm in which a dispersion solution is water, "SNOWTEX (registered trademark) OXS" having a particle diameter of 4 to 6 nm in which a dispersion solution is water, "SNOWTEX (registered trademark) NXS" having a particle diameter of 4 to 6 nm in which a dispersion solution is water, "SNOWTEX (registered trademark) CXS-9" having a particle diameter of 4 to 6 nm in which a dispersion solution is water, "SNOWTEX (registered trademark) S" having a particle diameter of 8 to 11 nm in which a dispersion solution is water, "SNOWTEX (registered trademark) OS" having a particle diameter of 8 to 11 nm in which a dispersion solution is water, "SNOWTEX (registered trademark) NS" having a particle diameter of 8 to 11 nm in which a dispersion solution is water, "SNOWTEX (registered trademark) 20" having a particle diameter of 10 to 20 nm in which a dispersion solution is water, "SNOWTEX (registered trademark) 30" having a particle diameter of 10 to 20 nm in which a dispersion solution is water, "SNOWTEX (registered trademark) 40" having a particle diameter of 10 to 20 nm in which a dispersion solution is water, "SNOWTEX (registered trademark) 0" having a particle diameter of 10 to 20 nm in which a dispersion solution is water, "SNOWTEX (registered trademark) N" having a particle diameter of 10 to 20 nm in which a dispersion solution is water, "SNOWTEX (registered trademark) C" having a particle diameter of 10 to 20 nm in which a dispersion solution is water, "SNOWTEX (registered trademark) AK" having a particle diameter of 10 to 20 nm in which a dispersion solution is water, "SNOWTEX (registered trademark) 50" having a particle diameter of 20 to 30 nm in which a dispersion solution is water, "SNOWTEX (registered trademark) 0-40" having a particle diameter of 20 to 30 nm in which a dispersion solution is water, "SNOWTEX (registered trademark) N-40" having a particle diameter of 20 to 30 nm in which a dispersion solution is water, "SNOWTEX (registered trademark) CM" having a particle diameter of 20 to 30 nm in which a dispersion solution is water, "SNOWTEX (registered trademark) 20L" having a particle diameter of 40 to 50 nm in which a dispersion solution is water, "SNOWTEX (registered trademark) OL" having a particle diameter of 40 to 50 nm in which a dispersion solution is water, "SNOWTEX (registered trademark) XL" having a particle diameter of 40 to 60 nm in which a dispersion solution is water, "SNOWTEX (registered trademark) YL" having a particle diameter of 50 to 80 nm in which a dispersion solution is water, "SNOWTEX (registered trademark) ZL" having a particle diameter of 70 to 100 nm in which a dispersion solution is water, "SNOWTEX (registered trademark) MP-1040" having a particle diameter of about 100 nm in which a dispersion solution is water, "SNOWTEX (registered trademark) MP-2040" having a particle diameter of about 200 nm in which a dispersion solution is water, "SNOWTEX (registered trademark) MP-3040" having a particle diameter of about 300 nm in which a dispersion solution is water, "SNOWTEX (registered trademark) MP-4540M" having a particle diameter of about 450 nm in which a dispersion solution is water, "SNOWTEX (registered trademark) UP" having a particle diameter of 40 to 100 nm in which a dispersion solution is water, "SNOWTEX (registered trademark) OUP" having a particle diameter of 40 to 100 nm in which a dispersion solution is water, "SNOWTEX (registered trademark) PS-S" having a particle diameter of 80 to 120 nm in which a dispersion solution is water, "SNOWTEX (registered trademark) PS-N" having a particle diameter of 80 to 150 nm in which a dispersion solution is water (all of which are trade names, manufactured by Nissan Chemical Industries, Ltd.); "OSCAL (registered trademark)-1421" having a particle diameter of 5 to 10 nm in which isopropyl alcohol is used as a dispersion medium, "OSCAL (registered trademark)-1432" having a particle diameter of 10 to 20 nm in which isopropyl alcohol is used as a dispersion medium, "OSCAL (registered trademark)-1132" having a particle diameter of 10 to 20 nm in which methanol is used as a dispersion medium, "OSCAL (registered trademark)-1632" having a particle diameter of 10 to 20 nm in which ethylene glycol monomethyl ether is used as a dispersion medium, "OSCAL (registered trademark)-1842" having a particle diameter of 10 to 20 nm in which methyl isobutyl ketone is used as a dispersion medium, "OSCAL (registered trademark)-1727BM" having a particle diameter of 110 to 130 nm in which ethylene glycol is used as a dispersion medium, "OSCAL (registered trademark)-1727TH" having a particle diameter of 150 to 170 nm in which ethylene glycol is used as a dispersion medium, "OSCAL (registered trademark)-101" having a particle diameter of 10 to 20 nm in which γ-butyrolactone is used as a dispersion medium, "OSCAL (registered trademark)-105" having a particle diameter of 55 to 70 nm in which γ-butyrolactone is used as a dispersion medium, "OSCAL (registered trademark)-106" having a particle diameter of 110 to 130 nm in which diacetone alcohol is used as a dispersion medium, "CATALOID (registered trademark)-S" having a particle diameter of 5 to 80 nm in which a dispersion solution is water" (all of which are trade names, manufactured by JGC Catalysts and Chemicals Ltd.); "Quartron (registered trademark) PL-06L" having a particle diameter of 5 to 10 nm in which a dispersion solution is water, "Quartron (registered trademark) PL-1" having a particle diameter of 10 to 15 nm in which a dispersion solution is water, "Quartron (registered trademark) PL-2L" having a particle diameter of 15 to 20 nm in which a dispersion solution is water, "Quartron (registered trademark) PL-3" having a particle diameter of 30 to 40 nm in which a dispersion solution is water, "Quartron (registered trademark) PL-7" having a particle diameter of 70 to 85 nm in which a dispersion solution is water, "Quartron (registered trademark) PL-10H" having a particle diameter of 80 to 100 nm in which a dispersion solution is water, "Quartron (registered trademark) PL-20" having a particle diameter of 230 to 250 nm in which a dispersion solution is water, "Quartron (registered trademark) PL-50" having a particle diameter of 480 to 500 nm in which a dispersion solution is water, "Quartron (registered trademark) GP-2L" having a particle diameter of 25 to 35 nm in which a dispersion solution is water, "Quartron (registered trademark) PL-2L-MA" having a particle diameter of 15 to 20 nm in which methanol is used as a dispersion medium, "Quartron (registered trademark) PL-1-IPA" having a particle diameter of 10 to 15 nm in which isopropyl alcohol is used as a dispersion medium, "Quartron (registered trademark) PL-2L-IPA" having a particle diameter of 15 to 20 nm in which isopropyl alcohol is used as a dispersion medium, "Quartron (registered trademark) PL-2L-PGME" having a particle diameter of 15 to 20 nm in which propylene glycol monomethyl ether is used as a dispersion medium, "Quartron (registered trademark) PL-2L-DAA" having a particle diameter of 15 to 20 nm in which diacetone alcohol is used as a dispersion medium, "Quartron (registered trademark) PL-2L-BL" having a particle diameter of 15 to 20 nm in which γ-butyrolactone is used as a dispersion medium, "Quartron (registered trademark) PL-1-Tol" having a particle diameter of 10 to 15 nm in which toluene is used as a dispersion medium, "Quartron (registered trademark) PL-2L-Tol" having a particle diameter of 15 to 20 nm in which toluene is used as a dispersion medium (all of which are trade names, manufactured by Fuso Chemical Co., Ltd.); "Silica ($SiO_2$) SG-SO100" (trade name, manufactured by KCM Corporation) having a particle diameter of 100 nm, "REOLOSIL (registered trademark)" (trade name, manufactured by Tokuyama Corporation) having a particle diameter of 5 to 50 nm and the like.

Specific examples of silica-lithium oxide composite particles include "Lithium Silicate 45" (trade name, manufactured by Nissan Chemical Industries, Ltd.) and the like.

These inorganic particles may be used alone, or two or more inorganic particles may be used in combination. These inorganic particles have a hydroxy group on a surface of each particle and have satisfactory reactivity with a resin as a matrix, particularly satisfactory reactivity with a polysiloxane.

The content of inorganic particles (C) is not particularly limited, and is preferably 5% by weight or more, more preferably 7% by weight or more, still more preferably 10% by weight or more, particularly preferably 12% by weight or more, extremely preferably 15% by weight or more, and most preferably 20% by weight or more, based on the whole solid content excluding a solvent in the photosensitive resin composition. The content of inorganic particles is preferably 80% by weight or less, more preferably 70% by weight or less, and still more preferably 60% by weight or less, based on the whole solid content excluding a solvent in the photosensitive resin composition. The content of inorganic particles of less than 5% by weight may sometimes exert insufficient effect of improving cracking resistance. The content of inorganic particles of more than 80% by weight may sometimes cause formation of residues and deterioration of transparency of a fired film after the development. If the content of inorganic particles is 15% by weight or more, ion implantation mask performance is particularly excellent when the photosensitive resin composition of the present invention is applied for an ion implantation mask. That is, since ions do not reach the deep portion of the film, it becomes possible to decrease the film thickness of the ion implantation mask. When inorganic particles are silica particles, the content of silica particles within the above preferred range enables satisfactory compatibility between the polysiloxane and the below-mentioned naphthoquinone diazide compound, excellent developing properties, and excellent transparency of a fired film. When inorganic particles reacted with an organosilane and merely included inorganic particles exist, the content of inorganic particles as used herein is the total of amounts of both inorganic particles.

When using an inorganic particle-containing polysiloxane, inorganic particles per se may sometimes have poor solubility in an alkali developing solution, thus causing formation of residues and deterioration of resolution after the development as compared with the case where a polysiloxane containing no inorganic particles. Thus, it is preferred to copolymerize an organosilane having an acidic group in a polysiloxane to thereby enhance solubility of the polysiloxane in an alkali developing solution. An acidic group is preferably a group which exhibits acidity of lower than pH 6, and specific examples thereof include a carboxy group, an acid anhydride group, a sulfonic acid group, a phenolic hydroxyl group, a hydroxyimide group, a silanol group and the like. Specific examples of an organosilane having an acidic group include 3-mercaptopropyltrimethoxysilane, 3-trimethoxysilylpropylsuccinic acid, 3-trimethoxysilylpropylsuccinic anhydride, 4-hydroxyphenyltrimethoxysilane, 4-methoxyphenyltrimethoxysilane, 4-hydroxybenzyltrimethoxysilane, 1-(4-hydroxyphenyl)ethyltrimethoxysilane, 2-(4-hydroxyphenyl)ethyltrimethoxysilane, 4-hydroxy-5-(4-hydroxyphenylcarbonyloxy)pentyltrimethoxysilane and the like.

The content ratio of an organosilane unit having an acidic group in the polysiloxane is from 0.01 to 20 mol %, preferably from 0.02 to 15 mol %, and still more preferably from 0.03 to 10 mol %, in terms of a molar ratio of Si atoms to the number of moles of Si atoms derived from the organosilane of the whole polysiloxane. The content ratio within the above preferred range enables suppression of formation of residues and excellent resolution after the development.

It is important that the polysiloxane (A) used in the present invention has sufficient compatibility with the below-mentioned naphthoquinone diazide compound and is capable of forming a uniform fired film without causing phase separation. From such point of view, the content ratio of an organosilane unit having an aromatic group in the polysiloxane is preferably 5 mol % or more, more preferably 20 mol % or more, still more preferably 30 mol % or more, and particularly preferably 40 mol % or more, in terms of a molar ratio of Si atoms to the number of moles of Si atoms derived from the organosilane of the whole polysiloxane. If the content ratio is within the above preferred range, since a polysiloxane and a naphthoquinone diazide compound are less likely to cause phase separation during coating, prebaking, firing and the like, the film does not cause white turbidity, leading to excellent transparency of a fired film. From the viewpoint of an improvement in chemical resistance of the fired film, the content ratio of an organosilane unit having an aromatic group in the polysiloxane is preferably 80 mol % or less, more preferably 70 mol % or less, and still more preferably 60 mol % or less, in terms of a molar ratio of Si atoms to the number of moles of Si atoms derived from the organosilane of the whole polysiloxane. It is assumed that the content ratio within the above preferred range may cause sufficient crosslinking during firing, leading to excellent chemical resistance of the fired film. The concentration of an organosilane unit having an aromatic group in the polysiloxane can be obtained from a ratio of a peak area of Si to which an aromatic group is bonded, to a peak area of Si derived from an organosilane unit to which an aromatic group is not bonded, after measuring $^{29}$Si-NMR of the polysiloxane.

In the polysiloxane (A) used in the present invention, from the viewpoint of chemical resistance and moist heat resistance of the fired film, the content ratio of an organosilane unit having an epoxy group and/or a vinyl group in the polysiloxane is preferably 1 mol % or more, more preferably 3 mol % or more, still more preferably 5 mol % or more, and particularly preferably 10 mol % or more, in terms of a molar ratio of Si atoms to the number of moles of Si atoms derived from the organosilane of the whole polysiloxane. The content ratio of an organosilane unit having an epoxy group and/or a vinyl group in the polysiloxane is preferably 70 mol % or less, more preferably 60 mol % or less, and still more preferably 50 mol % or less, in terms of a molar ratio of Si atoms to the number of moles of Si atoms derived from the organosilane of the whole polysiloxane. If the content ratio is within the above preferred range, since a polysiloxane and a naphthoquinone diazide compound are less likely to cause phase separation during coating, prebaking, firing and the like, the film does not cause white turbidity, leading to excellent transparency of a fired film. The content ratio(s) of an epoxy group and/or a vinyl group can be obtained from a ratio of a peak area of Si to which an epoxy group and/or a vinyl group is/are bonded, to a peak area of Si derived from an organosilane unit to which an epoxy group and/or a vinyl group is/are not bonded, after measuring $^{29}$Si-NMR of the polysiloxane. Alternatively, the content ratio of an epoxy group and/or a vinyl group can be obtained by measuring $^1$H-NMR and $^{13}$C-NMR, and measuring the content(s) of an epoxy group and/or a vinyl group, followed by combination with $^{29}$Si-NMR measurement.

The weight average molecular weight (Mw) of the polysiloxane (A) used in the present invention is not particularly limited, and is preferably from 500 to 100,000, and still more preferably from 500 to 50,000, in terms of polystyrene measured by gel permeation chromatography (GPC). If the weight average molecular weight is within the above preferred range, the obtained photosensitive resin composition has satisfactory coating film property, and also has satisfactory solubility in an alkali developing solution when a pattern is formed.

A conventional method can be used to perform hydrolysis and dehydration condensation of an organosilane. For example, a solvent, water and, if necessary, a catalyst are added to a mixture containing an organosilane, followed by heating and stirring at 50 to 150° C., and preferably 90 to 130° C., for about 0.5 to 100 hours. During stirring, hydrolysis by-products (alcohols such as methanol) and condensation by-products (water) may be optionally distilled off by distillation.

There is no particular limitation on the above solvent, and the same solvents as mentioned below are commonly used. The addition amount of the solvent is preferably from 10 to 1,000 parts by weight based on 100 parts by weight of the total of the amount of an organosilane and the amount of inorganic particles to be reacted with the organosilane. The addition amount of water used in the hydrolysis reaction is preferably from 0.5 to 2 mol based on 1 mol of a hydrolyzable group.

There is no particular limitation on the catalyst to be optionally added, and an acid catalyst and a base catalyst are preferably used. Specific examples of the acid catalyst include hydrochloric acid, nitric acid, sulfuric acid, hydrofluoric acid, phosphoric acid, acetic acid, trifluoroacetic acid, formic acid, polyhydric carboxylic acid, an anhydride thereof, an ion exchange resin and the like. Specific examples of the base catalyst include triethylamine, tri-n-propylamine, tri-n-butylamine, tri-n-pentylamine, tri-n-hexylamine, tri-n-heptylamine, tri-n-octylamine, diethylamine, triethanolamine, diethanolamine, sodium hydroxide, potassium hydroxide, alkoxysilane having an amino group, an ion exchange resin and the like. The addition amount of the catalyst is preferably from 0.01 to 10 parts by weight based on 100 parts by weight of the total of the amount of an organosilane and the amount of inorganic particles to be reacted with the organosilane.

From the viewpoint of storage stability of a coating solution of a photosensitive resin composition, it is preferred that a polysiloxane solution does not contain the above catalyst after hydrolysis and dehydration condensation, and the catalyst can be optionally removed. There is no particular limitation on a method for removing a catalyst, and a treatment with water rinsing and/or an ion exchange resin is preferable in view of simplicity of operation and removability. Water rinsing is a method in which a polysiloxane solution is diluted with an appropriate hydrophobic solvent and rinsed with water several times, and then the obtained organic layer is concentrated by an evaporator or the like. The treatment with an ion exchange resin is a method in which a polysiloxane solution is brought into contact with an appropriate ion exchange resin.

The photosensitive resin composition of the present invention can be used as both positive and negative photosensitive resin compositions, and a positive photosensitive resin composition is preferable. The reason is that the positive photosensitive resin composition enables formation of a pattern having satisfactory resolution, and formation of a resolution pattern of 5 μm or less which is required in a semiconductor.

When positive photosensitivity is imparted, it is preferred that (D) a naphthoquinone diazide compound is included in the photosensitive resin composition of the present invention.

The photosensitive resin composition including a naphthoquinone diazide compound (D) has positive photosensitivity in which the exposed area is removed with an alkali developing solution. When naphthoquinone diazide is exposed to active chemical rays, an indenecarboxylic acid having alkali solubility is generated. Only the exposed area is dissolved in the alkali developing solution by the generation of this indenecarboxylic acid. On the other hand, in the unexposed area, a quinone diazide moiety of the naphthoquinone diazide compound is coordinated to a silanol group remaining in the polysiloxane to thereby interact with the silanol group, thus suppressing solubility in an alkali developing solution due to residual silanol in the polysiloxane. Therefore, inclusion of the naphthoquinone diazide compound increases a difference in solubility in an alkali developing solution between the exposed area and the unexposed area, thus improving a dissolution contrast ratio. The naphthoquinone diazide compound used herein is not particularly limited, and is preferably a compound in which naphthoquinonediazidesulfonic acid is ester-bonded to a compound having a phenolic hydroxyl group, the substituent at the ortho-position and the para-position of a phenolic hydroxyl group of the compound, each independently being hydrogen, a hydroxy group, or a substituent represented by any one of the general formulas (3) to (5).

[Chemical Formula 5]

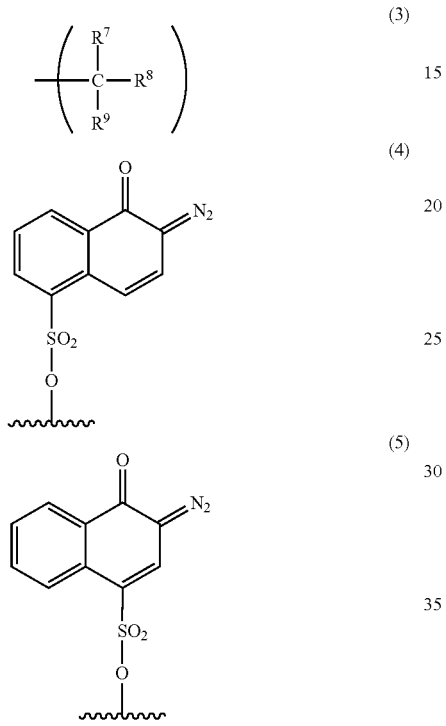

In the formulas, $R^7$ to $R^9$ each independently is an alkyl group having 1 to 10 carbon atoms, a carboxy group, a phenyl group, or a substituted phenyl group. Among $R^7$ to $R^9$, at least two of them may form a ring. The alkyl group may be either a non-substitution product or a substitution product, which can be selected according to properties of the composition.

Specific examples of the alkyl group include a methyl group, an ethyl group, an n-propyl group, an isopropyl group, an n-butyl group, an isobutyl group, a t-butyl group, an n-hexyl group, an n-heptyl group, an n-octyl group, an n-decyl group, a cyclopentyl group, a cyclohexyl group, a trifluoromethyl group, a 2-carboxyethyl group and the like. Specific examples of the substituent on a phenyl group include a hydroxy group, a methoxy group, an ethoxy group and the like. Specific examples of the ring formed by $R^7$ to $R^9$ include a cyclopentane ring, a cyclohexane ring, an adamantane ring, a fluorene ring and the like. However, the substituent on the alkyl group and phenyl group, and the ring are not limited to these specific examples.

When the substituent at the ortho-position and the para-position of the phenolic hydroxyl group is a substituent represented by any one of the general formulas (3) to (5), oxidative decomposition is less likely to be caused by firing and a conjugated compound typified by a quino structure is less likely to be formed. Therefore, a fired film is less likely to be colored and is excellent in transparency. These naphthoquinone diazide compounds can be synthesized by a known esterification reaction between a compound having a phenolic hydroxyl group and naphthoquinonediazidesulfonic acid chloride.

Specific examples of the compound having a phenolic hydroxyl group include the following compounds (all of which are manufactured by Honshu Chemical Industry Co., Ltd.).

[Chemical Formula 6]

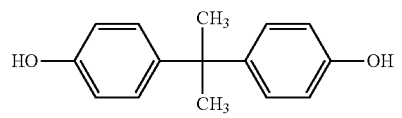

Bisphenol A

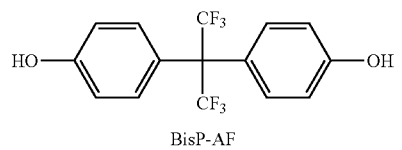

BisP-AF

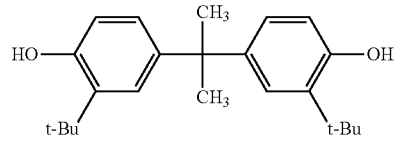

BisOTSP-A

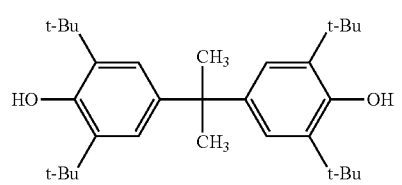

Bis268-A

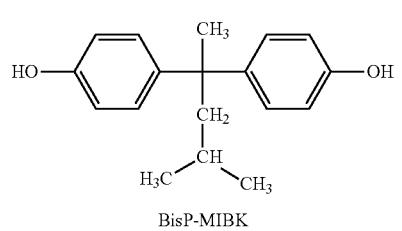

BisP-MIBK

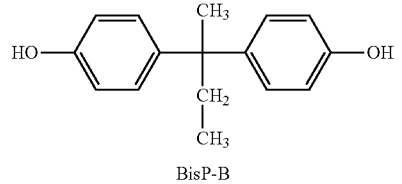

BisP-B

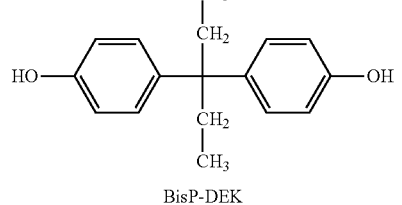

BisP-DEK

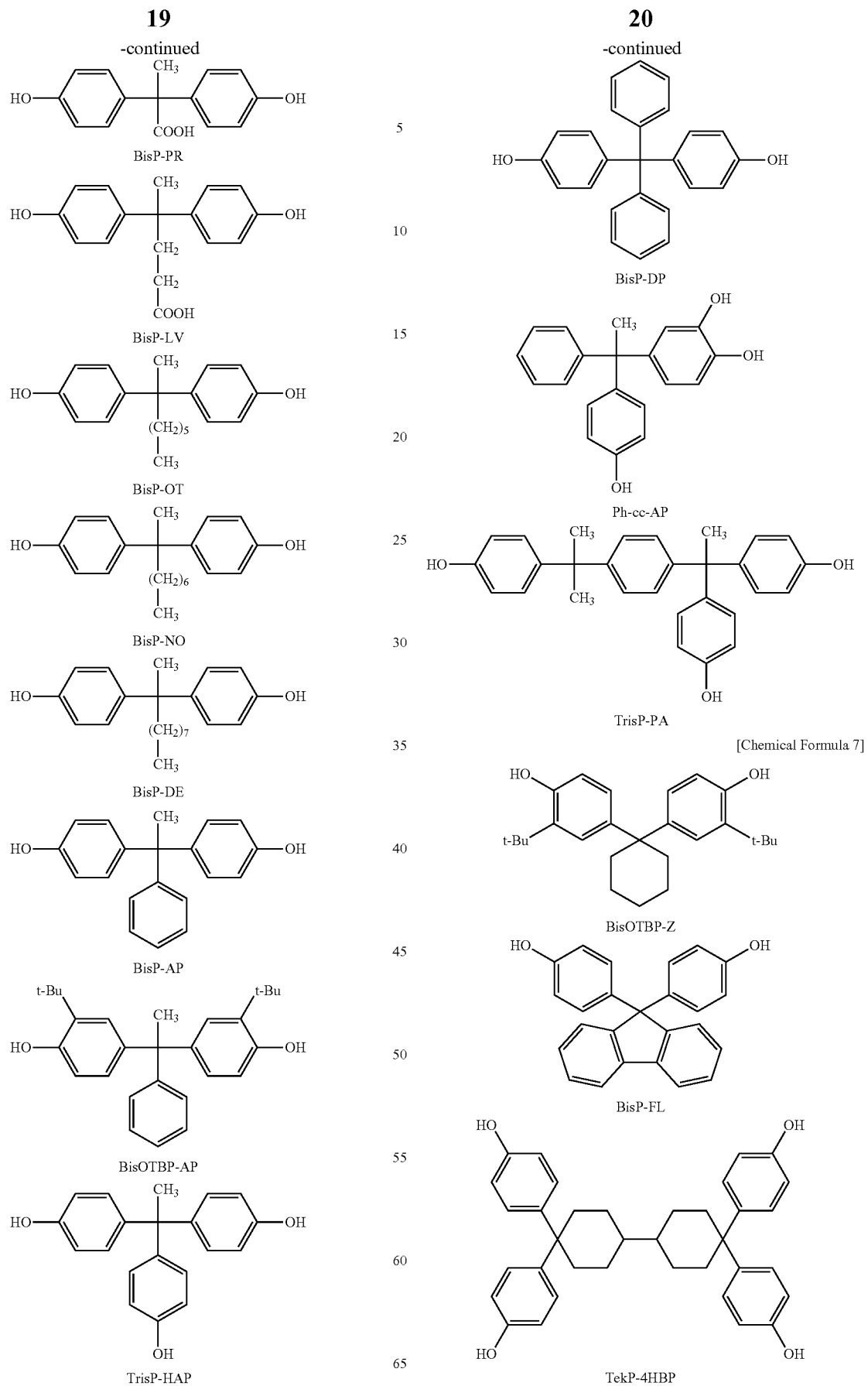

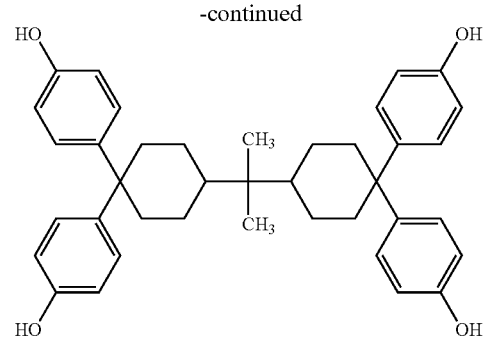

TekP-4HBPA

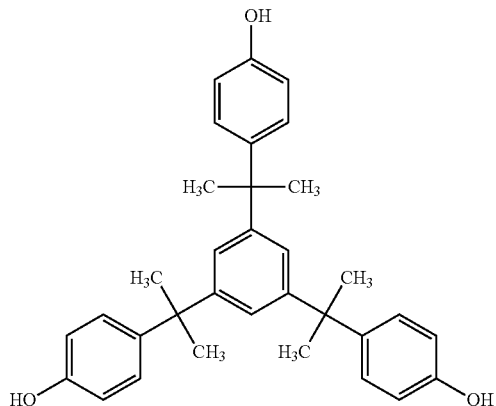

TrisP-TC

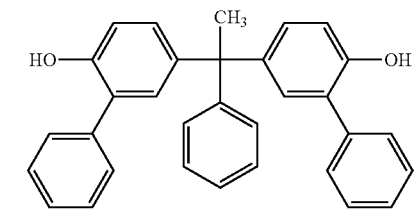

BisOPP-AP

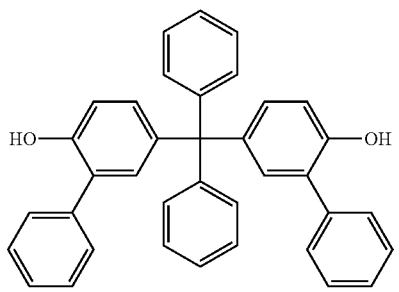

TPM-DP

It is possible to use, as the naphthoquinonediazidesulfonic acid chloride as its raw material, 4-naphthoquinonediazidesulfonic acid chloride or 5-naphthoquinonediazidesulfonic acid chloride. A 4-naphthoquinonediazidesulfonic acid ester compound is suited for i-line exposure because of having absorption in an i-line (wavelength of 365 nm) region. A 5-naphthoquinonediazidesulfonic acid ester compound is suited for exposure in a wide wavelength range since absorption exists in a wide wavelength range. It is preferred to select a 4-naphthoquinonediazidesulfonic acid ester compound and a 5-naphthoquinonediazidesulfonic acid ester compound according to a wavelength for exposure. Various naphthoquinone diazide compounds synthesized from the compound having a phenolic hydroxyl group and the naphthoquinonediazidesulfonic acid chloride may be used alone, or two or more naphthoquinone diazide compounds may be used in combination. The 4-naphthoquinonediazidesulfonic acid ester compound may also be used in combination with the 5-naphthoquinonediazidesulfonic acid ester compound.

Examples of the naphthoquinone diazide compound (D) used preferably in the present invention include compounds represented by the following general formula (6).

[Chemical Formula 8]

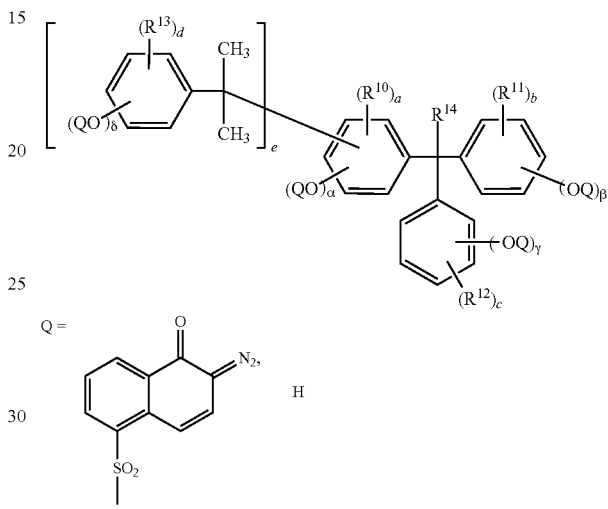

(6)

In the formula, $R^{10}$, $R^{11}$, $R^{12}$ and $R^{13}$ represent a hydrogen atom, an alkyl group having 1 to 8 carbon atoms, an alkoxy group having 1 to 8 carbon atoms, an ester group having 1 to 8 carbon atoms, or a carboxy group, and may be respectively the same or different. $R^{14}$ is hydrogen, an alkyl group having 1 to 8 carbon atoms, or an aryl group having 6 to 15 carbon atoms. Q is either a 5-naphthoquinone diazidesulfonyl group or a hydrogen atom, and all Q(s) are not hydrogen atoms. a, b, c, d, e, α, β, γ and δ each independently represents an integer of 0 to 4, provided that $\alpha+\beta+\gamma+\delta \leq 2$. Use of the naphthoquinone diazide compound represented by the general formula (6) enables an improvement in sensitivity and resolution in patterning exposure.

The content of the naphthoquinone diazide compound (D) is not particularly limited, and is preferably from 2 to 30 parts by weight, and more preferably from 3 to 15 parts by weight, based on 100 parts by weight of the polysiloxane (A). When the polysiloxane (A) is an inorganic particle-containing polysiloxane obtained by reacting an organosilane with inorganic particles, summation of the amount of inorganic particles to be reacted with an organosilane and the amount of the polysiloxane gives 100 parts by weight. The content within the above preferred range enables sufficiently high dissolution contrast between the exposed area and the unexposed area, thus exhibiting photosensitivity applicable to practical use. Since a polysiloxane and a naphthoquinone diazide compound are less likely to cause phase separation, a coating film does not cause white turbidity, leading to excellent transparency of the fired film. In order to obtain satisfactory dissolution contrast, the content is more preferably 5 parts by weight or more. In order to obtain a pattern forming film with high resolution, the content is preferably 30 parts by weight or less, more preferably 25 parts by weight or less, and most preferably 20 parts by weight or less.

When negative photosensitivity is imparted, it is preferred that a compound selected from (E1) a photopolymerization initiator and (E2) a photosensitizer is included in the photosensitive resin composition of the present invention. Both the photopolymerization initiator (E1) and the photosensitizer (E2) may be included.

Specific examples of the photopolymerization initiator (E1) include an α-aminoalkylphenone compound such as 2-methyl-1-[4-(methylthio)phenyl]-2-morpholinopropan-1-one, 2-dimethylamino-2-(4-methylbenzyl)-1-(4-morpholinophenyl)-butan-1-one, 2-benzyl-2-dimethylamino-1-(4-morpholinophenyl)-butan-1-one, or 3,6-bis(2-methyl-2-morpholinopropionyl)-9-octyl-9H-carbazole; an acylphosphine oxide compound such as 2,4,6-trimethylbenzoyl-diphenylphosphine oxide, bis(2,4,6-trimethylbenzoyl)-phenylphosphine oxide, or bis(2,6-dimethoxybenzoyl)-(2,4,4-trimethylpentyl)phosphine oxide; an oxime ester compound such as 1-phenylpropane-1,2-dione-2-(O-ethoxycarbonyl)oxime, 1-[4-(phenylthio)phenyl]octane-1,2-dione-2-(O-benzoyl)oxime, 1-phenylbutane-1,2-dione-2-(O-methoxycarbonyl)oxime, 1,3-diphenylpropane-1,2,3-trione-2-(O-ethoxycarbonyl)oxime, 1-[9-ethyl-6-(2-methylbenzoyl)-9H-carbazol-3-yl]ethanone-1-(O-acetyl)oxime, or 1-[9-ethyl-6-[2-methyl-4-[1-(2,2-dimethyl-1,3-dioxolan-4-yl)methyloxy]benzoyl]-9H-carbazol-3-yl]ethanone-1-(O-acetyl)oxime; a benzophenone derivative such as benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, alkylated benzophenone, 3,3',4,4'-tetrakis(t-butylperoxycarbonyl)benzophenone, 4-methylbenzophenone, dibenzylketone, or fluorenone; a benzoic acid ester compound such as ethyl 4-dimethylaminobenzoate, (2-ethyl)hexyl 4-dimethylaminobenzoate, ethyl 4-diethylaminobenzoate, or methyl 2-benzoylbenzoate; an aromatic ketone compound such as 2,2-diethoxyacetophenone, 2,3-diethoxyacetophenone, 4-t-butyldichloroacetophenone, 2-hydroxy-2-methyl-1-phenylpropan-1-one, 2,2-dimethoxy-1,2-diphenylethan-1-one, 1-hydroxycyclohexyl phenyl ketone, 2-hydroxy-2-methyl-1-phenylpropan-1-one, 1-(4-isopropylphenyl)-2-hydroxy-2-methylpropan-1-one, 1-[4-(2-hydroxyethoxy)phenyl]-2-hydroxy-2-methylpropan-1-one, 2-hydroxy-1-[4-[4-(2-hydroxy-2-methylpropionyl)benzyl]phenyl]-2-methylpropan-1-one, or benzalacetophenone, 4-azidebenzalacetophenone; a thioxanthone compound such as thioxanthone, 2-methylthioxanthone, 2-chlorothioxanthone, 2-isopropylthioxanthone, 2,4-dimethylthioxanthone, 2,4-diethylthioxanthone, 2,4-dichlorothioxanthone and the like. These photopolymerization initiators may be used alone, or two or more photopolymerization initiators may be used in combination.

Specific examples of the photosensitizer (E2) include an aromatic monoazide such as azideanthraquinone or azidebenzalacetophenone; aminocoumarins such as 7-diethylaminobenzoylcoumarin and 3,3'-carbonylbis(diethylaminocoumarin); aromatic ketones such as anthrone, benzanthrone, methyleneanthrone, and 9,10-phenanthrenequinone; a condensed aromatic compound such as 1,4-dimethylnaphthalene, 9-fluorenone, fluorene, phenanthrene, triphenylene, pyrene, anthracene, 9-phenylanthracene, 9-methoxyanthracene, 9,10-diphenylanthracene, 9,10-bis(4-methoxyphenyl) anthracene, 9,10-bis(triphenylsilyl)anthracene, 9,10-dimethoxyanthracene, 9,10-diethoxyanthracene, 9,10-di-n-propoxyanthracene, 9,10-diisopropoxyanthracene, 9,10-di-n-butoxyanthracene, 9,10-di-n-pentyloxyanthracene, 2-t-butyl-9,10-di-n-butoxyanthracene, or 9,10-bis (trimethylsilylethynyl)anthracene and the like. Commonly, it is sometimes possible to preferably use those which are used in a photocuring resin, and those which are used as a charge transfer agent of an electrophotographic photoreceptor. These photosensitizers may be used alone, or two or more photosensitizers may be used in combination.

When the photosensitive resin composition of the present invention has negative photosensitivity, each content of the photopolymerization initiator (E1) and the photosensitizes (E2) is not particularly limited, and is preferably from 0.1 to 30 parts by weight, and still more preferably from 1 to 20 parts by weight, based on 100 parts by weight of the polysiloxane (A). When the polysiloxane (A) is an inorganic particle-containing polysiloxane obtained by reacting an organosilane with inorganic particles, summation of the amount of inorganic particles to be reacted with an organosilane and the amount of the polysiloxane gives 100 parts by weight. If the content is less than 0.1 part by weight, a pattern forming film cannot be sometimes obtained after the development due to lack of crosslinking. The content of more than 30% by weight may sometimes cause formation of residues after the development.

On the other hand, when the photosensitive resin composition of the present invention has positive photosensitivity, the above-mentioned photosensitizer (E2) may be included in the photosensitive resin composition of the present invention. Inclusion of the photosensitizer enables acceleration of the reaction of the naphthoquinone diazide compound (D) in patterning exposure, leading to an improvement in sensitivity.

When the photosensitive resin composition of the present invention has positive photosensitivity, the content of the photosensitizer (E2) is not particularly limited, and is preferably from 0.01 to 10 parts by weight, and still more preferably from 0.1 to 5 parts by weight, based on 100 parts by weight of the polysiloxane (A). The content of less than 0.01 part by weight may sometimes exert insufficient effect of improving sensitivity. The content of more than 10 parts by weight may sometimes cause deterioration of transparency of the fired film.

When negative photosensitivity is imparted, any one or more compounds selected from (B1) a photoacid generator, (B2) a photobase generator, (B3) a thermal acid generator, and (B4) a thermal base generator may be included in the photosensitive resin composition of the present invention.

The photoacid generator (B1) is a compound which causes bond cleavage under exposure to generate an acid. The photobase generator (B2) is a compound which causes bond cleavage under exposure to generate a base. As used herein, exposure means irradiation with active chemical rays (radiations) and includes, for example, irradiation of visible rays, ultraviolet rays, electron beams, X-rays and the like. From the viewpoint of being a light source which is commonly used, a ultra-high pressure mercury lamp light source capable of irradiating, for example, visible rays and ultraviolet rays are preferable, and irradiation with j-line (wavelength of 313 nm) i-line (wavelength of 365 nm), hi-line (wavelength of 405 nm) or g-line (wavelength of 436 nm) is more preferable.

An acid or base generated from the above-mentioned compound under exposure functions as a catalyst which accelerates dehydration condensation of the residual silanol in the polysiloxane. Therefore, it is possible to be substantially made insoluble in an alkali developing solution by curing the polysiloxane using the acid or base generated from the compound under exposure. Therefore, when a prebaked film soluble in an alkali developing solution is formed by coating and prebaking of the photosensitive resin composition of the present invention and then the prebaked film is irradiated with active chemical rays through a mask, only the exposed area is made insoluble, and thus a negative pattern can be formed by removing the unexposed area using the alkali developing solution.

On the other hand, when the photosensitive resin composition of the present invention has positive photosensitivity, any one or more compounds selected from (B1) a photoacid generator, (B2) a photobase generator, (B3) a thermal acid generator, and (B4) a thermal base generator may be included in the photosensitive resin composition. When a proper photoacid generator or photobase generator is selected and the content is controlled, the amount of the acid or base generated under patterning exposure is suppressed, and thus an adverse influence is not exerted on alkali solubility of the polysiloxane during development. When a large amount of the acid or base is generated under bleaching exposure after the development, dehydration condensation of the residual silanol in the polysiloxane is accelerated during firing and a pattern shape is improved, thus obtaining a pattern having a shape closer to a rectangular shape.

Examples of the photoacid generator (B1) include an ionic compound and a nonionic compound.

The ionic compound is preferably a compound containing neither heavy metals nor halogen ions, and more preferably a triorganosulfonium salt-based compound. Specific examples of the triorganosulfonium salt-based compound include methanesulfonate, trifluoromethanesulfonate, camphorsulfonate and 4-toluenesulfonate of triphenylsulfonium; methanesulfonate, trifluoromethanesulfonate, camphorsulfonate and 4-toluenesulfonate of dimethyl-1-naphthylsulfonium; methanesulfonate, trifluoromethanesulfonate, camphorsulfonate and 4-toluenesulfonate of dimethyl(4-hydroxy-1-naphthyl)sulfonium; methanesulfonate, trifluoromethanesulfonate, camphorsulfonate and 4-toluenesulfonate of dimethyl(4,7-dihydroxy-1-naphthyl)sulfonium; methanesulfonate, trifluoromethanesulfonate, camphorsulfonate and 4-toluenesulfonate of diphenyliodonium and the like.

It is possible to use, as the nonionic photoacid generator, a halogen-containing compound, a diazomethane compound, a sulfone compound, a sulfonic acid ester compound, a carboxylic acid ester compound, a sulfonimide compound, a phosphoric acid ester compound, a sulfonebenzotriazole compound and the like.

Specific examples of the halogen-containing compound include a haloalkyl group-containing hydrocarbon compound, a haloalkyl group-containing heterocyclic compound and the like. Examples of preferred halogen-containing compound include 1,1-bis(4-chlorophenyl)-2,2,2-trichloroethane, 2-phenyl-4,6-bis(trichloromethyl)-s-triazine, 2-naphthyl-4,6-bis(trichloromethyl)-s-triazine and the like.

Specific examples of the diazomethane compound include bis(trifluoromethylsufonyl)diazomethane, bis(cyclohexylsulfonyl)diazomethane, bis(phenylsulfonyl)diazomethane, bis(4-tolylsulfonyl)diazomethane, bis(2,4-xylylsulfonyl)diazomethane, bis(4-chlorophenylsulfonyl)diazomethane, methylsulfonyl-4-tolylsulfonyldiazomethane, cyclohexylsulfonyl(1,1-dimethylethylsulfonyl)diazomethane, bis(1,1-dimethylethylsulfonyl)diazomethane, phenylsulfonyl(benzoyl)diazomethane and the like.

Specific examples of the sulfone compound include a β-ketosulfone compound, a β-sulfonylsulfone compound, a diaryldisulfone compound and the like. Preferred sulfone compound is 4-tolylphenacylsulfone, mesitylphenacylsulfone, bis(phenylsulfonyl)methane, 4-chlorophenyl-4-tolyldisulfone compound and the like.

Specific examples of the sulfonic acid ester compound include an alkylsulfonic acid ester, a haloalkylsulfonic acid ester, an arylsulfonic acid ester, an iminosulfonic acid ester compound and the like. Preferred specific examples thereof include benzoin-4-tolylsulfonate, pyrogallol tris(methylsulfonate), nitrobenzyl-9,10-diethoxyanthryl-2-sulfonate, 2,6-(dinitrobenzyl)phenylsulfonate and the like.

Specific examples of the iminosulfonic acid ester compound include benzylmonoxime-4-tolylsulfonate, benzylmonoxime-4-dodecylphenylsulfonate, benzylmonoxime-hexadecylsulfonate, 4-nitroacetophenoxime-4-tolylsulfonate, 4,4'-dimethylbenzylmonoxime-4-tolylsulfonate, 4,4'-dimethylbenzylmonoxime-4-dodecylphenylsulfonate, dibenzylketoneoxime-4-tolylsulfonate, α-(4-tolyloxy)imino-α-cyanoethyl acetate, furylmonoxime-4-(aminocarbonyl)phenylsulfonate, acetoneoxime-4-benzoylphenylsulfonate, 3-(benzylsulfonyloxy) iminoacetylacetone, bis(benzylmonoxide)dioctylnaphthyldisulfonate, α-(4-tolylsulfonyloxy)iminobenzyl cyanide, α-(4-tolylsulfonyloxy)imino-4-methoxybenzyl cyanide ("PAI-101", trade name, manufactured by Midori Kagaku Co., Ltd.), α-(10-camphorsulfonyloxy)imino-4-methoxybenzyl cyanide ("PAI-106", trade name, manufactured by Midori Kagaku Co., Ltd.), 5-(4-tolylsulfonyloxy)imino-5H-thiophen-2-ylidene-(2-methylphenyl)acetonitrile ("CGI-1311", trade name, manufactured by BASF Corporation) and the like.

Specific examples of the carboxylic acid ester compound include carboxylic acid 2-nitrobenzyl ester and the like.

Specific examples of the sulfonimide compound include N-(trifluoromethylsulfonyloxy)succinimide, N-(10-camphorsulfonyloxy)succinimide, N-(4-tolylsulfonyloxy)succinimide, N-(2-trifluoromethylphenylsulfonyloxy)succinimide, N-(4-fluorophenylsulfonyloxy)succinimide, N-(trifluoromethylsulfonyloxy)phthalimide, N-(10-camphorsulfonyloxy)phthalimide, N-(2-trifluoromethylphenylsulfonyloxy)phthalimide, N-(2-fluorophenylsulfonyloxy)phthalimide, N-(trifluoromethylsulfonyloxy) diphenylmaleimide, N-(10-camphorsulfonyloxy) diphenylmaleimide, N-(2-trifluoromethylphenylsulfonyloxy)diphenylmaleimide, N-(4-fluorophenylsulfonyloxy)diphenylmaleimide, N-(4-fluorophenylsulfonyloxy)diphenylmaleimide, N-(trifluoromethylsulfonyloxy)bicyclo[2.2.1]hept-5-ene-2,3-dicarboxyimide, N-(10-camphorsulfonyloxy)bicyclo[2.2.1]hept-5-ene-2,3-dicarboxyimide, N-(camphorsulfonyloxy)-7-oxabicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(4-tolylsulfonyloxy)bicyclo[2.2.1]hept-5-ene-2,3-dicarboxyimide, N-(4-tolylsulfonyloxy)-7-oxabicyclo[2.2.1]hept-5-ene-2,3-dicarboxyimide, N-(2-trifluoromethylphenylsulfonyloxy)bicyclo[2.2.1]hept-5-ene-2,3-dicarboxyimide, N-(2-trifluoromethylphenylsulfonyloxy)-7-oxabicyclo[2.2.1]hept-5-ene-2,3-dicarboxyimide, N-(4-fluorophenylsulfonyloxy)bicyclo[2.2.1]hept-5-ene-2,3-dicarboxyimide, N-(4-fluorophenylsulfonyloxy)-7-oxabicyclo[2.2.1]hept-5-ene-2,3-dicarboxyimide, N-(trifluoromethylsulfonyloxy)bicyclo[2.2.1]heptane-5,6-oxy-2,3-dicarboxyimide, N-(10-camphorsulfonyloxy)bicyclo[2.2.1]heptane-5,6-oxy-2,3-dicarboxyimide, N-(4-tolylsulfonyloxy)bicyclo[2.2.1]heptane-5,6-oxy-2,3- dicarboxyimide, N-(2-trifluoromethylphenylsulfonyloxy)bicyclo[2.2.1]heptane-5,6-oxy-2,3-dicarboxyimide, N-(4-fluorophenylsulfonyloxy)bicyclo[2.2.1]heptane-5,6-oxy-2,3-dicarboxyimide, N-(trifluoromethylsulfonyloxy)naphthyldicarboxyimide, N-(10-camphorsulfonyloxy)naphthyldicarboxyimide, N-(4-tolylsulfonyloxy)naphthyldicarboxyimide, N-(2-trifluoromethylphenylsulfonyloxy)naphthyldicarboxyimide, N-(4-fluorophenylsulfonyloxy)naphthyldicarboxyimide, N-(pentafluoroethylsulfonyloxy)naphthyldicarboxyimide, N-(heptafluoropropylsulfonyloxy)naphthyldicarboxyimide, N-(nonafluorobutylsulfonyloxy)naphthyldicarboxyimide, N-(ethylsulfonyloxy)naphthyldicarboxyimide, N-(propylsulfonyloxy)naphthyldicarboxyimide, N-(butylsulfonyloxy)naphthyldicarboxyimide, N-(pentylsulfonyloxy)naphthyldicarboxyimide, N-(hexylsulfonyloxy)naphthyldicarboxyimide, N-(heptylsulfonyloxy)naphthyldicarboxyimide, N-(octylsulfonyloxy)naphthyldicarboxyimide, N-(nonylsulfonyloxy)naphthyldicarboxyimide and the like.

Among these, a nonionic compound is more preferable than an ionic compound from the viewpoint of solubility and insulation performance of a coating film. The acid to be generated is preferably sulfonic acid or phosphoric acid in view of the fact that it effectively acts as a catalyst which accelerates dehydration condensation of the residual silanol in the polysiloxane. In view of the strength of an acid to be generated, a compound capable of generating benzenesulfonic acid, 4-toluenesulfonic acid, perfluoroalkylsulfonic acid or phosphoric acid is more preferable. In view of the fact that quantum yield to j-line (wavelength of 313 nm) i-line (wavelength of 365 nm), h-line (wavelength of 405 nm) and g-line (wavelength of 436 nm) is high and high sensitivity can be realized, and that the coating film exhibits high transparency to visible rays after curing, a sulfonic acid ester compound, a sulfonimide compound and an iminosulfonic acid ester compound are more preferable. These photoacid generators may be used alone, or two or more photoacid generators may be used in combination.

Examples of the photobase generator (B2) include those which generate an organic base under exposure, and those which generate an inorganic base under exposure. The ionic compound is preferably a compound containing neither heavy metals nor halogen ions, and more preferably a triorganosulfonium salt-based compound. Any photobase generator is preferably used, and a photobase generator capable of generating amines is particularly preferable from the viewpoint of generation efficiency of a base under exposure, catalytic activity capable of accelerating of dehydration condensation of the residual silanol in the polysiloxane, solubility in a polysiloxane solution and the like. Amines to be generated may be either aliphatic amines or aromatic amines, or may be either a monofunctional amine or a polyfunctional amine. These photobase generators may be used alone, or two or more photobase generators may be used in combination.

Specific examples of amines to be generated under exposure include ammonia, methylamine, ethylamine, n-propylamine, isopropylamine, n-butylamine, t-butylamine, n-hexylamine, n-octylamine, n-decylamine, n-cetylamine, cyclopentylamine, cyclohexylamine, dimethylamine, diethylamine, di-n-propylamine, diisopropylamine, dicyclohexylamine, trimethylamine, triethylamine, dicyclohexylmethylamine, tetramethylenediamine, hexamethylenediamine, benzylamine, aniline, 1-naphthylamine, 2-naphthylamine, dibenzylamine, diphenylamine, 1,2-phenylenediamine, 1,3-phenylenediamine, 1,4-phenylenediamine, 2,4-tolylenediamine, 2,6-tolylenediamine, 4,4'-diaminodiphenylmethane, hydrazine, hexamethylenetetramine, 1,4-diazabicyclo[2.2.2]octane, 1,5-diazabicyclo[4.3.0]-5-nonene, 1,8-diazabicyclo[5.4.0]-7-undecene, piperidine, piperazine, morpholine, imidazole, pyrazole and the like.

Examples of the photobase generator capable of generating amines under exposure include an ortho-nitrobenzyl carbamate compound, an α,α-dimethyl-3,5-dimethoxybenzyl carbamate compound, an acyloxyimino compound and the like.

Specific examples of the ortho-nitrobenzyl carbamate compound include N-(2-nitrobenzyloxy)carbonyl-N-methylamine, N-(2-nitrobenzyloxy)carbonyl-N-n-propylamine, N-(2-nitrobenzyloxy)carbonyl-N-n-hexylamine, N-(2-nitrobenzyloxy)carbonyl-N-cyclohexylamine, N-(2-nitrobenzyloxy)carbonylaniline, N-(2-nitrobenzyloxy)carbonylpiperidine, N,N'-bis[(2-nitrobenzyloxy)carbonyl]-1,6-hexamethylenediamine, N,N'-bis[(2-nitrobenzyloxy)carbonyl]-1,4-phenylenediamine, N,N'-bis[(2-nitrobenzyloxy)carbonyl]-2,4-tolylenediamine, N,N'-bis[(2-nitrobenzyloxy)carbonyl]-4,4'-diaminodiphenylmethane, N,N'-bis[(2-nitrobenzyloxy)carbonyl]piperazine, N-(2,6-dinitrobenzyloxy)carbonyl-N-methylamine, N-(2,6-dinitrobenzyloxy)carbonyl-N-n-propylamine, N-(2,6-dinitrobenzyloxy)carbonyl-N-n-hexylamine, N-(2,6-dinitrobenzyloxy)carbonyl-N-cyclohexylamine, N-(2,6-dinitrobenzyloxy)carbonylaniline, N-(2,6-dinitrobenzyloxy)carbonylpiperidine, N,N'-bis[(2,6-dinitrobenzyloxy)carbonyl]-1,6-hexamethylenediamine, N,N'-bis[(2,6-dinitrobenzyloxy)carbonyl]-1,4-phenylenediamine, N,N'-bis[(2,6-dinitrobenzyloxy)carbonyl]-2,4-tolylenediamine, N,N'-bis[(2,6-dinitrobenzyloxy)carbonyl]-4,4-diaminodiphenylmethane, N,N'-bis[(2,6-dinitrobenzyloxy)carbonyl]piperazine and the like.

Specific examples of the α,α-dimethyl-3,5-dimethoxybenzyl carbamate compound include N-(α,α-dimethyl-3,5-dimethoxybenzyloxy)carbonyl-N-methylamine, N-(α,α-dimethyl-3,5-dimethoxybenzyloxy)carbonyl-N-n-propylamine, N-(α,α-dimethyl-3,5-dimethoxybenzyloxy)carbonyl-N-n-hexylamine, N-(α,α-dimethyl-3,5-dimethoxybenzyloxy)carbonyl-N-cyclohexylamine, N-(α,α-dimethyl-3,5-dimethoxybenzyloxy)carbonylaniline, N-(α,α-dimethyl-3,5-dimethoxybenzyloxy)carbonylpiperidine, N,N'-bis[(α,α-dimethyl-3,5-dimethoxybenzyloxy)carbonyl]-1,6-hexamethylenediamine, N,N'-bis[(α,α-dimethyl-3,5-dimethoxybenzyloxy)carbonyl]-1,4-phenylenediamine, N,N'-bis[(α,α-dimethyl-3,5-dimethoxybenzyloxy)carbonyl]-2,4-tolylenediamine, N,N'-bis[(α,α-dimethyl-3,5-dimethoxybenzyloxy)carbonyl]-4,4'-diaminodiphenylmethane, N,N'-bis[(α,α-dimethyl-3,5-dimethoxybenzyloxy)carbonyl]piperazine and the like.

Specific examples of the acyloxyimino compound include acetophenone-O-propanoyl oxime, benzophenone-O-propanoyl oxime, acetone-O-propanoyl oxime, acetophenone-O-butanoyl oxime, benzophenone-O-butanoyl oxime, acetone-O-butanoyl oxime, bis(acetophenone)-O,O'-hexane-1,6-dioyl oxime, bis(benzophenone)-O,O'-hexane-1,6-dioyl oxime, bis(acetone)-O,O'-hexane-1,6-dioyl oxime, acetophenone-O-acryloyl oxime, benzophenone-O-acryloyl oxime, acetone-O-acryloyl oxime and the like.

Among these, N-(2-nitrobenzyloxy)carbonyl-N-cyclohexylamine, N,N'-bis[(2-nitrobenzyloxy)carbonyl]-1,6-hexamethylenediamine and N,N'-bis[(α,α-dimethyl-3,5-dimethoxybenzyloxy)carbonyl]-1,6-hexamethylenediamine are preferable.

Each content of the photoacid generator (B1) and the photobase generator (B2) is not particularly limited, and is preferably from 0.01 to 15 parts by weight, and still more preferably from 0.1 to 10 parts by weight, based on 100 parts by weight of the polysiloxane (A). When the polysiloxane (A) is an inorganic particle-containing polysiloxane obtained by reacting an organosilane with inorganic particles, summation of the amount of inorganic particles to be reacted with an organosilane and the amount of the polysiloxane gives 100 parts by weight. When the photosensitive resin composition of the present invention has negative photosensitivity, if the content is less than 0.01 part by weight, a pattern forming film cannot be sometimes obtained after the development due to lack of crosslinking. The content of more than 15 parts by weight may sometimes cause diffusion of the acid or base thus generated and proceeding of excessive crosslinking, leading to deterioration of resolution. When the photosensitive resin composition of the present invention has positive photosensitivity, the content of less than 0.01 part by weight may sometimes exert insufficient effect on a pattern shape. The content of more than 15% by weight may sometimes cause formation of residues after the development due to excessive acid or base generated.

The thermal acid generator (B3) is a compound which causes bond cleavage under heat to generate an acid. The thermal base generator (B4) is a compound which causes bond cleavage under heat to generate a base. During firing, dehydration condensation of the residual silanol in the polysiloxane is accelerated by the acid or base generated from the above-mentioned compound and a pattern shape is improved, thus obtaining a pattern having a shape closer to a rectangular shape. The presence of the thus generated acid or base enables sufficient crosslinking of the residual siloxane during firing before the temperature is raised to high temperature. Therefore, rapid crosslinking of the siloxane does not occur during firing when the temperature is raised to high temperature, thus suppressing the production of shrinkage stress during firing, leading to an improvement in cracking resistance.

It is preferred that the thermal acid generator (B3) and the thermal base generator (B4) do not generate an acid or base or generates only a small amount of an acid or base under heat during prebaking after coating the photosensitive resin composition. Therefore, for example, when prebaking at 100° C., a compound preferably generates an acid at a temperature which is 100° C. higher than a prebaking temperature. In the case of the compound which generates an acid at a temperature higher than a prebaking temperature, dehydration condensation of the residual silanol in the polysiloxane is not accelerated during prebaking, thus suppressing deterioration of sensitivity during patterning exposure and formation of residues after the development.

Specific examples of the thermal acid generator (B3) include "San-Aid (registered trademark) SI-60", "San-Aid (registered trademark) SI-80", "San-Aid (registered trademark) SI-100", "San-Aid (registered trademark) SI-200", "San-Aid (registered trademark) SI-110", "San-Aid (registered trademark) SI-145", "San-Aid (registered trademark) SI-150", "San-Aid (registered trademark) SI-60L", "San-Aid (registered trademark) SI-80L", "San-Aid (registered trademark) SI-100L", "San-Aid (registered trademark) SI-110L", "San-Aid (registered trademark) SI-145L", "San-Aid (registered trademark) SI-150L", "San-Aid (registered trademark) SI-160L", "San-Aid (registered trademark) SI-180L" (all of which are trade names, manufactured by SANSHIN CHEMICAL INDUSTRY CO., LTD.); 4-hydroxyphenyldimethylsulfonium trifluoromethanesulfonate, benzyl-4-hydroxyphenylmethylsulfonium trifluoromethanesulfonate, 2-methylbenzyl-4-hydroxyphenylmethylsulfonium trifluoromethanesulfonate, 4-acetoxyphenyldimethylsulfonium trifluoromethanesulfonate, 4-acetoxyphenylbenzylmethylsulfonium trifluoromethanesulfonate, 4-(methoxycarbonyloxy)phenyldimethylsulfonium trifluoromethanesulfonate, benzyl-4-(methoxycarbonyloxy)phenylmethylsulfonium trifluoromethanesulfonate and the like. These compounds may be used alone, or two or more compounds may be used in combination.

Specific examples of the thermal base generator (B4) include "U-CAT (registered trademark) SA1", "U-CAT (registered trademark) SA102", "U-CAT (registered trademark) SA102-50", "U-CAT (registered trademark) SA106", "U-CAT (registered trademark) SA112", "U-CAT (registered trademark) SA506", "U-CAT (registered trademark) SA603", "U-CAT (registered trademark) 1000", "U-CAT (registered trademark) 1102", "U-CAT (registered trademark) 2000", "U-CAT (registered trademark) 2024", "U-CAT (registered trademark) 2026", "U-CAT (registered trademark) 2030", "U-CAT (registered trademark) 2110", "U-CAT (registered trademark) 2313", "U-CAT (registered trademark) 651M", "U-CAT (registered trademark) 660M", "U-CAT (registered trademark) 18X", "TMED", "U-CAT (registered trademark) 201G", "U-CAT (registered trademark) 202", "U-CAT (registered trademark) 420A", "U-CAT (registered trademark) 130", "POLYCAT (registered trademark) 8", "POLYCAT (registered trademark) 9", "POLYCAT (registered trademark) 12", "POLYCAT (registered trademark) 41" (all of which are trade names, manufactured by San-Apro Ltd.) and the like. These compounds may be used alone, or two or more compounds may be used in combination.

Each content of the thermal acid generator (B3) and the thermal base generator (B4) is not particularly limited, and is preferably from 0.01 to 10 parts by weight, and still more preferably from 0.1 to 5 parts by weight, based on 100 parts by weight of the polysiloxane (A). When the polysiloxane (A) is an inorganic particle-containing polysiloxane obtained by reacting an organosilane with inorganic particles, summation of the amount of inorganic particles to be reacted with an organosilane and the amount of the polysiloxane gives 100 parts by weight. The content of less than 0.01 part by weight may sometimes exert insufficient effect of improving a pattern shape. The content of more than 10% by weight may sometimes cause generation of an acid or base under heat during prebaking, leading to formation of residues after the development.

When negative photosensitivity is imparted to a polysiloxane obtained by hydrolyzing one or more organosilane(s) selected from an organosilane represented by the general formula (1) and an organosilane represented by the general formula (2), followed by condensation in the photosensitive resin composition, it is also possible to use, as $R^1$, a 2-methacryloxyethyl group, a 2-acryloxyethyl group, a 3-methacryloxypropyl group, a 3-acryloxypropyl group, a vinyl group, an allyl group and the like.

When the photosensitive resin composition of the present invention has negative photosensitivity, (F) a photopolymerizable compound may be included in the photosensitive resin composition so as to enhance photosensitivity such as sensitivity during patterning exposure.

Specific examples of the photopolymerizable compound (F) include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane tri(meth)acrylate, ditrimethylolpropane tetra(meth)acrylate, 1,3-butanediol di(meth) acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol-tricyclodecane di(meth)acrylate, ethoxylated glycerin tri(meth)acrylate, pentaerythritol tri(meth) acrylate, pentaerythritol tetra(meth)acrylate, ethoxylated pentaerythritol tetra(meth)acrylate, dipentaerythritol penta (meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, tris ((meth)acryloxyethyl)isocyanuric acid, bis((meth) acryloxyethyl)isocyanuric acid and the like. These photopolymerizable compounds may be used alone, or two or more photopolymerizable compounds may be used in combination.

The content of the photopolymerizable compound is not particularly limited, and is preferably from 1 to 50 parts by weight based on 100 parts by weight of the polysiloxane (A). When the polysiloxane (A) is an inorganic particle-containing polysiloxane obtained by reacting an organosilane with inorganic particles, summation of the amount of inorganic particles to be reacted with an organosilane and the amount of the polysiloxane gives 100 parts by weight. The content within the above preferred range enables excellent sensitivity, and excellent hardness and chemical resistance of the fired film.

The photosensitive resin composition of the present invention may contain a solvent. There is no particular limitation on types of the solvent, and a compound having an alcoholic hydroxyl group, a compound having a carbonyl group, a compound having three or more ether bonds and the like are preferably used in view of the fact that these compounds can uniformly dissolve the respective components, thus improving transparency of the obtained fired film. These solvents may be used alone, or two or more solvents may be used in combination.

A compound having a boiling point of 110 to 250° C. under an atmospheric pressure is more preferable. Control of the boiling point to 110° C. or higher enables moderate vaporization of the solvent during coating, leading to proceeding of drying of a coating film, thus obtaining a satisfactory coating film free from coating unevenness. Control of the boiling point to 250° C. or lower enables a decrease in the amount of the solvent remaining in the coating film, thus reducing film shrinkage during firing, leading to more satisfactory smoothness.

Specific examples of the compound having an alcoholic hydroxyl group and a boiling point of 110 to 250° C. under an atmospheric pressure include hydroxyacetone, 4-hydroxy-2-butanone, 3-hydroxy-3-methyl-2-butanone, 4-hydroxy-3-methyl-2-butanone, 5-hydroxy-2-pentanone, 4-hydroxy-2-pentanone, 4-hydroxy-4-methyl-2-pentanone (diacetone alcohol), methyl lactate, ethyl lactate, n-propyl lactate, n-butyl lactate, ethylene glycol monomethyl ether, ethylene glycol monoethyl ether, ethylene glycol mono-n-propyl ether, ethylene glycol mono-n-butyl ether, propylene glycol monomethyl ether, propylene glycol monoethyl ether, propylene glycol mono-n-propyl ether, propylene glycol mono-n-butyl ether, propylene glycol mono-t-butyl ether, diethylene glycol monomethyl ether, diethylene glycol monoethyl ether, diethylene glycol mono-n-propyl ether, dipropylene glycol monomethyl ether, dipropylene glycol monoethyl ether, dipropylene glycol mono-n-propyl ether, 3-methoxy-1-butanol, 3-methoxy-3-methyl-1-butanol, tetrahydrofurfuryl alcohol, n-butanol, n-pentanol and the like.

Among these, diacetone alcohol, ethyl lactate, ethylene glycol monomethyl ether, propylene glycol monomethyl ether, diethylene glycolmono methyl ether, dipropylene glycolmono methyl ether, 3-methoxy-1-butanol, 3-methoxy-3-methyl-1-butanol, tetrahydrofurfuryl alcohol and the like are preferable from the viewpoint of coatability.

Specific examples of the compound having a carbonyl group and a boiling point of 110 to 250° C. under an atmospheric pressure include n-butyl acetate, isobutyl acetate, 3-methoxy-n-butyl acetate, 3-methyl-3-methoxy-n-butyl acetate, ethylene glycol monomethyl ether acetate, propylene glycol monomethyl ether acetate, methyl n-butyl ketone, methyl isobutyl ketone, diisobutyl ketone, 2-heptanone, acetylacetone, cyclopentanone, cyclohexanone, cycloheptanone, γ-butyrolactone, γ-valerolactone, δ-valerolactone, propylene carbonate, N-methylpyrrolidone, N,N'-dimethylformamide, N,N'-dimethylacetamide, 1,3-dimethyl-2-imidazolidinone and the like.

Among these, 3-methoxy-n-butyl acetate, propylene glycol monomethyl ether acetate, γ-butyrolactone and the like are preferable from the viewpoint of coatability.

Specific examples of the compound having three or more ether bonds and a boiling point of 110 to 250° C. under an atmospheric pressure include diethylene glycol dimethyl ether, diethylene glycol diethyl ether, diethylene glycol ethyl methyl ether, diethylene glycol di-n-propyl ether, dipropylene glycol dimethyl ether, dipropylene glycol diethyl ether, dipropylene glycol ethyl methyl ether, dipropylene glycol di-n-propyl ether and the like.

Among these, diethylene glycol dimethyl ether, diethylene glycol ethyl methyl ether, dipropylene glycol dimethyl ether and the like are preferable from the viewpoint of coatability.

There is no particular limitation on the content of the solvent, and it is possible to contain an optional amount of the solvent according to a coating method. For example, when a film is formed by spin coating, the content is usually controlled within a range from 50% by weight to 95% by weight based on the whole photosensitive resin composition.

The photosensitive resin composition of the present invention may contain a crosslinking agent. The crosslinking agent is a compound which has a site capable of reacting with a residual silanol in a polysiloxane and an aromatic ring in a naphthoquinone diazide compound during firing. When the crosslinking agent is incorporated into a polysiloxane during firing, a new crosslinked structure is formed, thus improving a crosslink density of a fired film, leading to suppression of deterioration of resolution due to reflow of a pattern during firing.

The crosslinking agent is not particularly limited, and is preferably a compound having, as a thermal crosslinkable group, two or more groups selected from the group consisting of a methylol group represented by the general formula (7), an epoxy group and an oxetane group in the molecule. The thermal crosslinkable group contained in a molecule is preferably the same. These crosslinking agents may be used alone, or two or more crosslinking agents may be used in combination.

[Chemical Formula 9]

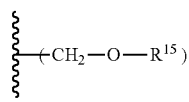
(7)

In a methylol-based compound having two or more methylol groups represented by the general formula (7), $R^{15}$ represents either hydrogen or an alkyl group having 1 to 10 carbon atoms, and a plurality of $R^{15}$(s) may be respectively the same or different.

Specific examples of the alkyl group include a methyl group, an ethyl group, an n-propyl group, an isopropyl group, an n-butyl group, a t-butyl group, an n-hexyl group, an n-decyl group and the like. However, $R^{15}$ is not limited to these specific examples.

Specific examples of the methylol-based compound having two or more methylol groups include "26DMPC", "DM-BIPC-F", "DM-BIOC-F", "DM-BI25X-F", "46DMOC", "46DMOIPP", "46DMOEP" (all of which are trade names, manufactured by ASAHI ORGANIC CHEMICALS INDUSTRY CO., LTD.); "DML-MBPC", "DML-MBOC", "DML-OCHP", "DML-PC", "DML-PCHP", "DML-PTBP", "DML-34X", "DML-EP", "DML-POP", "DML-OC", "dimethylol-Bis-C", "dimethylol-BisOC-P", "DML-BisOC-Z", "DML-BisOCHP-Z", "DML-PFP", "DML-PSBP", "DML-MB25", "DML-MTrisPC", "DML-Bis25X-34XL", "DML-Bis25X-PCHP" (all of which are trade names, manufactured by Honshu Chemical Industry Co., Ltd.); "NIKALAC (registered trademark) MX-290" (trade name, manufactured by Sanwa Chemical Co., Ltd.), "B-a type benzoxazine", "B-m type benzoxazine" (all of which are trade names, manufactured by SHIKOKU CHEMICALS CORPORATION); 2,6-bis(methoxymethyl)-4-t-butylphenol, 2,6-bis(methoxymethyl)-p-cresol, 2,6-bis(acetoxymethyl)-p-cresol and the like. Examples of the compound having three methylol groups include "TriML-P", "TriML-35XL", "TriML-TrisCR-HAP" (all of which are trade names, manufactured by Honshu Chemical Industry Co., Ltd.) and the like. Examples of the compound having four methylol groups include "TM-BIP-A" (trade name, manufactured by ASAHI ORGANIC CHEMICALS INDUSTRY CO., LTD.); "TML-BP", "TML-HQ", "TML-pp-BPF", "TML-BPA", "TMOM-BP" (all of which are trade names, manufactured by Honshu Chemical Industry Co., Ltd.); "NIKALAC (registered trademark) MX-280", "NIKALAC (registered trademark) MX-270" (all of which are trade names, manufactured by Sanwa Chemical Co., Ltd.) and the like. Examples of the compound having six methylol groups include "HML-TPPHBA", "HML-TPHAP", "HMOM-TPPHBA", "HMOM-TPHAP" (all of which are trade names, manufactured by Honshu Chemical Industry Co., Ltd.); "NIKALAC (registered trademark) MW-390", "NIKALAC (registered trademark) MW-100LM", "NIKALAC (registered trademark) MW-30HM" (all of which are trade names, manufactured by Sanwa Chemical Co., Ltd.) and the like.

Examples of the compound having two methylol groups are more preferably "26DMPC", "DM-BIPC-F", "DM-BIOC-F", "46DMOC", "46DMOEP" (all of which are trade names, manufactured by ASAHI ORGANIC CHEMICALS INDUSTRY CO., LTD.); "DML-MBPC", "DML-MBOC", "DML-OCHP", "DML-PC", "DML-PCHP", "DML-PTBP", "DML-34X", "DML-EP", "DML-POP", "Dimethylol-BisOC-P", "DML-PFP", "DML-PSBP", "DML-MTrisPC" (all of which are trade names, manufactured by Honshu Chemical Industry Co., Ltd.); "NIKALAC (registered trademark) MX-290" (trade name, manufactured by Sanwa Chemical Co., Ltd.), "B-a type benzoxazine", "B-m type benzoxazine" (all of which are trade names, manufactured by SHIKOKU CHEMICALS CORPORATION); 2,6-bis(methoxymethyl)-4-t-butylphenol, 2,6-bis(methoxymethyl)-p-cresol, 2,6-bis(acetoxymethyl)-p-cresol and the like. Examples of the compound having three methylol groups are more preferably "TriML-P" "TriML-35XL" (all of which are trade names, manufactured by Honshu Chemical Industry Co, Ltd.) and the like. Examples of the compound having four methylol groups are more preferably "TM-BIP-A" (trade name, manufactured by ASAHI ORGANIC CHEMICALS INDUSTRY CO., LTD.), "TML-BP", "TML-HQ", "TML-pp-BPF", "TML-BPA", "TMOM-BP" (all of which are trade names, manufactured by Honshu Chemical Industry Co., Ltd.); "NIKALAC (registered trademark) MX-280", "NIKALAC (registered trademark) MX-270" (all of which are trade names, manufactured by Sanwa Chemical Co., Ltd.) and the like. Examples of the compound having six methylol groups are more preferably, "HML-TPPHBA", "HML-TPHAP", "HMOM-TPPHBA", "HMOM-TPHAP" (all of which are trade names, manufactured by Honshu Chemical Industry Co., Ltd.); "NIKALAC (registered trademark) MW-390", "NIKALAC (registered trademark) MW-100LM", "NIKALAC (registered trademark) MW-30HM" (all of which are trade names, manufactured by Sanwa Chemical Co., Ltd.) and the like.

More preferred examples include "NIKALAC (registered trademark) MX-280", "NIKALAC (registered trademark) MX-270", "NIKALAC (registered trademark) MW-100LM", "NIKALAC (registered trademark) MW-390", "NIKALAC (registered trademark) MW-30HM" (all of which are trade names, manufactured by Sanwa Chemical Co., Ltd.) and the like.

Among these crosslinking agents, a compound having a methylol group, or a methylol group substituted on a hydrogen atom of an alcoholic hydroxyl group forms a crosslinked structure by reaction mechanism of performing the electrophilic substitution reaction on an aromatic ring.

Specific examples of the epoxy compound or oxetane compound, each having two or more epoxy or oxetane groups, include "EPOLITE (registered trademark) 40E", "EPOLITE (registered trademark) 100E", "EPOLITE (registered trademark) 200E", "EPOLITE (registered trademark) 400E", "EPOLITE (registered trademark) 70P", "EPOLITE (registered trademark) 200P", "EPOLITE (registered trademark) 400P", "EPOLITE (registered trademark) 1500NP", "EPOLITE (registered trademark) 80MF", "EPOLITE (registered trademark) 4000", "EPOLITE (registered trademark) 3002" (all of which are trade names, manufactured by KYOEISHA CHEMICAL Co., Ltd.), "DENACOL (registered trademark) EX-212L", "DENACOL (registered trademark) EX-214L", "DENACOL (registered trademark) EX-216L", "DENACOL (registered trademark) EX-850L", "DENACOL (registered trademark) EX-321L" (all of which are trade names, manufactured by Nagase ChemteX Corporation), "GAN", "GOT", "EPPN502H", "NC3,000", "NC6000" (all of which are trade names, manufactured by Nippon Kayaku Co., Ltd.), "EPIKOTE (registered trademark) 828", "EPIKOTE (registered trademark) 1002", "EPIKOTE (registered trademark) 1750", "EPIKOTE (registered trademark) 1007", "EPIKOTE (registered trademark) E1256", "EPIKOTE (registered trademark) E4250", "EPIKOTE (registered trademark) E4275", "YX8100-

BH30" (all of which are trade names, manufactured by Japan Epoxy Resins Co., Ltd.), "EPICLON (registered trademark) EXA-9583", "EPICLON (registered trademark) HP4032", "EPICLON (registered trademark) N695", "EPICLON (registered trademark) HP7200" (all of which are trade names, manufactured by Dainippon Ink & Chemical Industry Corporation), "TEPIC (registered trademark) S", "TEPIC (registered trademark) C", "TEPIC (registered trademark) P" (all of which are trade names, manufactured by Nissan Chemical Industries, Ltd.), "Epotohto (registered trademark) YH-434L" (trade name, manufactured by NIPPON STEEL & SUMIKIN CHEMICAL CO., LTD.) and the like.

The content of the crosslinking agent is not particularly limited, and is preferably from 0.01 to 20 parts by weight, and still more preferably from 0.1 to 10 parts by weight, based on 100 parts by weight of the polysiloxane (A). When the polysiloxane (A) is an inorganic particle-containing polysiloxane obtained by reacting an organosilane with inorganic particles, summation of the amount of inorganic particles to be reacted with an organosilane and the amount of the polysiloxane gives 100 parts by weight. The content of less than 0.001 part by weight may sometimes exert insufficient effect of suppressing deterioration of resolution. The content of more than 20% by weight may sometimes cause deterioration of transparency of a fired film and deterioration of storage stability of a coating solution of a photosensitive resin composition.

The photosensitive resin composition of the present invention may contain a silane coupling agent. Inclusion of the silane coupling agent enables an increase in interaction between a coating film and a substrate, leading to an improvement in adhesion of a fired film.

Specific examples of the silane coupling agent include methyltrimethoxysilane, methyltriethoxysilane, dimethyldimethoxysilane, dimethyldiethoxysilane, ethyltrimethoxysilane, ethyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, vinyltrimethoxysilane, vinyltriethoxysilane, methylvinyldimethoxysilane, divinyldiethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-acryloxypropyltriethoxysilane, 3-acryloxypropylmethyldimethoxysilane, 3-acryloxypropylmethyldiethoxysilane, phenyltrimethoxysilane, phenyltriethoxysilane, diphenyldimethoxysilane, diphenyldiethoxysilane, 4-hydroxyphenyltrimethoxysilane, 4-methoxyphenyltrimethoxysilane, 1-naphthyltrimethoxysilane, 4-styryltrimethoxysilane, 3-glycidoxypropyltrimethoxysilane, 3-glycidoxypropyltriethoxysilane, 3-glycidoxypropylmethyldimethoxysilane, 3-glycidoxypropylmethyldiethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-aminopropyltrimethoxysilane, 3-aminopropyltriethoxysilane, N-(2-aminoethyl)-3-aminopropyltrimethoxysilane, N-(2-aminoethyl)-3-aminopropyltriethoxysilane, N-phenyl-3-aminopropyltrimethoxysilane, 3-ureidopropyltrimethoxysilane, 3-ureidopropyltriethoxysilane, 3-triethoxysilyl-N-(1,3-dimethyl-butylidene)propylamine, 3-isocyanatepropyltriethoxysilane, 3-isocyanatepropylmethyldiethoxysilane, 1,3,5-tris(trimethoxysilylpropyl)isocyanuric acid, 3-mercaptopropyltrimethoxysilane, 3-mercaptopropyltriethoxysilane, 3-mercaptopropylmethyldimethoxysilane, 3-trimethoxysilylpropylsuccinic acid, 3-trimethoxysilylpropylsuccinic anhydride, N-t-butyl-2-(3-trimethoxysilylpropyl)succinic acid imide, organosilane represented by the general formula (8) and the like. These silane coupling agents may be used alone, or two or more silane coupling agents may be used in combination.

[Chemical Formula 10]

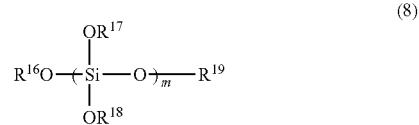

(8)

In the organosilane represented by the general formula (8), $R^{16}$ to $R^{19}$ in the formula, each independently represents hydrogen, an alkyl group having 1 to 6 carbon atoms, an acyl group having 2 to 6 carbon atoms, or an aryl group having 6 to 15 carbon atoms. These alkyl groups, acyl groups and aryl groups may be either a non-substitution product or a substitution product, which can be selected according to properties of the composition.

Specific examples of the alkyl group include a methyl group, an ethyl group, an n-propyl group, an isopropyl group, an n-butyl group and the like. Specific examples of the acyl group include an acetyl group and the like. Specific examples of the aryl group include a phenyl group and the like. m in the general formula (8) represents an integer of 1 to 8.

Specific examples of the organosilane represented by the general formula (8) include tetramethoxysilane, tetraethoxysilane, tetra-n-propoxysilane, tetraisopropoxysilane, tetra-n-butoxysilane, tetraacetoxysilane, "Methyl Silicate 51" (trade name, manufactured by Fuso Chemical Co., Ltd.), "M Silicate 51", "Silicate 40", "Silicate 45" (all of which are trade names, manufactured by Tama Chemicals Co., Ltd.); "Methyl Silicate 51", "Methyl Silicate 53A", "Ethyl Silicate 40", "Ethyl Silicate 48" (all of which are trade names, manufactured by COLCOAT CO., Ltd.) and the like.

When the photosensitive resin composition of the present invention has positive photosensitivity, among these silane coupling agents, 1-naphthyltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-ureidopropyltrimethoxysilane, 3-ureidopropyltriethoxysilane, 1,3,5-tris(trimethoxysilylpropyl)isocyanuric acid, N-t-butyl-2-(3-trimethoxysilylpropyl)succinic acid imide, tetramethoxysilane, tetraethoxysilane, tetra-n-propoxysilane, tetraisopropoxysilane, tetra-n-butoxysilane, tetraacetoxysilane, "Methyl Silicate 51" (trade name, manufactured by Fuso Chemical Co., Ltd.), "M Silicate 51", "Silicate 40", "Silicate 45" (all of which are trade names, manufactured by Tama Chemicals Co., Ltd.); "Methyl Silicate 51", "Methyl Silicate 53A", "Ethyl Silicate 40", "Ethyl Silicate 48" (all of which are trade names, manufactured by COLCOAT CO., Ltd.) and the like are preferable.

When the photosensitive resin composition of the present invention has negative photosensitivity, among these silane coupling agents, vinyltrimethoxysilane, vinyltriethoxysilane, 3-methacryloxypropyltrimethoxysilane, 3-methacryloxypropyltriethoxysilane, 3-acryloxypropyltrimethoxysilane, 3-acryloxypropyltriethoxysilane, 1-naphthyltrimethoxysilane, 4-styryltrimethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-aminopropyltrimethoxysilane, 3-aminopropyltriethoxysilane, 3-ureidopropyltrimethoxysilane, 3-ureidopropyltriethoxysilane, 3-triethoxysilyl-N-(1,3-dimethyl-butylidene)propylamine, 3-isocyanatepropyltriethoxysilane, 1,3,5-tris(trimethoxysilylpropyl)isocyanuric acid, 3-mercaptopropyltrimethoxysilane, 3-mercaptopropyltriethoxysilane, N-t-butyl-2-(3-trimethoxysilylpropyl)succinic acid imide, tetramethoxysilane, tetraethoxysilane, tetra-n-propoxysilane, tetraisopropoxysilane, tetra-n-butoxysilane, tetraacetoxysilane, "Methyl Silicate 51" (trade name, manufactured by Fuso Chemical Co., Ltd.), Silicate 51", "Silicate 40", "Silicate 45" (all of which are trade names, manufactured by Tama Chemicals Co., Ltd.); "Methyl Silicate 51", "Methyl Silicate 53A", "Ethyl Silicate 40", "Ethyl Silicate 48" (all of which are trade names, manufactured by COLCOAT CO., Ltd.) and the like are preferable.

The content of the silane coupling agent is not particularly limited, and is preferably from 0.01 to 15 parts by weight, and still more preferably from 0.1 to 10 parts by weight, based on 100 parts by weight of the polysiloxane (A). When the polysiloxane (A) is an inorganic particle-containing polysiloxane obtained by reacting an organosilane with inorganic particles, summation of the amount of inorganic particles to be reacted with an organosilane and the amount of the polysiloxane gives 100 parts by weight. The content of less than 0.01 part by weight may sometimes exert insufficient effect of improving adhesion. The content of more than 15% by weight may sometimes cause formation of residues after the development, leading to deterioration of storage stability of a coating solution of the photosensitive resin composition.

The photosensitive resin composition of the present invention may contain a surfactant. Inclusion of an appropriate amount of the surfactant enables an improvement in leveling property during coating and suppression of coating unevenness, thus making it possible to obtain a uniform coating film.

There is no particular limitation on the surfactant, and known surfactants such as a fluorine-based surfactant, a silicone-based surfactant, a polyalkylene oxide-based surfactant and poly(meth)acrylate-based surfactant are commonly used. These surfactants may be used alone, or two or more surfactants may be used in combination.

Specific examples of the fluorine-based surfactant include fluorine-based surfactants made of a compound having a fluoroalkyl group or a fluoroalkylene chain at least any site of end, main chain and side chain, for example, 1,1,2,2-tetrafluorooctyl(1,1,2,2-tetrafluoropropyl)ether, 1,1,2,2-tetrafluorooctyl hexyl ether, octaethylene glycol bis(1,1,2,2-tetrafluorobutyl)ether, hexaethylene glycol(1,1,2,2,3,3-hexafluoropentyl)ether, octapropylene glycolbis(1,1,2,2-tetrafluorobutyl)ether, hexapropyleneglycol bis(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, N-[3-(perfluorooctanesulfoneamide)propyl]-N,N'-dimethyl-N-carboxymethyleneammonium betaine, perfluoroalkylsulfoneamidepropyltrimethylammonium salt, perfluoroalkyl-N-ethylsulfonyl glycine salt, phosphoric acid bis(N-perfluorooctylsulfonyl-N-ethylaminoethyl), monoperfluoroalkylethylphosphoric acid ester; "Megafac (registered trademark) F-142D" "Megafac (registered trademark) F-172", "Megafac (registered trademark) F-173", "Megafac (registered trademark) F-183", "Megafac (registered trademark) F-444", "Megafac (registered trademark) F-445", "Megafac (registered trademark) F-470", "Megafac (registered trademark) F-475", "Megafac (registered trademark) F-477", "Megafac (registered trademark) F-555", "Megafac (registered trademark) F-559" (all of which are trade names, manufactured by Dainippon Ink & Chemical Industry Corporation); "EFTOP (registered trademark) F301", "EFTOP (registered trademark) 303", "EFTOP (registered trademark) 352" (all of which are trade names, manufactured by Mitsubishi Materials Electronic Chemicals Co., Ltd.); "Flolard (registered trademark) FC-430", "Flolard (registered trademark) FC-431" (all of which are trade names, manufactured by Sumitomo 3M Limited); "AsahiGuard (registered trademark) AG710" (trade name, manufactured by ASAHI GLASS CO., LTD.); "SURFLON (registered trademark) S-382", "SURFLON (registered trademark) SC-101", "SURFLON (registered trademark) SC-102", "SURFLON (registered trademark) SC-103", "SURFLON (registered trademark) SC-104", "SURFLON (registered trademark) SC-105", "SURFLON (registered trademark) SC-106" (all of which are trade names, manufactured by AGC SEIMI CHEMICAL CO., LTD.); "BM-1,000", "BM-1100" (all of which are trade names, manufactured by Yusho Co., Ltd.); "NBX-15", "FTX-218", "DFX-218" (all of which are trade names, manufactured by Neos Corporation) and the like.

Specific examples of the silicone-based surfactant include "SH28PA", "SH7PA", "SH21PA", "SH30PA", "ST94PA" (all of which are trade names, manufactured by Dow Corning Toray Co., Ltd.); "BYK-301", "BYK-307", "BYK-331", "BYK-333", "BYK-345" (all of which are trade names, manufactured by BYK Japan KK) and the like.

The content of the surfactant is not particularly limited, and is common and preferred to control the content within a range from 0.0001 to 1% by weight in the photosensitive resin composition.

Typical method for producing a photosensitive resin composition of the present invention will be described. When a photosensitive resin composition having positive photosensitivity is produced, for example, (B1) a photoacid generator, (B2) a photobase generator, (B3) a thermal acid generator, (B4) a thermal base generator, (D) a naphthoquinone diazide compound, (E2) a photosensitizes, and other additives are added to an optional solvent, and then dissolved by stirring. Thereafter, (A) a polysiloxane and (C) inorganic particles are added, followed by stirring for 20 minutes to 3 hours to obtain a uniform solution. After stirring, the obtained solution is filtered to obtain a photosensitive resin composition having positive photosensitivity of the present invention.

When a photosensitive resin composition having negative photosensitivity is produced, for example, (B1) a photoacid generator, (B2) a photobase generator, (B3) a thermal acid generator, (B4) a thermal base generator, (E1) a photopolymerization initiator, (E2) a photosensitizer, and other additives are added to an optional solvent, and then dissolved by stirring. Thereafter, (A) a polysiloxane, (C) inorganic particles, and (F) a photopolymerizable compound are added, followed by stirring for 20 minutes to 3 hours to obtain a uniform solution. After stirring, the obtained solution is filtered to obtain a photosensitive resin composition having negative photosensitivity of the present invention.

A method for forming a fired film with a pattern formed thereon using the photosensitive resin composition of the present invention will be described by way of examples.

First, the photosensitive resin composition of the present invention is coated on a substrate. Examples of usable substrate include, but are not limited to, wafers such as silicon, silicon carbide, gallium nitride and diamond, or those on which metals such as copper, gold and titanium are formed thereon as an electrode or wiring. Examples of the coating method include a micro gravure coating method, a spin coating method, a dip coating method, a curtain flow coating method, a roll coating method, a spray coating method, a slit coating method and the like. The coating film thickness varies depending on the coating method, the solid content and the viscosity of the photosensitive resin composition and the like, and coating is usually performed so that the film thickness after coating and prebaking becomes 0.1 to 15 µm.

Next, the substrate coated with the photosensitive resin composition is prebaked to form a prebaked film of the photosensitive resin composition. Prebaking is preferably performed at 50 to 150° C. for 1 minute to several hours using an oven, a hot plate, infrared rays and the like. If necessary, prebaking may be performed in two or more stages, for example, prebaking is performed at 120° C. for 2 minutes after prebaking at 80° C. for 2 minutes.

Next, the prebaked film thus obtained is allowed t undergo patterning exposure by irradiating with active chemical rays through a mask having a desired pattern. Examples of active chemical rays used for patterning exposure include ultraviolet rays, visible rays, electron beams, X-rays and the like. In the present invention, it is preferred to use j-line (wavelength of 313 nm), i-line (wavelength of 365 nm), h-line (wavelength of 405 nm) or g-line (wavelength of 436 nm) of a mercury lamp.

Next, baking before development (post exposure baking) may be performed. The baking before development enables expectation of the effect of improving resolution during development and increasing a permissible range of development conditions. In this case, the baking temperature is preferably from 50 to 180° C., and more preferably from 60 to 150° C. The baking time is preferably from 10 seconds to several hours. When the conditions are within the above range, there is an advantage that the reaction satisfactorily proceeds, thus reducing the development time.

Next, the exposed film is subjected to a development treatment to form a relief pattern. When the photosensitive resin composition has positive photosensitivity, the relief pattern is obtained by removing the exposed area with a developing solution. When the photosensitive resin composition has negative photosensitivity, the relief pattern is obtained by removing the unexposed area with a developing solution.

It is possible to select an appropriate developing solution according to the composition of a polysiloxane. It is possible to preferably use an aqueous solution of compounds which exhibits alkalinity, for example, ammonia, tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethylmethacrylate, cyclohexylamine, ethylenediamine, hexamethylenediamine and the like.

It is also possible to use, as the developing solution, solvents contained in the photosensitive resin composition, such as alcohols, ketones, ethers, N-methyl-2-pyrrolidone, N-acetyl-2-pyrrolidone, N,N-dimethylformamide, N,N-dimethylacetamide, dimethyl sulfoxide, hexamethylphosphortriamide, γ-butyrolactone and the like. Alternatively, it is possible to use a mixed solution prepared by using these solvents in combination with poor solvents of the photosensitive resin composition, such as methanol, ethanol, isopropyl alcohol, water, methyl carbitol, ethyl carbitol, toluene, xylene, ethyl lactate, ethyl pyruvate, propylene glycol monomethyl ether acetate, methyl-3-methoxypropionate, ethyl-3-ethoxypropionate, 2-heptanone, cyclopentanone, cyclohexanone, and ethyl acetate.

From an environmental point of view, it is desired to develop with an aqueous alkali solution as compared with an organic alkali developing solution.

The development treatment can be performed by a method in which the exposed film is directly coated with the developing solution, a method in which the developing solution is sprayed after atomizing, a method in which the exposed film is immersed in the developing solution, a method in which ultrasonic wave is applied the exposed film while immersing the exposed film in the developing solution and the like.

After the development treatment, the relief pattern formed by the development is preferably rinsed with a rinsing solution. It is possible to preferably use, as the rinsing solution, water when an aqueous alkali solution is used as the developing solution. A rinsing treatment may be performed using a solution prepared by adding alcohols such as ethanol and isopropyl alcohol, esters such as propylene glycol monomethyl ether acetate, and acids such as carbonic acid gas, hydrochloric acid and acetic acid to water.

When rinsing with an organic solvent, it is possible to use solvents having satisfactory miscibility with a developing solution, such as methanol, ethanol, isopropyl alcohol, ethyl lactate, ethyl pyruvate, propylene glycol monomethyl ether acetate, methyl-3-methoxypropionate, ethyl-3-ethoxypropionate, 2-heptanone and ethyl acetate.

When the photosensitive resin composition has positive photosensitivity, bleaching exposure may be optionally performed without using a mask. The bleaching exposure enables expectation of the effect of improving resolution after firing, the effect capable of controlling a pattern shape after firing, and the effect of improving transparency after firing. Examples of active chemical rays used for bleaching exposure include ultraviolet rays, visible rays, electron beams, X-rays and the like. In the present invention, it is preferred to use j-line (wavelength of 313 nm) i-line (wavelength of 365 nm), h-line (wavelength of 405 nm) or g-line (wavelength of 436 nm) of a mercury lamp.

Next, middle baking may be optionally performed. The middle baking expectation of the effect of improving resolution after firing and the effect capable of controlling a pattern shape after firing. In this case, the baking temperature is preferably from 60 to 250° C., and more preferably from 70 to 220° C. The baking time is preferably from 10 seconds to several hours.

Next, in order to form a fired film of the photosensitive resin composition of the present invention, the developed film is heated at a temperature of 200 to 1,000° C. This heat treatment can be performed under an air atmosphere or under an atmosphere of an inert gas such as nitrogen. This heat treatment is preferably performed by raising the temperature in a stepwise or continuous manner for 5 minutes to 5 hours. Examples thereof include a method in which a heat treatment is performed at 130° C., 200° C. and 350° C. for each 30 minutes, or a method in which the temperature is linearly raised from room temperature to 400° C. over 2 hours.

The photosensitive resin composition of the present invention is suitably applied for an ion implantation mask, and is preferably applied for a production process of a semiconductor device in which the temperature of ion implantation into semiconductor substrate is from 200 to 1,000° C. The ion implantation temperature is more preferably from 200 to 800° C., and still more preferably from 250 to 700° C. The ion implantation temperature of lower than 200° C. may cause a fear that an implantation layer becomes a continuous amorphous and satisfactory recrystallization does not proceed, and thus failing to form a low resistance layer even if high temperature annealing is performed. The ion implantation temperature of higher than 1,000° C. may cause thermal oxidation and step bunching of SiC, thus requiring removal of the portion after ion implantation.

When the photosensitive resin composition of the present invention is applied for an ion implantation mask, resolution is preferably 7 μm or less, more preferably 5 μm or less, and still more preferably 3 μm or less. From the viewpoint of controlling an ion implanted region, the obtained film preferably has a pattern shape closer to a rectangular shape. More preferably, a taper angle of the obtained film is 60° or more, more preferably 70° or more, and still more preferably 80° or more.

The ion implantation mask is removed after an ion implantation step. Examples of the removing method include, but are not limited to, a wet process using hydrofluoric acid, buffered hydrofluoric acid, fluonitric acid or TMAH, and a dry process such as a plasma treatment. From the viewpoint of low cost, a wet process is preferable.

A method for producing a semiconductor device of the present invention includes steps of forming a pattern of the photosensitive resin composition on a semiconductor substrate using the above method; firing the pattern of the resin composition to obtain a fired pattern; implanting ions into the region of the semiconductor substrate where the fired pattern does not exist, using the fired pattern as an ion implantation mask; and removing the ion implantation mask. Due to the above-mentioned feature of silicon carbide, the method for producing a semiconductor device of the present invention can be particularly preferably applied to silicon carbide.

A cross-sectional schematic view showing a method for producing a metal-oxide-semiconductor field-effect transistor (MOSFET) as a silicon carbide semiconductor device is shown in FIGS. 1 to 6. The procedure of the production method will be described with reference to these drawings. This method is an example and the photosensitive resin composition of the present invention is not applied only for this method.

Figure 1:
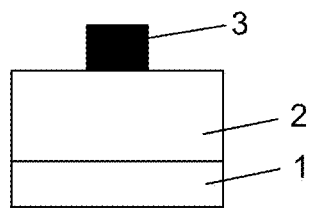
FIG. 1 is a schematic view of an ion implantation process in the present invention.

As shown in FIG. 1, first, an n⁻ type SiC epilayer 2 is homoepitaxially grown on a surface of n⁺ type SiC substrate 1 to form a SiC base. Next, a first photosensitive ion implantation mask pattern 3 made of the photosensitive resin composition of the present invention is formed on a surface of the SiC base by the above pattern forming method and firing method. At this time, the film thickness of a mask pattern is set within a range from 0.5 to 4 μm, and preferably from 1 to 3 μm. Since reactive ion etching is not used when a first photosensitive ion implantation mask pattern 3 is formed, plasma damage to SiC base surface does not occur.

Figure 2:
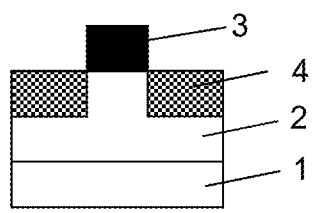
FIG. 2 is a schematic view of an ion implantation process in the present invention.

Next, as shown in FIG. 2, p type ions as first conductive type impurities are implanted into a surface layer portion of the SiC base using the first photosensitive ion implantation mask pattern 3 as a mask to form a p type base region 4 as a first impurity region in an n⁻ type SiC epilayer 2. At this time, an external edge boundary of the p type base region 4 as the first impurity region is defined by the first photosensitive ion implantation mask pattern 3. An example of ion implantation conditions is shown below. That is, an aluminum (Al) element is used as impurity for ion implantation, the temperature of the substrate during ion implantation is 500° C., and the concentration of an Al element from a film surface of the photosensitive ion implantation mask pattern to a depth of 0.8 μm has a box profile of $2\times10^{18}$ atoms/cc.

Figure 3:
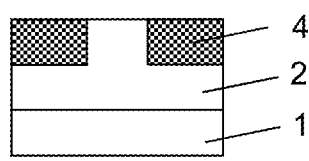
FIG. 3 is a schematic view of an ion implantation process in the present invention.

Next, as shown in FIG. 3, the first photosensitive ion implantation mask pattern 3 is removed by hydrofluoric acid, buffered fluoric acid, fluonitric acid, TMAH, a plasma treatment or the like.

Figure 4:
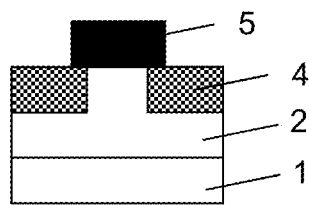
FIG. 4 is a schematic view of an ion implantation process in the present invention.

As shown in FIG. 4, a second photosensitive ion implantation mask pattern 5 is formed in the same manner as in the method for forming the first photosensitive ion implantation mask pattern 3. At this time, the material of the second photosensitive ion implantation mask pattern 5 may be the same as or different from the material of the first photosensitive ion implantation mask pattern 3. It is also possible to change the material of a mask pattern by an element for ion implantation.

Figure 5:
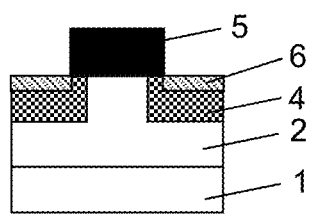
FIG. 5 is a schematic view of an ion implantation process in the present invention.

Next, as shown in FIG. 5, n type impurities as second conductive type impurities are ion-implanted into a surface layer portion of the p type base region 4 as the first impurity region using the second photosensitive ion implantation mask pattern 5 as a mask to form an n type source region 6 as a second impurity region. At this time, an external edge boundary of the n⁺ type source region 6 of the second impurity region is defined by the second photosensitive ion implantation mask patterns. An example of ion implantation conditions is shown below. That is, a nitrogen (N) element is used as impurity for ion implantation, the temperature of the substrate during ion implantation is 500° C., and the concentration of an Al element from a film surface of the photosensitive ion implantation mask pattern to a depth of up to 0.3 μm has a box profile of $3\times10^{19}$ atoms/cm³.

Next (not shown), the second photosensitive ion implantation mask pattern 5 is removed in the same manner as in the first photosensitive ion implantation mask pattern 3. Next (not shown), in order to recrystallize a crystal of SiC damaged by the ion implantation, annealing is performed under an inert gas atmosphere or a hydrogenated inert gas atmosphere at the temperature of 1,300 to 2,300° C.

Figure 6:
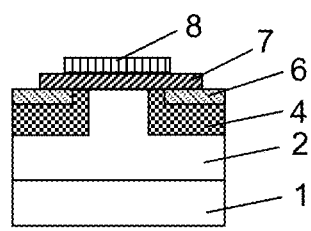
FIG. 6 is a schematic view of an ion implantation process in the present invention.

Next, as shown in FIG. 6, the material on a surface of the substrate is converted into $SiO_2$ by thermal oxidation, leading to growing of a desired thickness of a gate insulating film 7. Next, a nickel film covering a channel region is formed on the gate insulating film 7 and the nickel film is patterned to form a gate electrode 8. Next (not shown), a portion of the region covering the n type source region 6 of the gate insulating film 7 is opened to form a source electrode in this opening. Next (not shown), a drain electrode and an internal wiring are formed to thereby complete a planer type power MOSFET cell.

EXAMPLES

The present invention will be described in more specifically below by way of Examples, but the present invention is not limited to these Examples. Names are shown below regarding compounds represented by abbreviations among compounds used.

DAA: Diacetone alcohol

DPHA: "KAYARAD (registered trademark) DPHA" (trade name, manufactured by Nippon Kayaku Co., Ltd., dipentaerythritol hexaacrylate)

F-477: "Megafac (registered trademark) F-477" (trade name, manufactured by Dainippon Ink & Chemical Industry Corporation)

GBL: γ-Butyrolactone

GPC: Gel permeation chromatography

HMDS: Hexamethyldisilazane

IC-907: "IRGACURE (registered trademark) 907" (trade name, manufactured by BASF Corporation, 2-methyl-1-[4-(methylthio)phenyl]-2-morpholinopropan-1-one)

IPA: Isopropyl alcohol

L&S: Line&Space

MeOH: Methanol

MDRM: Multi-Density Resolution Mask

MDT: N-trifluoromethylsulfonyloxy-5-norbornene-2,3-dicarboxyimide (trade name, manufactured by Heraeus Kulzer Japan Co., Ltd.)

NMD-W: Aqueous 2.38% by weight TMAH solution (trade name, manufactured by TOKYO OHKA KOGYO Co., Ltd.)

OXE-01: "IRGACURE (registered trademark) OXE-01" (trade name, manufactured by BASF Corporation, 1-[4-(phenylthio)phenyl]octane-1,2-dione-2-(O-benzoyl) oxime)

PGME: Propylene glycol monomethyl ether

PGMEA: Propylene glycol monomethyl ether acetate

Ph-cc-AP: 1-(3,4-dihydroxyphenyl)-1-(4-hydroxyphenyl)-1-phenylethane (trade name, manufactured by Honshu Chemical Industry Co., Ltd.)

PL-2L: "Quartron (registered trademark) PL-2L" (trade name, manufactured by Fuso Chemical Co., Ltd., silica particles having a particle diameter of 15 to 20 nm in which a dispersion solution is water)

PL-2L-DAA: "Quartron (registered trademark) PL-2L-DAA" (trade name, manufactured by Fuso Chemical Co., Ltd., silica particles having a particle diameter of 15 to 20 nm in which diacetone alcohol is used as a dispersion medium)

PL-2L-IPA: "Quartron (registered trademark) PL-2L-IPA" (trade name, manufactured by Fuso Chemical Co., Ltd., silica particles having a particle diameter of 15 to 20 nm in which isopropyl alcohol is used as a dispersion medium)

PL-2L-MA: "Quartron (registered trademark) PL-2L-MA" (trade name, manufactured by Fuso Chemical Co., Ltd., silica particles having a particle diameter of 15 to 20 nm in which methanol is used as a dispersion medium)

PL-2L-PGME: "Quartron (registered trademark) PL-2L-PGME" (trade name, manufactured by Fuso Chemical Co., Ltd., silica particles having a particle diameter of 15 to 20 nm in which propylene glycol monomethyl ether is used as a dispersion medium)

SI-200: "San-Aid (registered trademark) SI-200" (trade name, manufactured by SANSHIN CHEMICAL INDUSTRY CO., LTD., 4-(methoxycarbonyloxy)phenyldimethylsulfonium trifluoromethanesulfonate)

THF: Tetrahydrofuran

TMAH: Tetramethylammonium hydroxide

Tris P-HAP: 1,1,1-Tris(4-hydroxyphenyl)ethane (trade name, manufactured by Honshu Chemical Industry Co., Ltd.)

TrisP-PA: 1,1-Bis(4-hydroxyphenyl)-1-[4-[1-(4-hydroxyphenyl)-1-methylethyl]phenyl]ethane (trade name, manufactured by Honshu Chemical Industry Co., Ltd.)

XPS-4958G: "Novolak resin XPS-4958G" (trade name, manufacture by Gunei Chemical Industry Co., Ltd.)

Synthesis Example 1: Synthesis of Polysiloxane Solution (A-1)

In a three-necked flask, 69.40 g (83.3 mol %) of phenyltrimethoxysilane, 18.36 g (16.7 mol %) of 3-trimethoxysilylpropylsuccinic anhydride, 74.69 g (21.7% by weight based on the weight of a silica particle-containing polysiloxane) of PL-2L-MA (22.5% by weight MeOH solution), and 113.92 g of DAA were charged. Nitrogen was allowed to flow into the flask at 0.05 L/min and the mixed solution was heated to 40° C. in an oil bath while stirring. While further stirring the mixed solution, an aqueous phosphoric acid solution prepared by dissolving 1.08 g of phosphoric acid in 23.97 g of water was added over 10 minutes. After completion of the addition, a silane compound was hydrolyzed by stirring at 40° C. for 30 minutes. The bath temperature was set at 70° C. and, after stirring for 1 hour, the bath temperature was raised to 115° C. About 1 hour after initiation of temperature rise, the inner temperature of the solution reached 100° C., followed by heating and stirring for 1 to 3 hours (inner temperature is from 100 to 110° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-1). The solid component concentration of the obtained polysiloxane solution (A-1) was 46% by weight, the moisture content was 3.5% by weight, and the weight average molecular weight of the polysiloxane was 3,200. The content ratio of an organosilane unit having a phenyl group in the polysiloxane was 83.3 mol % in terms of a molar ratio of Si atoms to the number of moles of Si atoms derived from the organosilane of the whole polysiloxane.

Synthesis Example 2: Synthesis of Polysiloxane Solution (A-2)

Using 54.49 g (40 mol %) of methyltrimethoxysilane, 99.15 g (50 mol %) of phenyltrimethoxysilane, 24.64 g (10 mol %) of 2-(3,4-epoxycyclohexyl)ethyltrimethoxysilane, 179.48 g of DAA, 55.86 g of water, and 0.535 g of phosphoric acid, the polymerization was performed in the same manner as in Synthesis Example 1 to obtain a polysiloxane solution (A-2). The solid component concentration of the obtained polysiloxane solution (A-2) was 43% by weight, the moisture content was 2.4% by weight, and the weight average molecular weight of the polysiloxane was 4,200. The content ratio of an organosilane unit having a phenyl group in the polysiloxane was 50 mol % in terms of a molar ratio of Si atoms to the number of moles of Si atoms derived from the organosilane of the whole polysiloxane.

Synthesis Example 3: Synthesis of Polysiloxane Solution (A-3)

Using 10.90 g (16.4 mol %) of methyltrimethoxysilane, 79.32 g (82 mol %) of phenyltrimethoxysilane, 2.10 g (1.6 mol %) of 3-trimethoxysilylpropylsuccinic anhydride, 85.19 g (22.2% by weight based on the weight of a silica particle-containing polysiloxane) of PL-2L (aqueous 19.7% by weight solution), 180.05 g of DAA, and 0.683 g of phosphoric acid, the polymerization was performed in the same manner as in Synthesis Example 1 to obtain a polysiloxane solution (A-3). The solid component concentration of the obtained polysiloxane solution (A-3) was 30% by weight, the moisture content was 2.8% by weight, and the weight average molecular weight of the polysiloxane was 3,000. The content ratio of an organosilane unit having a phenyl group in the polysiloxane was 82 mol % in terms of a molar ratio of Si atoms to the number of moles of Si atoms derived from the organosilane of the whole polysiloxane.

Synthesis Example 4: Synthesis of Polysiloxane Solution (A-4)

In a three-necked flask, 8.17 g (40 mol %) of methyltrimethoxysilane, 14.87 g (50 mol %) of phenyltrimethoxysilane, 3.70 g (10 mol %) of 2-(3,4-epoxycyclohexyl)ethyltrimethoxysilane, 22.28 g (23% by weight based on the weight of a silica particle-containing polysiloxane) of PL-2L-MA (22.5% by weight MeOH solution), and 40.48 g of DAA were charged. Air was allowed to flow into the flask at 0.05 L/min and the mixed solution was heated to 40° C. in an oil bath while stirring. While further stirring the mixed solution, an aqueous phosphoric acid solution prepared by dissolving 0.160 g of phosphoric acid in 8.38 g of water was added over 10 minutes. After completion of the addition, a silane compound was hydrolyzed by stirring at 40° C. for 30 minutes. After completion of the hydrolysis, the bath temperature was set at 70° C., followed by stirring for 1 hour and further rising of the bath temperature to 115° C. About 1 hour after initiation of temperature rise, the inner temperature of the solution reached 100° C., followed by heating and stirring for 1 to 3 hours (inner temperature is from 105 to 115° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-4). The solid component concentration of the obtained polysiloxane solution (A-4) was 35% by weight, the moisture content was 2.6% by weight, and the weight average molecular weight of the polysiloxane was 1,400.

Synthesis Example 5: Synthesis of Polysiloxane Solution (A-5)

Using 10.22 g (10 mol %) of methyltrimethoxysilane, 74.36 g (50 mol %) of phenyltrimethoxysilane, 9.24 g (5 mol %) of 2-(3,4-epoxycyclohexyl)ethyltrimethoxysilane, 22.23 g (20 mol %) of vinyltrimethoxysilane, 17.12 g (15 mol %) of tetramethoxysilane, 119.26 g of PGMEA, 13.25 g of MeOH, 43.25 g of water, and 0.400 g of phosphoric acid, the polymerization was performed in the same manner as in Synthesis Example 1 to obtain a polysiloxane solution (A-5). The solid component concentration of the obtained polysiloxane solution (A-5) was 44% by weight, the moisture content was 1.6% by weight, and the weight average molecular weight of the polysiloxane was 4,500. The content ratio of an organosilane unit having a phenyl group in the polysiloxane was 50 mol % in terms of a molar ratio of Si atoms to the number of moles of Si atoms derived from the organosilane of the whole polysiloxane.

Synthesis Example 6: Synthesis of Polysiloxane Solution (A-6)

Using 8.17 g (40 mol %) of methyltrimethoxysilane, 14.87 g (50 mol %) of phenyltrimethoxysilane, 3.70 g (10 mol %) of 2-(3,4-epoxycyclohexyl)ethyltrimethoxysilane, 40.16 g (35% by weight based on the weight of a silica particle-containing polysiloxane) of PL-2L-MA (22.5% by weight MeOH solution), 47.95 g of DAA, 8.38 g of water, and 0.160 g of phosphoric acid, the polymerization was performed in the same manner as in Synthesis Example 4 to obtain a polysiloxane solution (A-6). The solid component concentration of the obtained polysiloxane solution (A-6) was 36% by weight, the moisture content was 2.4% by weight, and the weight average molecular weight of the polysiloxane was 1,400.

Synthesis Example 7: Synthesis of Polysiloxane Solution (A-7)

In a three-necked flask, 8.17 g (40 mol %) of methyltrimethoxysilane, 14.87 g (50 mol %) of phenyltrimethoxysilane, 40.74 g (35% by weight based on the weight of a silica particle-containing polysiloxane) of PL-2L-MA (22.5% by weight MeOH solution), and 48.63 g of DAA were charged. Air was allowed to flow into the flask at 0.05 L/min and the mixed solution was heated to 40° C. in an oil bath while stirring. While further stirring the mixed solution, an aqueous phosphoric acid solution prepared by dissolving 0.189 g of phosphoric acid in 8.38 g of water was added over 10 minutes. After completion of the addition, a silane compound was hydrolyzed by stirring at 40° C. for 30 minutes. After completion of the hydrolysis, 3.93 g (10 mol %) of 3-trimethoxysilylpropylsuccinic anhydride was added. Thereafter, the bath temperature was set at 70° C., followed by stirring for 1 hour and further rising of the bath temperature to 120° C. About 1 hour after initiation of temperature rise, the inner temperature of the solution reached 100° C., followed by heating and stirring for 1 to 3 hours (inner temperature is from 105 to 115° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-7). The solid component concentration of the obtained polysiloxane solution (A-7) was 36% by weight, the moisture content was 2.8% by weight, and the weight average molecular weight of the polysiloxane was 1,400.

Synthesis Example 8: Synthesis of Polysiloxane Solution (A-8)

Using 8.17 g (40 mol %) of methyltrimethoxysilane, 15.92 g (50 mol %) of 4-tolyltrimethoxysilane, 43.25 g (35% by weight based on the weight of a silica particle-containing polysiloxane) of PL-2L-MA (22.5% by weight MeOH solution), 51.64 g of DAA, 8.38 g of water, 0.224 g of phosphoric acid, and 3.93 g (10 mol %) of 3-trimethoxysilylpropylsuccinic anhydride, the polymerization was performed in the same manner as in Synthesis Example 7 to obtain a polysiloxane solution (A-8). The solid component concentration of the obtained polysiloxane solution (A-8) was 37% by weight, the moisture content was 2.8% by weight, and the weight average molecular weight of the polysiloxane was 1,400.

Synthesis Example 9: Synthesis of Polysiloxane Solution (A-9)

Using 8.17 g (40 mol %) of methyltrimethoxysilane, 37.25 g (50 mol %) of 1-naphthyltrimethoxysilane (50% by weight IPA solution), 49.72 g (35% by weight based on the weight of a silica particle-containing polysiloxane) of PL-2L-MA (22.5% by weight MeOH solution), 59.36 g of DAA, 8.38 g of water, 0.154 g of phosphoric acid, 3.93 g (10 mol %) of 3-trimethoxysilylpropylsuccinic anhydride, the polymerization was performed in the same manner as in Synthesis Example 7 to obtain a polysiloxane solution (A-9). The solid component concentration of the obtained polysiloxane solution (A-9) was 35% by weight, the moisture content was 3.1% by weight, and the weight average molecular weight of the polysiloxane was 1,300.

Synthesis Example 10: Synthesis of Polysiloxane Solution (A-10)

Using 9.02 g (40 mol %) of ethyltrimethoxysilane, 37.25 g (50 mol %) of 1-naphthyltrimethoxysilane (50% by weight IPA solution), 51.74 g (35% by weight based on the weight of a silica particle-containing polysiloxane) of PL-2L-MA (22.5% by weight MeOH solution), 61.77 g of DAA, 8.38 g of water, 0.158 g of phosphoric acid, and 3.93 g (10 mol %) of 3-trimethoxysilylpropylsuccinic anhydride, the polymerization was performed in the same manner as in Synthesis Example 7 to obtain a polysiloxane solution (A-10). The solid component concentration of the obtained polysiloxane solution (A-10) was 33% by weight, the moisture content was 2.9% by weight, and the weight average molecular weight of the polysiloxane was 1,200.

Synthesis Example 11: Synthesis of Polysiloxane Solution (A-11)

Using 8.17 g (40 mol %) of methyltrimethoxysilane, 37.25 g (50 mol %) of 1-naphthyltrimethoxysilane (50% by weight IPA solution), 27.58 g (23% by weight based on the weight of a silica particle-containing polysiloxane) of PL-2L-MA (22.5% by weight MeOH solution), 50.11 g of DAA, 8.38 g of water, 0.154 g of phosphoric acid, and 3.93 g (10 mol %) of 3-trimethoxysilylpropylsuccinic anhydride, the polymerization was performed in the same manner as in Synthesis Example 7 to obtain a polysiloxane solution (A-11). The solid component concentration of the obtained polysiloxane solution (A-11) was 35% by weight, the moisture content was 2.9% by weight, and the weight average molecular weight of the polysiloxane was 1,400.

Synthesis Example 12: Synthesis of Polysiloxane Solution (A-12)

Using 8.17 g (40 mol %) of methyltrimethoxysilane, 37.25 g (50 mol %) of 1-naphthyltrimethoxysilane (50% by weight IPA solution), 81.89 g (47% by weight based on the weight of a silica particle-containing polysiloxane) of PL-2L-MA (22.5% by weight MeOH solution), 72.80 g of DAA, 8.38 g of water, 0.154 g of phosphoric acid, and 3.93 g (10 mol %) of 3-trimethoxysilylpropylsuccinic anhydride, the polymerization was performed in the same manner as in Synthesis Example 7 to obtain a polysiloxane solution (A-12). The solid component concentration of the obtained polysiloxane solution (A-12) was 33% by weight, the moisture content was 2.3% by weight, and the weight average molecular weight of the polysiloxane was 1,200.

Synthesis Example 13: Synthesis of Polysiloxane Solution (A-13)

Using 8.17 g (40 mol %) of methyltrimethoxysilane, 37.25 g (50 mol %) of 1-naphthyltrimethoxysilane (50% by weight IPA solution), 138.51 g (60% by weight based on the weight of a silica particle-containing polysiloxane) of PL-2L-MA (22.5% by weight MeOH solution), 96.46 g of DAA, 8.38 g of water, 0.154 of phosphoric acid, and 3.93 g (10 mol %) of 3-trimethoxysilylpropylsuccinic anhydride, the polymerization was performed in the same manner as in Synthesis Example 7 to obtain a polysiloxane solution (A-13). The solid component concentration of the obtained polysiloxane solution (A-13) was 33% by weight, the moisture content was 2.1% by weight, and the weight average molecular weight of the polysiloxane was 1,200.

Synthesis Example 14: Synthesis of Polysiloxane Solution (A-14)

In a three-necked flask, 8.17 g (40 mol %) of methyltrimethoxysilane, 37.25 g (50 mol %) of 1-naphthyltrimethoxysilane (50% by weight IPA solution), 56.79 g (35% by weight based on the weight of a silica particle-containing polysiloxane) of PL-2L (19.7% by weight aqueous solution), and 53.42 g of DAA were charged. Air was allowed to flow into the flask at 0.05 L/min and the mixed solution was heated to 40° C. in an oil bath while stirring. While further stirring the mixed solution, a phosphoric acid DAA solution prepared by dissolving 0.154 g of phosphoric acid in 5.94 g of DAA was added over 10 minutes. After completion of the addition, a silane compound was hydrolyzed by stirring at 40° C. for 30 minutes. After completion of the hydrolysis, 3.93 g (10 mol %) of 3-trimethoxysilylpropylsuccinic anhydride was added. Thereafter, the bath temperature was set at 70° C., followed by stirring for 1 hour and further rising of the bath temperature to 120° C. About 1 hour after initiation of temperature rise, the inner temperature of the solution reached 100° C., followed by heating and stirring for 1 to 3 hours (inner temperature is from 105 to 115° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-14). The solid component concentration of the obtained polysiloxane solution (A-14) was 37% by weight, the moisture content was 5.0% by weight, and the weight average molecular weight of the polysiloxane was 1,000.

Synthesis Example 15: Synthesis of Polysiloxane Solution (A-15)

Using 8.17 g (40 mol %) of methyltrimethoxysilane, 37.25 g (50 mol %) of 1-naphthyltrimethoxysilane (50% by weight IPA solution), 44.57 g (35% by weight based on the weight of a silica particle-containing polysiloxane) of PL-2L-IPA (25.1% by weight IPA solution), 59.36 g of DAA, 8.38 g of water, 0.154 g of phosphoric acid, and 3.93 g (10 mol %) of 3-trimethoxysilylpropylsuccinic anhydride, the polymerization was performed in the same manner as in Synthesis Example 7 to obtain a polysiloxane solution (A-15). The solid component concentration of the obtained polysiloxane solution (A-15) was 34% by weight, the moisture content was 2.8% by weight, and the weight average molecular weight of the polysiloxane was 1,300.

Synthesis Example 16: Synthesis of Polysiloxane Solution (A-16)

Using 8.17 g (40 mol %) of methyltrimethoxysilane, 37.25 g (50 mol %) of 1-naphthyltrimethoxysilane (50% by weight IPA solution), 44.39 g (35% by weight based on the weight of a silica particle-containing polysiloxane) of PL-2L-PGME (25.2% by weight PGME solution), 59.36 g of DAA, 8.38 g of water, 0.154 g of phosphoric acid, and 3.93 g (10 mol %) of 3-trimethoxysilylpropylsuccinic anhydride, the polymerization was performed in the same manner as in Synthesis Example 7 to obtain a polysiloxane solution (A-16). The solid component concentration of the obtained polysiloxane solution (A-16) was 34% by weight, the moisture content was 2.9% by weight, and the weight average molecular weight of the polysiloxane was 1,300.

Synthesis Example 17: Synthesis of Polysiloxane Solution (A-17)

Using 8.17 g (40 mol %) of methyltrimethoxysilane, 37.25 g (50 mol %) of 1-naphthyltrimethoxysilane (50% by weight IPA solution), 42.38 g (35% by weight based on the weight of a silica particle-containing polysiloxane) of PL-2L-DAA (26.4% by weight DAA solution), 59.36 g of DAA, 8.38 g of water, 0.154 g of phosphoric acid, and 3.93 g (10 mol %) of 3-trimethoxysilylpropylsuccinic anhydride, the polymerization was performed in the same manner as in Synthesis Example 7 to obtain a polysiloxane solution (A-17). The solid component concentration of the obtained polysiloxane solution (A-17) was 34% by weight, the moisture content was 2.8% by weight, and the weight average molecular weight of the polysiloxane was 1,300.

Synthesis Example 18: Synthesis of Polysiloxane Solution (A-18)

Using 8.17 g (40 mol %) of methyltrimethoxysilane, 37.25 g (50 mol %) of 1-naphthyltrimethoxysilane (50% by weight IPA solution), 1.14 g (5 mol %) of tetramethoxysilane, 46.85 g (35% by weight based on the weight of a silica particle-containing polysiloxane) of PL-2L-MA (22.5% by weight MeOH solution), 55.93 g of DAA, 8.38 g of water, 0.120 g of phosphoric acid, and 1.97 g (5 mol %) of 3-trimethoxysilylpropylsuccinic anhydride, the polymerization was performed in the same manner as in Synthesis Example 7 to obtain a polysiloxane solution (A-18). The solid component concentration of the obtained polysiloxane solution (A-18) was 34% by weight, the moisture content was 2.0% by weight, and the weight average molecular weight of the polysiloxane was 1,400.

Synthesis Example 19: Synthesis of Polysiloxane Solution (A-19)

Using 7.15 g (35 mol %) of methyltrimethoxysilane, 37.25 g (50 mol %) of 1-naphthyltrimethoxysilane (50% by weight IPA solution), 2.28 g (10 mol %) of tetramethoxysilane, 46.72 g (35% by weight based on the weight of a silica particle-containing polysiloxane) of PL-2L-MA (22.5% by weight MeOH solution), 55.78 g of DAA, 8.51 g of water, 0.120 g of phosphoric acid, and 1.97 g (5 mol %) of 3-trimethoxysilylpropylsuccinic anhydride, the polymerization was performed in the same manner as in Synthesis Example 7 to obtain a polysiloxane solution (A-19). The solid component concentration of the obtained polysiloxane solution (A-19) was 34% by weight, the moisture content was 1.8% by weight, and the weight average molecular weight of the polysiloxane was 1,400.

Synthesis Example 20: Synthesis of Polysiloxane Solution (A-20)

Using 8.17 g (40 mol %) of methyltrimethoxysilane, 37.25 g (50 mol %) of 1-naphthyltrimethoxysilane (50% by weight IPA solution), 1.56 g (5 mol %) of tetraethoxysilane, 47.85 g (35% by weight based on the weight of a silica particle-containing polysiloxane) of PL-2L-MA (22.5% by weight MeOH solution), 57.13 g of DAA, 8.38 g of water, 0.121 g of phosphoric acid, and 1.97 g (5 mol %) of 3-trimethoxysilylpropylsuccinic anhydride, the polymerization was performed in the same manner as in Synthesis Example 7 to obtain a polysiloxane solution (A-20). The solid component concentration of the obtained polysiloxane solution (A-20) was 33% by weight, the moisture content was 1.9% by weight, and the weight average molecular weight of the polysiloxane was 1,400.

Synthesis Example 21: Synthesis of Polysiloxane Solution (A-21)

Using 8.17 g (40 mol %) of methyltrimethoxysilane, 37.25 g (50 mol %) of 1-naphthyltrimethoxysilane (50% by weight IPA solution), 0.90 g (5 mol %) of dimethyldimethoxysilane, 47.10 g (35% by weight based on the weight of a silica particle-containing polysiloxane) of PL-2L-MA (22.5% by weight MeOH solution), 56.23 g of DAA, 8.11 g of water, 0.089 g of phosphoric acid, and 1.97 g (5 mol %) of 3-trimethoxysilylpropylsuccinic anhydride, the polymerization was performed in the same manner as in Synthesis Example 7 to obtain a polysiloxane solution (A-21). The solid component concentration of the obtained polysiloxane solution (A-21) was 35% by weight, the moisture content was 2.9% by weight, and the weight average molecular weight of the polysiloxane was 1,300.

Synthesis Example 22: Synthesis of Polysiloxane Solution (A-22)

Using 5.11 g (25 mol %) of methyltrimethoxysilane, 37.25 g (50 mol %) of 1-naphthyltrimethoxysilane (50% by weight IPA solution), 3.61 g (20 mol %) of dimethyldimethoxysilane, 47.48 g (35% by weight based on the weight of a silica particle-containing polysiloxane) of PL-2L-MA (22.5% by weight MeOH solution), 56.68 g of DAA, 7.70 g of water, 0.088 g of phosphoric acid, and 1.97 g (5 mol %) of 3-trimethoxysilylpropylsuccinic anhydride, the polymerization was performed in the same manner as in Synthesis Example 7 to obtain a polysiloxane solution (A-22). The solid component concentration of the obtained polysiloxane solution (A-22) was 33% by weight, the moisture content was 2.1% by weight, and the weight average molecular weight of the polysiloxane was 1,200.

Synthesis Example 23: Synthesis of Polysiloxane Solution (A-23)

Using 8.17 g (40 mol %) of methyltrimethoxysilane, 37.25 g (50 mol %) of 1-naphthyltrimethoxysilane (50% by weight IPA solution), 1.83 g (5 mol %) of diphenyldimethoxysilane, 49.33 g (35% by weight based on the weight of a silica particle-containing polysiloxane) of PL-2L-MA (22.5% by weight MeOH solution), 58.89 g of DAA, 8.11 g of water, 0.092 g of phosphoric acid, and 1.97 g (5 mol %) of 3-trimethoxysilylpropylsuccinic anhydride, the polymerization was performed in the same manner as in Synthesis Example 7 to obtain a polysiloxane solution (A-23). The solid component concentration of the obtained polysiloxane solution (A-23) was 34% by weight, the moisture content was 2.5% by weight, and the weight average molecular weight of the polysiloxane was 1,300.

Synthesis Example 24: Synthesis of Polysiloxane Solution (A-24)

Using 7.15 g (35 mol %) of methyltrimethoxysilane, 37.25 g (50 mol %) of 1-naphthyltrimethoxysilane (50% by weight IPA solution), 0.90 g (5 mol %) of dimethyldimethoxysilane, 1.14 g (5 mol %) of tetramethoxysilane, 46.97 g (35% by weight based on the weight of a silica particle-containing polysiloxane) of PL-2L-MA (22.5% by weight MeOH solution), 56.08 g of DAA, 8.24 g of water, 0.119 g of phosphoric acid, and 1.97 g (5 mol %) of 3-trimethoxysilylpropylsuccinic anhydride, the polymerization was performed in the same manner as in Synthesis Example 7 to obtain a polysiloxane solution (A-24). The solid component concentration of the obtained polysiloxane solution (A-24) was 34% by weight, the moisture content was 2.3% by weight, and the weight average molecular weight of the polysiloxane was 1,400.

Synthesis Example 25: Synthesis of Polysiloxane Solution (A-25)

Using 47.68 g (35 mol %) of methyltrimethoxysilane, 39.66 g (20 mol %) of phenyltrimethoxysilane, 26.23 g (10 mol %) of 3-trimethoxysilylpropylsuccinic anhydride, 82.01 g (35 mol %) of 3-acryloxypropyltrimethoxysilane, 124.28 g of DAA, 55.86 g of water, and 0.391 g of phosphoric acid, the polymerization was performed in the same manner as in Synthesis Example 1 to obtain a polysiloxane solution (A-25). The solid component concentration of the obtained polysiloxane solution (A-25) was 40% by weight, the moisture content was 1.6% by weight, and the weight average molecular weight of the polysiloxane was 5,500.

Synthesis Example 26: Synthesis of Polysiloxane Solution (A-26)

Using 47.68 g (35 mol %) of methyltrimethoxysilane, 99.34 g (20 mol %) of 1-naphthyltrimethoxysilane (50% by weight IPA solution), 26.23 g (10 mol %) of 3-trimethoxysilylpropylsuccinic anhydride, 82.01 g (35 mol %) of 3-acryloxypropyltrimethoxysilane, 133.91 g of DAA, 55.86 g of water, and 0.411 g of phosphoric acid, the polymerization was performed in the same manner as in Synthesis Example 1 to obtain a polysiloxane solution (A-26). The solid component concentration of the obtained polysiloxane solution (A-26) was 39% by weight, the moisture content was 1.8% by weight, and the weight average molecular weight of the polysiloxane was 5,300.

Synthesis Example 27: Synthesis of Polysiloxane Solution (A-27)

In a three-necked flask, 7.15 g (35 mol %) of methyltrimethoxysilane, 5.95 g (20 mol %) of phenyltrimethoxysilane, 12.30 g (35 mol %) of 3-acryloxypropyltrimethoxysilane, 46.38 g (35% by weight based on the weight of a silica particle-containing polysiloxane) of PL-2L-MA (22.5% by weight MeOH solution), and 44.72 g of DAA were charged. Nitrogen was allowed to flow into the flask at 0.05 L/min and the mixed solution was heated to 40° C. in an oil bath while stirring. While further stirring the mixed solution, an aqueous phosphoric acid solution prepared by dissolving 0.059 g of phosphoric acid in 8.38 g of water was added over 10 minutes. After completion of the addition, a silane compound was hydrolyzed by stirring at 40° C. for 30 minutes. After completion of the hydrolysis, 3.93 g (10 mol %) of 3-trimethoxysilylpropylsuccinic anhydride was added. Thereafter, the bath temperature was set at 70° C. and, after stirring for 1 hour, the bath temperature was raised to 120° C. About 1 hour after initiation of temperature rise, the inner temperature of the solution reached 100° C., followed by heating and stirring for 1 to 3 hours (inner temperature is from 105 to 115° C.). After the resin solution obtained by heating and stirring for 1 to 3 hours was cooled by an ice bath, an anion exchange resin and a cation exchange resin were respectively added to the resin solution in the amount of 2% by weight, followed by stirring for 12 hours. After stirring, the anion exchange resin and the cation exchange resin were removed by filtration to obtain a polysiloxane solution (A-27). The solid component concentration of the obtained polysiloxane solution (A-27) was 35% by weight, the moisture content was 2.4% by weight, and the weight average molecular weight of the polysiloxane was 2,400.

Synthesis Example 28: Synthesis of Polysiloxane Solution (A-28)

Using 7.15 g (35 mol %) of methyltrimethoxysilane, 14.90 g (20 mol %) of 1-naphthyltrimethoxysilane (50% by weight IPA solution), 12.30 g (35 mol %) of 3-acryloxypropyltrimethoxysilane, 49.97 g (35% by weight based on the weight of a silica particle-containing polysiloxane) of PL-2L-MA (22.5% by weight MeOH solution), 48.19 g of DAA, 8.38 g of water, 0.062 g of phosphoric acid, and 3.93 g (10 mol %) of 3-trimethoxysilylpropylsuccinic anhydride, the polymerization was performed in the same manner as in Synthesis Example 27 to obtain a polysiloxane solution (A-28). The solid component concentration of the obtained polysiloxane solution (A-28) was 34% by weight, the moisture content was 2.5% by weight, and the weight average molecular weight of the polysiloxane was 2,300.

Synthesis Example 29: Synthesis of Polysiloxane Solution (A-29)

Using 7.15 g (35 mol %) of methyltrimethoxysilane, 14.90 g (20 mol %) of 1-naphthyltrimethoxysilane (50% by weight IPA solution), 13.04 g (35 mol %) of 3-methacryloxypropyltrimethoxysilane, 51.73 g (35% by weight based on the weight of a silica particle-containing polysiloxane) of PL-2L-MA (22.5% by weight MeOH solution), 49.89 g of DAA, 8.38 g of water, 0.063 g of phosphoric acid, and 3.93 g (10 mol %) of 3-trimethoxysilylpropylsuccinic anhydride, the polymerization was performed in the same manner as in Synthesis Example 27 to obtain a polysiloxane solution (A-29). The solid component concentration of the obtained polysiloxane solution (A-29) was 34% by weight, the moisture content was 2.7% by weight, and the weight average molecular weight of the polysiloxane was 2,200.

Synthesis Example 30: Synthesis of Naphthoquinone Diazide Compound (D-1)

Under a dry nitrogen gas flow, 21.23 g (0.05 mol) of TrisP-PA, and 37.62 g (0.14 mol) of 5-naphthoquinonediazidesulfonic acid chloride were weighed in a flask and then dissolved in 450 g of 1,4-dioxane, and then the temperature was controlled to room temperature. To the mixture, a mixed solution of 50 g of 1,4-dioxane and 15.58 g (0.154 mol) of triethylamine was added dropwise while stirring so that the temperature in the system does not become 35° C. or higher. After completion of the dropwise addition, the mixed solution was stirred at 30° C. for 2 hours. After stirring, the precipitated triethylamine salt was removed by filtration and the filtrate was poured into water, followed by stirring. Thereafter, the precipitate thus obtained was collected by filtration. The obtained solid was dried by vacuum drying to obtain a naphthoquinone diazide compound (D-1) having the following structure.

[Chemical Formula 11]

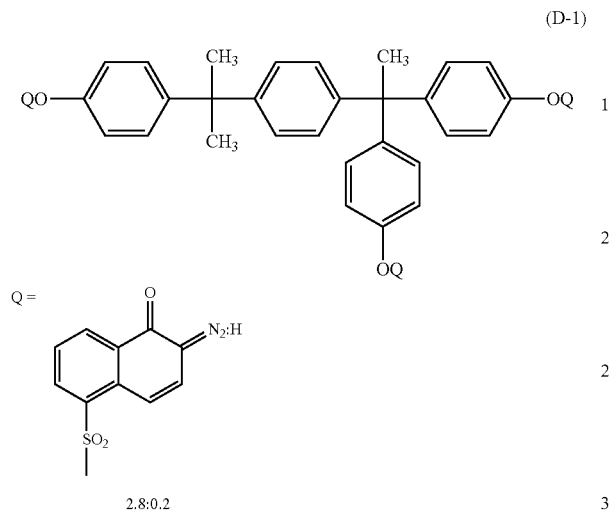

(D-1)

Synthesis Example 31: Synthesis of Naphthoquinone Diazide Compound (D-2)

Using 15.32 g (0.05 mol) of Ph-cc-AP, 37.62 g (0.14 mol) of 5-naphthoquinonediazidesulfonic acid chloride, 450 g of 1,4-dioxane, 50 g of 1,4-dioxane, and 15.58 g (0.154 mol) of triethylamine, a naphthoquinone diazide compound (D-2) having the following structure was obtained in the same manner as in Synthesis Example 30.

[Chemical Formula 12]

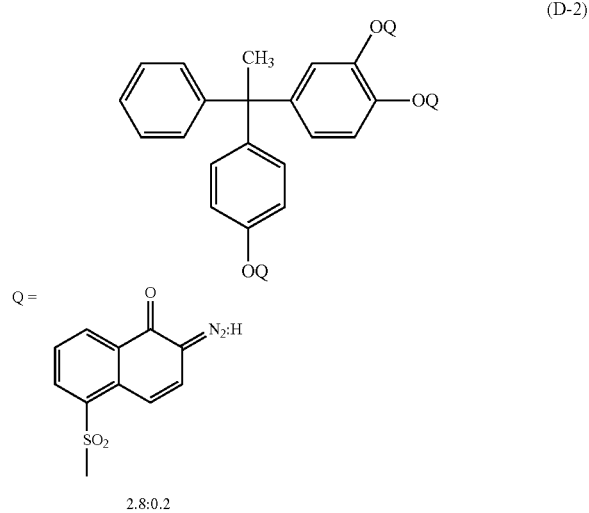

(D-2)

Synthesis Example 32: Synthesis of Naphthoquinone Diazide Compound (D-3)

Using 15.32 g (0.05 mol) of TrisP-HAP, 37.62 g (0.14 mol) of 5-naphthoquinonediazidesulfonic acid chloride, 450 g of 1,4-dioxane, 50 g of 1,4-dioxane, and 15.58 g (0.154 mol) of triethylamine, a naphthoquinone diazide compound (D-3) having the following structure was obtained in the same manner as in Synthesis Example 30.

[Chemical Formula 13]

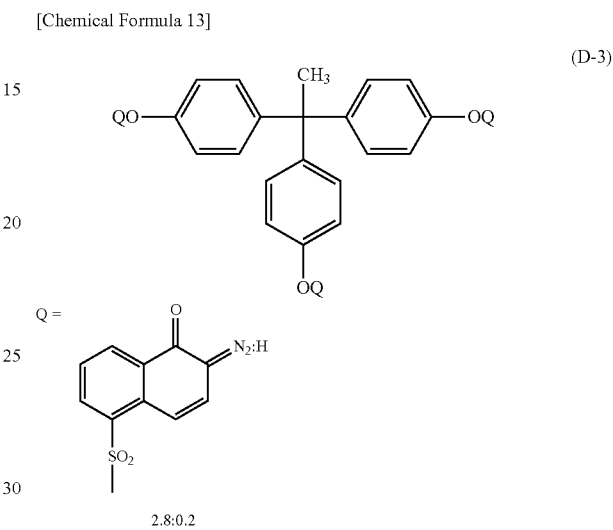

(D-3)

The compositions of Synthesis Examples 1 to 29 are collectively shown in Tables 1 and 2.

Evaluation methods in the respective Examples and Comparative Examples are shown below.

(1) Solid Component Concentration of Polysiloxane Solution

In an aluminum cup whose weight was measured, 1 g of a polysiloxane solution was weighed and then evaporated to dryness by heating at 250° C. for 30 minutes using a hot plate "HP-1SA" (trade name, manufactured by AS ONE Corporation). After heating, the weight of the aluminum cup containing a solid component remaining therein was measured and the weight of the remaining solid component was calculated from a difference in weight before and after heating, thus determining the solid component concentration of the polysiloxane solution.

(2) Moisture Content of Polysiloxane Solution

Using a Karl Fischer moisture titrator "MKS-520" (trade name, manufactured by KYOTO ELECTRONICS MANUFACTURING CO., LTD.) and using a Karl Fischer reagent "HYDRANAL (registered trademark)-Composite 5" (trade name, manufactured by Sigma-Aldrich Corporation) as a titration reagent, the moisture content was measured by a capacity titration method in accordance with "JIS K0113 (2005)".

(3) Weight Average Molecular Weight of Polysiloxane

Using a GPC analyzer "HLC-8220" (manufactured by TOSOH CORPORATION) and using THF as a fluidized layer, GPC measurement was performed and then the weight average molecular weight of a polysiloxane was determined in terms of polystyrene.

(4) Content Ratio of Each Organosilane Unit in Polysiloxane $^{29}$Si-NMR measurement was performed and a ratio of an integrated value of Si derived from a specific organosilane unit to an integrated value of entire Si derived from an organosilane was calculated, and then a content ratio of each organosilane unit was calculated. A sample (liquid) was poured into a NMR sample tube having a diameter of 10 mm made of Teflon (registered trademark) and then used for the measurement $^{29}$Si-NMR measurement conditions are shown below.
Apparatus: Nuclear magnetic resonance apparatus; "JNM-GX270" (manufactured by JEOL, Ltd.)
Measurement method: Gated coupling method
Resonance frequency: 53.6693 MHz ($^{29}$Si nuclei)
Spectrum width: 20,000 Hz
Pulse width: 12 µs (45° pulse)
Pulse repeating time: 30.0 s
Solvent: Acetone-d6
Standard substance: Tetramethylsilane
Measurement temperature: Room temperature
Sample rotational speed: 0.0 Hz
(5) Pretreatment of Substrate Using a hot plate "HP-1SA" (trade name, manufactured by AS ONE Corporation), a 4H—SiC wafer (manufactured by Dow Corning Toray Co., Ltd.) was subjected to a dehydration baking treatment by heating at 130° C. for 2 minutes and then used. Using a hot plate "HP-1SA" (trade name, manufactured by AS ONE Corporation), a Si wafer (manufactured by ELECTRONICS AND MATERIALS CORPORATION) was subjected to a dehydration baking treatment by heating at 130° C. for 2 minutes, subjected to a surface hydrophobization treatment with HMDS at 80° C. for 50 seconds using HMDS treatment device (manufactured by KANSAI TEK Co., Ltd.) and then used. A glass substrate with a single Cr layer formed thereon by sputtering "Single Cr Layer Substrate" (product name, manufactured by KURAMOTO CO., LTD., hereinafter referred to as a Cr substrate) was used without being subjected to a pretreatment.
(6) Firing Using a high temperature inert gas oven "INH-9CD-S" (trade name, manufactured by Koyo Thermo Systems Co., Ltd.), a fired film of a photosensitive resin composition was formed in the below-mentioned manner in Example 1. Firing conditions are as follows. When firing at 500° C., the atmosphere in an oven was purged with nitrogen by maintaining under a nitrogen gas flow at 50° C. for 30 minutes and then the temperature was raised to 220° C. over 30 minutes, followed by maintaining at 220° C. for 30 minutes. Thereafter, the temperature was raised to 500° C. over 1 hour, followed by firing at 500° C. for 30 minutes and further cooling to 50° C. over 2 hours and 30 minutes to form a fired film. When firing at 450° C., the atmosphere in an oven was purged with nitrogen by maintaining under a nitrogen gas flow at 50° C. for 30 minutes and then the temperature was raised to 220° C. over 30 minutes, followed by maintaining at 220° C. for 30 minutes. Thereafter, the temperature was raised to 450° C. over 1 hour, followed by firing at 450° C. for 30 minutes and further cooling to 50° C. over 2 hours to form a fired film. When firing at 400° C., the atmosphere in an oven was purged with nitrogen by maintaining under a nitrogen gas flow at 50° C. for 30 minutes and then the temperature was raised to 220° C. over 30 minutes, followed by maintaining at 220° C. for 30 minutes. Thereafter, the temperature was raised to 400° C. over 45 minutes, followed by firing at 400° C. for 30 minutes and further cooling to 50° C. over 2 hours to form a fired film. When firing at 350° C., the atmosphere in an oven was purged with nitrogen by maintaining under a nitrogen gas flow at 50° C. for 30 minutes and then the temperature was raised to 220° C. over 30 minutes, followed by maintaining at 220° C. for 30 minutes. Thereafter, the temperature was raised to 350° C. over 30 minutes, followed by firing at 350° C. for 30 minutes and further cooling to 50° C. over 1 hour and 30 minutes to form a fired film. When firing at 300° C., the atmosphere in an oven was purged with nitrogen by maintaining under a nitrogen gas flow at 50° C. for 30 minutes and then the temperature was raised to 220° C. over 30 minutes, followed by maintaining at 220° C. for 30 minutes. Thereafter, the temperature was raised to 300° C. over 20 minutes, followed by firing at 350° C. for 30 minutes and further cooling to 50° C. over 1 hour and 15 minutes to form a fired film.
(7) Measurement of Film Thickness Using spectrometric film thickness measurement system "Lambda Ace VM-1030" (trade name, manufactured by DAINIPPON SCREEN MFG. CO., LTD.), the film thickness was measured by setting a refractive index at 1.55.
(8) Value of Film Thickness Loss of Unexposed Area The value of a film thickness loss of the unexposed area during development was calculated in accordance with the following equation.

Value of film thickness loss of unexposed area=value of film thickness of unexposed area before development−value of film thickness of unexposed area after development (9) Sensitivity Using a double-face alignment one-face stepper "MaskAligner PENT-6M" (trade name, manufactured by UNION OPTICAL CO., LTD.), patterning exposure was performed by exposing to j-line (wavelength of 313 nm), i-line (wavelength of 365 nm), h-line (wavelength of 405 nm) and g-line (wavelength of 436 nm) of a ultra-high pressure mercury lamp through a grayscale mask for measurement of sensitivity "MDRM MODEL 4000-5-FS" (trade name, manufactured by Opto-Line International) in accordance with the below-mentioned method in Example 1, and then the development was performed using a portable developer for photolithography "AD-2000" (manufactured by Takizawa Sangyo Co, Ltd.). After the development, the obtained resolution pattern was observed using an FPD inspection microscope "MX-61L" (trade name, manufactured by Olympus Corporation). Exposure and development were performed in the same manner as mentioned above, except that the exposure time were changed, and an exposure dose capable of forming a L&S pattern having a line width of 10 µm at a ratio of 1:1 (value of i-line illuminometer, hereinafter referred to as an optimum exposure dose) was regarded as sensitivity.
(10) Resolution Using a reduced projection-type stepper "i-line Stepper NSR-2005i9C" (trade name, manufactured by Nikon Corporation), patterning exposure was performed by the below-mentioned method in Example 1, and the development was performed using a portable developer for photolithography "AD-2000" (manufactured by Takizawa Sangyo Co., Ltd.), and then firing was performed using a high temperature inert gas oven "INH-9CD-S" (trade name, manufactured by Koyo Thermo Systems Co., Ltd.). After firing, a resolution pattern of the obtained fired film was observed using a FPD inspection microscope "MX-61L" (trade name, manufactured by Olympus Corporation). Exposure, development and firing were performed in the same manner as mentioned above, except that the exposure time were changed, and the size of a minimum pattern obtained in an optimum exposure dose was regarded as resolution.

(11) Pattern Shape

In the same manner as in (10), a fired film of a photosensitive resin composition was formed by the below-mentioned method in Example 1. After firing, profile of a resolution pattern of the obtained fired film was observed using a field emission-type scanning electron microscope "S-4800" (trade name, manufactured by Hitachi High-Technologies Corporation).

(12) Heat Resistance

A fired film of a photosensitive resin composition was formed on a Cr substrate in the same manner as in Example 1. The fired film thus obtained was shaved off from the substrate and about 10 mg of the fired film was put in an aluminum cell. Using a thermogravimeter "TGA-50" (trade name, manufactured by Shimadzu Corporation), this aluminum cell was maintained in a nitrogen atmosphere at 30° C. for 10 minutes, and then thermogravimetric analysis was performed while raising the temperature to 800° C. at a temperature rise rate of 10° C./min. After measuring 1% weight-loss temperature (Td1%) at which a weight loss becomes 1%, each temperature Td1% was compared. The higher the Td1%, more satisfactory heat resistance is.

(13) Cracking-Resistant Film Thickness

A fired film of a photosensitive resin composition was formed on a Si wafer in the same manner as in Example 1 in a thickness ranging from 1.0 to 6.0 μm. After firing, it was observed whether or not cracking occurs on a surface of the fired film using a FPD inspection microscope "MX-61L" (trade name, manufactured by Olympus Corporation). The value of a maximum film thickness of the cracking-free fired film was regarded as a cracking-resistant film thickness, and then the cracking-resistant film thickness was compared. The larger the cracking-resistant film thickness, more satisfactory cracking resistance is.

(14) Al Ion Implantation Depth

A fired film of a Photosensitive resin composition and an Al ion implanted film were formed on a Si wafer in the same manner as in Example 1. Implantation conditions of Al ion implantation are shown below. Al ion implantation was performed under the conditions where the firing temperature becomes equivalent to the ion implantation temperature.

Apparatus: Ion implantation apparatus "MODEL 2100 Ion Implanter" (trade name, manufactured by Veeco Manufacturing, Inc.)
Ion species: Al
Dose: 1E+14 ions/cm$^2$
Energy amount: 180 keV
Implantation temperature: 500° C., 450° C., 400° C., 350° C., 300° C., or 120° C.
Vacuum degree: 2E-6 Torr After Al ion implantation, Al ion concentration versus film thickness was measured using a SIMS analyzer "SIMS4550" (trade name, manufactured by FEI Corporation). Regarding depth profile of the Al ion concentration, the value of the film thickness of each peak top was compared. The smaller the value of the film thickness of peak top, the higher mask performance to Al ion implantation is. The measurement conditions of SIMS measurement are shown below.

Element of interest: Al
Primary ion species: $O_2^+$
Primary ion acceleration energy: 5 keV
Secondary ion polarity: Positive
Mass resolution: Normal
Oxygen leak: No
Electrification compensation: E-gun Example 1

Under yellow light, 0.458 g of the naphthoquinone diazide compound (D-1) obtained in Synthesis Example 30 was weighed, and 2.118 g of DAA and 7.200 g of PGMEA were added as solvents, and then the compound was dissolved by stirring. Next, 14.222 g of the polysiloxane solution (A-1) obtained in Synthesis Example 1 was added, followed by stirring to obtain a uniform solution. Thereafter, the obtained solution was filtered with a 0.45 μm filter to prepare a composition 1.

Using a spin coater "MS-A100" (product name, manufactured by MIKASA CO., LTD.), the composition 1 thus prepared was Coated on a 4H—SiC wafer by spin coating at an optional rotational speed, and then prebaked at 100° C. for 2 minutes using a hot plate "SCW-636" (trade name, manufactured by DAINIPPON SCREEN MFG. CO., LTD.) to form a prebaked film having a film thickness of about 2.0 pin.

The obtained prebaked film was exposed by any one of the following methods. The prebaked film thus obtained was allowed to undergo patterning exposure by exposing to j-line (wavelength of 313 nm) i-line (wavelength of 365 nm), h-line (wavelength of 405 nm) and g-line (wavelength of 436 nm) of a ultra-high pressure mercury lamp through a grayscale mask for measurement of sensitivity "MDRM MODEL 4000-5-FS" (trade name, manufactured by Opto-Line International), using a double-face alignment one-face stepper "Mask Aligner PEM-6M" (trade name, manufactured by UNION OPTICAL CO., LTD.). Alternatively, a cut recticle having a desired pattern was mounted to a reduced projection-type stepper "i-line Stepper NSR-2005i9C" (trade name, manufactured by Nikon Corporation) and then patterning exposure was performed by exposing to i-line (wavelength of 365 nm). After the exposure, the film was developed with an aqueous 2.38% by weight TMAH solution "NMD-W" for 60 seconds using a portable developer for photolithography "AD-2000" (manufactured by Takizawa Sangyo Co., Ltd.) and then rinsed with water for 30 seconds. After the development, middle baking was performed by heating at 120° C. for 5 minutes using a hot plate "HP-1SA" (trade name, manufactured by AS ONE Corporation).

Thereafter, firing was performed at 500° C. using a high temperature inert gas oven "INH-9CD-S" (trade name, manufactured by Koyo Thermo Systems Co., Ltd.). Firing conditions are as follows. The atmosphere in an oven was purged with nitrogen by maintaining under a nitrogen gas flow at 50° C. for 30 minutes and then the temperature was raised to 220° C. over 30 minutes, followed by maintaining at 220° C. for 30 minutes. Thereafter, the temperature was raised to 500° C. over 1 hour, followed by firing at 500° C. for 30 minutes and further cooling to 50° C. over 2 hours and 30 minutes to form a fired film having a film thickness of about 1.8 μm.

Figure 7:
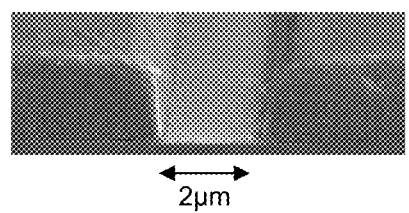
FIG. 7 is a pattern shape photograph after firing using a photosensitive resin composition of the present invention.

After firing, profile of a resolution pattern having resolution of 2 μm in the fired film was observed using a field emission-type scanning electron microscope "S-4800" (trade name, manufactured by Hitachi High-Technologies Corporation). The pattern shape is shown in FIG. 7. The pattern had a satisfactory pattern shape having a taper angle of 85° which is nearly perpendicular.

Figure 8:
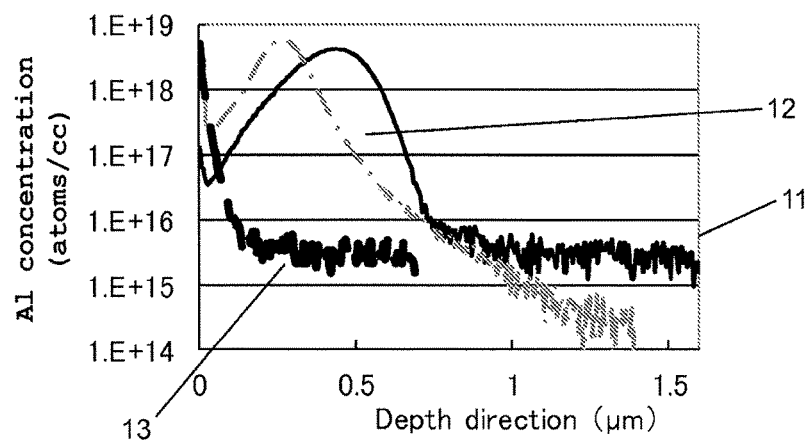
FIG. 8 is a graph showing Al ion concentration versus implantation depth after Al ion implantation.

The fired film thus obtained was subjected to Al ion implantation at 500° C. to form an Al ion implanted film in which Al ions are implanted into the fired film. Large decrease in vacuum degree was not observed during ion implantation. After Al ion implantation, regarding each of the Al ion implanted film and the fired film-free portion where Al ions are implanted into 4H—SiC, Al ion concentration versus film thickness was measured using a SIMS analyzer "SIMS4550" (trade name, manufactured by FEI Corporation). As a reference sample, a fired film, which is not subjected to Al ion implantation after firing, was also allowed to undergo the SIMS measurement. FIG. 8 shows the results of SIMS measurement in which the depth direction from a surface is plotted on the abscissas, while the Al concentration is plotted on the ordinate. Reference sign 11 is an Al concentration plot of an Al ion implanted film, reference sign 12 is an Al concentration plot of the portion where Al ions are implanted into 4H—SiC, and reference sign 13 is an Al concentration plot of a fired film which is not subjected to Al ion implantation. As is apparent from FIG. 8, regarding the Al ion implanted film, Al ions are implanted up to the value of the film thickness (about 0.8 μm), the value of the film thickness (about 0.5 μm) of the Al ion implantation depth being recognized as a peak top of the Al concentration. Regarding the fired film which is not subjected to Al ion implantation, a base line of the Al concentration is about $10^{15}$ atoms/cc and is the same as that of the Al ion implanted film. These results revels that the fired film of the composition 1 has sufficient mask performance against Al ion implantation since the Al ion implantation depth is less than the film thickness of the fired film in a 4H—SiC substrate. Regarding the portion where Al ions are implanted into 4H—SiC, the value of the film thickness (about 0.3 μm) of the Al ion implantation depth is found to be a peak top of the Al concentration.

Examples 2 to 42 and Comparative Example 1

In the same manner as in the composition 1, compositions 2 to 43 were prepared in accordance with each formulation shown in Tables 3 to 6. Using the obtained respective compositions, photosensitivity and properties of fired films were evaluated in the same manner as in Example 1. These results are collectively shown in Tables 3 to 6. In Comparative Example 1, a novolak resin XPS-4958G was used in place of a polysiloxane (A). In Comparative Example 1, firing was performed at 500° C., 450° C., 400° C. or 350° C. in the same manner as in Example 1. However, it was impossible to form a desired fired film due to lack of heat resistance.

TABLE 1

| | Polysiloxane solution | | Organosilane monomer ratio [mol %] | | |
|---|---|---|---|---|---|
| Synthesis Example 1 | Polysiloxane solution (A-1) | — | Phenyltrimethoxysilane (83.3) | — | — |
| Synthesis Example 2 | Polysiloxane solution (A-2) | Methyltrimethoxysilane (40) | Phenyltrimethoxysilane (50) | — | — |
| Synthesis Example 3 | Polysiloxane solution (A-3) | Methyltrimethoxysilane (16.4) | Phenyltrimethoxysilane (82) | — | — |
| Synthesis Example 4 | Polysiloxane solution (A-4) | Methyltrimethoxysilane (40) | Phenyltrimethoxysilane (50) | — | — |
| Synthesis Example 5 | Polysiloxane solution (A-5) | Methyltrimethoxysilane (10) | | — | Tetramethoxysilane (15) |
| Synthesis Example 6 | Polysiloxane solution (A-6) | Methyltrimethoxysilane (40) | | — | — |
| Synthesis Example 7 | Polysiloxane solution (A-7) | | | | |
| Synthesis Example 8 | Polysiloxane solution (A-8) | | 4-Tolyltrimethoxysilane (50) | — | — |
| Synthesis Example 9 | Polysiloxane solution (A-9) | | 1-Naphthyltrimethoxysilane (50) | — | — |
| Synthesis Example 10 | Polysiloxane solution (A-10) | Ethyltrimethoxysilane (40) | | | |
| Synthesis Example 11 | Polysiloxane solution (A-11) | Methyltrimethoxysilane (40) | | | |
| Synthesis Example 12 | Polysiloxane solution (A-12) | | | — | — |
| Synthesis Example 13 | Polysiloxane solution (A-13) | | | | |
| Synthesis Example 14 | Polysiloxane solution (A-14) | | | | |
| Synthesis Example 15 | Polysiloxane solution (A-15) | | | | |

| | Polysiloxane solution | Organosilane monomer ratio [mol %] | | | Content ratio of silica particles |
|---|---|---|---|---|---|
| Synthesis Example 1 | Polysiloxane solution (A-1) | 3-Trimethoxysilylpropylsuccinic anhydride (16.7) | — | — | PL-2L-MA (21.7 wt %) |
| Synthesis Example 2 | Polysiloxane solution (A-2) | — | 2-(3,4-Epoxycyclohexyl) ethyltrimethoxysilane (10) | — | — |
| Synthesis Example 3 | Polysiloxane solution (A-3) | 3-Trimethoxysilylpropylsuccinic anhydride (1.6) | — | — | PL-2L (22.2 wt %) |
| Synthesis Example 4 | Polysiloxane solution (A-4) | — | 2-(3,4-Epoxycyclohexyl) ethyltrimethoxysilane (10) | — | PL-2L-MA (23 wt %) |
| Synthesis Example 5 | Polysiloxane solution (A-5) | — | 2-(3,4-Epoxycyclohexyl) ethyltrimethoxysilane (5) | Vinyltrimethoxysilane (20) | — |
| Synthesis Example 6 | Polysiloxane solution (A-6) | — | 2-(3,4-Epoxycyclohexyl) ethyltrimethoxysilane (10) | — | PL-2L-MA (35 wt %) |
| Synthesis Example 7 | Polysiloxane solution (A-7) | 3-Trimethoxysilylpropylsuccinic anhydride | — | — | |

TABLE 1-continued

| | Polysiloxane solution | | | |
|---|---|---|---|---|
| Synthesis Example 8 | Polysiloxane solution (A-8) | (10) | — | — |
| Synthesis Example 9 | Polysiloxane solution (A-9) | | — | — |
| Synthesis Example 10 | Polysiloxane solution (A-10) | | — | — |
| Synthesis Example 11 | Polysiloxane solution (A-11) | | — | — | PL-2L-MA (23 wt %) |
| Synthesis Example 12 | Polysiloxane solution (A-12) | | — | — | PL-2L-MA (47 wt %) |
| Synthesis Example 13 | Polysiloxane solution (A-13) | | — | — | PL-2L-MA (60 wt %) |
| Synthesis Example 14 | Polysiloxane solution (A-14) | | — | — | PL-2L (35 wt %) |
| Synthesis Example 15 | Polysiloxane solution (A-15) | | — | — | PL-2L-IPA (35 wt %) |

TABLE 2

| | Polysiloxane solution | Organosilane monomer ratio [mol %] | | |
|---|---|---|---|---|
| Synthesis Example 16 | Polysiloxane solution (A-16) | Methyltrimethoxysilane (40) | 1-Naphthyltrimethoxysilane (50) | — | — |
| Synthesis Example 17 | Polysiloxane solution (A-17) | | | — | — |
| Synthesis Example 18 | Polysiloxane solution (A-18) | | | — | Tetramethoxysilane (5) |
| Synthesis Example 19 | Polysiloxane solution (A-19) | Methyltrimethoxysilane (35) | | — | Tetramethoxysilane (10) |
| Synthesis Example 20 | Polysiloxane solution (A-20) | Methyltrimethoxysilane (40) | | — | Tetraethoxysilane (5) |
| Synthesis Example 21 | Polysiloxane solution (A-21) | | | Dimethyldimethoxysilane (5) | — |
| Synthesis Example 22 | Polysiloxane solution (A-22) | Methyltrimethoxysilane (25) | | Dimethyldimethoxysilane (20) | — |
| Synthesis Example 23 | Polysiloxane solution (A-23) | Methyltrimethoxysilane (40) | | Diphenyldimethoxysilane (5) | — |
| Synthesis Example 24 | Polysiloxane solution (A-24) | Methyltrimethoxysilane (35) | | Dimethyldimethoxysilane (5) | Tetramethoxysilane (5) |
| Synthesis Example 25 | Polysiloxane solution (A-25) | | Phenyltrimethoxysilane (20) | — | — |
| Synthesis Example 26 | Polysiloxane solution (A-26) | | 1-Naphthyltrimethoxysilane (20) | — | — |
| Synthesis Example 27 | Polysiloxane solution (A-27) | | Phenyltrimethoxysilane (20) | — | — |
| Synthesis Example 28 | Polysiloxane solution (A-28) | | 1-Naphthyltrimethoxysilane (20) | — | — |
| Synthesis Example 29 | Polysiloxane solution (A-29) | | | — | — |

| | Polysiloxane solution | Organosilane monomer ratio [mol %] | | | Content ratio of silica particles |
|---|---|---|---|---|---|
| Synthesis Example 16 | Polysiloxane solution (A-16) | 3-Trimethoxysilylpropylsuccinic anhydride (10) | — | — | PL-2L-PGME (35 wt %) |
| Synthesis Example 17 | Polysiloxane solution (A-17) | | | | PL-2L-DAA (35 wt %) |
| Synthesis Example 18 | Polysiloxane solution (A-18) | 3-Trimethoxysilylpropylsuccinic anhydride (5) | | | PL-2L-MA (35 wt %) |
| Synthesis Example 19 | Polysiloxane solution (A-19) | | | | |
| Synthesis Example 20 | Polysiloxane solution (A-20) | | | | |
| Synthesis Example 21 | Polysiloxane solution (A-21) | | | | |
| Synthesis Example 22 | Polysiloxane solution (A-22) | | | | |
| Synthesis Example 23 | Polysiloxane solution (A-23) | | | | |
| Synthesis Example 24 | Polysiloxane solution (A-24) | | | | |
| Synthesis Example 25 | Polysiloxane solution (A-25) | 3-Trimethoxysilylpropylsuccinic anhydride (10) | — | 3-Acryloxypropyltrimethoxysilane (35) | — |
| Synthesis Example 26 | Polysiloxane solution (A-26) | | | | |

TABLE 2-continued

| | | | | |
|---|---|---|---|---|
| Synthesis Example 27 | Polysiloxane solution (A-27) | — | | PL-2L-MA (35 wt %) |
| Synthesis Example 28 | Polysiloxane solution (A-28) | — | | |
| Synthesis Example 29 | Polysiloxane solution (A-29) | — | 3-Methacryloxypropyltri-methoxysilane (35) | |

TABLE 3

| | Composition | (A) Poly-siloxane | (B1) Photoacid generator (B2) Photobase generator | (B3) Thermal acid generator (B4) Thermal base generator | (C) Inorganic particles | (D) Naphtho-quinone diazide compound | (E1) Photo-polymerization initiator (E2) Photosensitizer | (F) Photo-polymerizable compound | Solvent |
|---|---|---|---|---|---|---|---|---|---|
| Example 1 | 1 | A-1 (100) | — | — | — | D-1 (7) | — | — | DAA PGMEA |
| Example 2 | 2 | A-2 (100) | — | — | — | D-2 (7) | — | — | |
| Example 3 | 3 | A-3 (100) | — | — | — | D-2 (15) | — | — | |
| Example 4 | 4 | — | — | SI-200 (3) | — | — | — | — | |
| Example 5 | 5 | A-2 (100) | — | — | PL-2L-PGME (20) | D-2 (10) | — | — | |
| Example 6 | 6 | A-4 (100) | — | — | — | D-2 (9) | — | — | |
| Example 7 | 7 | A-5 (100) | — | — | — | — | — | — | |
| Example 8 | 8 | A-6 (100) | — | — | — | — | — | — | |
| Example 9 | 9 | A-7 (100) | — | — | — | — | — | — | |
| Example 10 | 10 | A-8 (100) | — | — | — | — | — | — | |
| Example 11 | 11 | A-9 (100) | — | — | — | — | — | — | |
| Example 12 | 12 | A-10 (100) | — | — | — | — | — | — | |
| Example 13 | 13 | A-11 (100) | — | — | — | — | — | — | |

| | Composition | Content of inorganic particles based on whole solid content [wt %] | Film thickness loss value of unexposed area [μm] | Sensitivity [mJ/cm²] | Firing temperature [° C.] | Resolution [μm] | 1% Weight-loss temperature [° C.] | Cracking-resistant film thickness [μm] | Film thickness value of peak top of Al ion implantation depth [μm] |
|---|---|---|---|---|---|---|---|---|---|
| Example 1 | 1 | 20.3 | 0.100 | 40 | 500 | 3.0 | 550 | 1.3 | 0.50 |
| Example 2 | 2 | 0 | 0.100 | 40 | 500 | 2.0 | 530 | 1.1 | 0.60 |
| Example 3 | 3 | 19.3 | 0.070 | 50 | 500 | 3.0 | 555 | 1.4 | 0.45 |
| Example 4 | 4 | 18.8 | 0.070 | 50 | 500 | 3.0 | 555 | 1.5 | 0.45 |
| Example 5 | 5 | 15.4 | 0.100 | 40 | 500 | 4.0 | 540 | 1.2 | 0.55 |
| Example 6 | 6 | 21.1 | 0.050 | 50 | 500 | 3.0 | 550 | 1.2 | 0.50 |
| Example 7 | 7 | 0 | 0.080 | 40 | 500 | 2.0 | 525 | 1.0 | 0.60 |
| Example 8 | 8 | 32.1 | 0.030 | 50 | 500 | 4.0 | 555 | 1.3 | 0.40 |
| Example 9 | 9 | 32.1 | 0.040 | 30 | 500 | 3.0 | 555 | 1.3 | 0.40 |
| Example 1;normal0 | 10 | 32.1 | 0.040 | 30 | 500 | 3.0 | 555 | 1.3 | 0.40 |

TABLE 3-continued

| | | | | | | | | | |
|---|---|---|---|---|---|---|---|---|---|
| Example 11 | 32.1 | 0.030 | 40 | 500 | 2.0 | 560 | 1.4 | 0.40 |
| Example 12 | 32.1 | 0.030 | 40 | 500 | 2.0 | 560 | 1.4 | 0.40 |
| Example 13 | 21.1 | 0.040 | 40 | 500 | 2.0 | 550 | 1.2 | 0.50 |

TABLE 4

| | | | Composition [Parts by weight] | | | | | |
|---|---|---|---|---|---|---|---|---|
| | Composition | (A) Polysiloxane | (B1) Photoacid generator (B2) Photobase generator | (B3) Thermal acid generator (B4) Thermal base generator | (C) Inorganic particles | (D) Naphtho-quinone diazide compound | (E1) Photo-polymerization initiator (E2) Photosensitizer | (F) Photo-polymerizable compound | Solvent |
| Example 14 | 14 | A-12 (100) | — | — | — | D-2 (9) | — | — | DAA PGMEA |
| Example 15 | 15 | A-13 (100) | — | — | — | — | — | — | |
| Example 16 | 16 | A-14 (100) | — | — | — | — | — | — | |
| Example 17 | 17 | A-15 (100) | — | — | — | — | — | — | |
| Example 18 | 18 | A-16 (100) | — | — | — | — | — | — | |
| Example 19 | 19 | A-17 (100) | — | — | — | — | — | — | |
| Example 20 | 20 | A-18 (100) | — | — | — | — | — | — | |
| Example 21 | 21 | A-19 (100) | — | — | — | — | — | — | |
| Example 22 | 22 | A-20 (100) | — | — | — | — | — | — | |
| Example 23 | 23 | A-21 (100) | . | — | — | — | — | — | |
| Example 24 | 24 | A-22 (100) | — | — | — | — | — | — | |
| Example 25 | 25 | A-23 (100) | — | — | — | — | — | — | |
| Example 26 | 26 | A-24 (100) | — | — | — | — | — | — | |

| | Composition | Content of inorganic particles based on whole solid content [wt %] | Film thickness loss value of unexposed area [μm] | Sensitivity [mJ/cm$^2$] | Firing temperature [° C.] | Resolution [μm] | 1% Weight-loss temperature [° C.] | Cracking-resistant film thickness [μm] | Film thickness value of peak top of Al ion implantation depth [μm] |
|---|---|---|---|---|---|---|---|---|---|
| Example 14 | 14 | 43.1 | 0.020 | 50 | 500 | 2.0 | 565 | 1.5 | 0.40 |
| Example 15 | 15 | 55.0 | 0.010 | 60 | 500 | 2.0 | 570 | 1.6 | 0.35 |
| Example 16 | 16 | 32.1 | 0.020 | 50 | 500 | 2.0 | 560 | 1.5 | 0.40 |
| Example 17 | 17 | 32.1 | 0.030 | 40 | 500 | 2.0 | 560 | 1.4 | 0.40 |
| Example 18 | 18 | 32.1 | 0.030 | 40 | 500 | 2.0 | 560 | 1.4 | 0.40 |
| Example 19 | 19 | 32.1 | 0.030 | 40 | 500 | 2.0 | 560 | 1.4 | 0.40 |
| Example 20 | 20 | 32.1 | 0.010 | 30 | 500 | 2.0 | 560 | 1.3 | 0.40 |
| Example 21 | 21 | 32.1 | 0.020 | 30 | 500 | 2.0 | 560 | 1.2 | 0.40 |
| Example 22 | 22 | 32.1 | 0.010 | 30 | 500 | 2.0 | 560 | 1.3 | 0.40 |
| Example 23 | 23 | 32.1 | 0.010 | 50 | 500 | 2.0 | 560 | 1.5 | 0.40 |
| Example 24 | 24 | 32.1 | 0.010 | 60 | 500 | 2.0 | 560 | 1.6 | 0.40 |

TABLE 4-continued

| | | | | | | | | |
|---|---|---|---|---|---|---|---|---|
| Example 25 | 25 | 32.1 | 0.010 | 50 | 500 | 2.0 | 560 | 1.5 | 0.40 |
| Example 26 | 26 | 32.1 | 0.010 | 40 | 500 | 2.0 | 560 | 1.4 | 0.40 |

TABLE 5

| | | Composition [Parts by weight] | | | | | | | |
|---|---|---|---|---|---|---|---|---|---|
| | Composition | (A) Polysiloxane | (B1) Photoacid generator (B2) Photobase generator | (B3) Thermal acid generator (B4) Thermal base generator | (C) Inorganic particles | (D) Naphtho-quinone diazide compound | (E1) Photo-polymerization initiator (E2) Photo-sensitizer | (F) Photo-polymerizable compound | Solvent |
| Example 27 | 27 | A-2 (100) | — | SI-200 (1) | — | D-2 (9) | — | — | DAA PGMEA |
| Example 28 | 28 | A-9 (100) | — | — | — | — | — | — | |
| Example 29 | 29 | | — | — | — | — | — | — | |
| Example 30 | 30 | | — | — | — | — | — | — | |
| Example 31 | 31 | | — | SI-200 (1) | — | — | — | — | |
| Example 32 | 32 | | MDT (1) | — | — | — | — | — | |
| Example 33 | 33 | | — | PL-2L-PGME (20) | — | — | — | — | |
| Example 34 | 34 | | — | SI-200 (1) | — | — | — | — | |
| Example 35 | 35 | | — | — | — | D-1 (9) | — | — | |
| Example 36 | 36 | | — | — | — | D-3 (9) | — | — | |
| Comparative 1 | 43 | XPS-4958G*[1] (100) | — | — | — | D-2 (40) | — | — | PGMEA GBL |

| | | Content of inorganic particles based on whole solid content [wt %] | Photosensitive properties and properties of fired film | | | | | | |
|---|---|---|---|---|---|---|---|---|---|
| | Composition | | Film thickness loss value of unexposed area [μm] | Sensitivity [mJ/cm²] | Firing temperature [° C.] | Resolution [μm] | 1% Weight-loss temperature [° C.] | Cracking-resistant film thickness [μm] | Film thickness value of peak top of Al ion implantation depth [μm] |
| Example 27 | 27 | 0 | 0.100 | 40 | 500 | 2.0 | 530 | 1.1 | 0.60 |
| Example 28 | 28 | 32.1 | 0.030 | 40 | 450 | 2.0 | 500 | 1.9 | 0.50 |
| Example 29 | 29 | 32.1 | 0.030 | 40 | 400 | 2.0 | 450 | 2.8 | 0.60 |
| Example 30 | 30 | 32.1 | 0.030 | 40 | 350 | 2.0 | 390 | 4.3 | 0.70 |
| Example 31 | 31 | 31.8 | 0.030 | 40 | 500 | 2.0 | 560 | 1.4 | 0.40 |
| Example 32 | 32 | 31.8 | 0.030 | 40 | 500 | 2.0 | 560 | 1.4 | 0.40 |
| Example 33 | 33 | 42.6 | 0.030 | 40 | 500 | 4.0 | 560 | 1.4 | 0.35 |
| Example 34 | 34 | 42.3 | 0.030 | 40 | 500 | 4.0 | 560 | 1.4 | 0.35 |
| Example 35 | 35 | 32.1 | 0.030 | 40 | 500 | 2.0 | 560 | 1.4 | 0.40 |
| Example 36 | 36 | 32.1 | 0.030 | 40 | 500 | 2.0 | 560 | 1.4 | 0.40 |
| Comparative 1 | 43 | 0 | 0.100 | 30 | 120 | 2.0 | 160 | >3.0 | 0.80 |

*[1] XPS-4958G is a novolak resin.

TABLE 6

| | | Composition [Parts by weight] | | | | | | | |
|---|---|---|---|---|---|---|---|---|---|
| | Composition | (A) Polysiloxane | (B1) Photoacid generator (B2) Photobase generator | (B3) Thermal acid generator (B4) Thermal base generator | (C) Inorganic particles | (D) Naphtho-quinone diazide compound | (E1) Photo-polymerization initiator (E2) Photosensitizer | (F) Photo-polymerizable compound | Solvent |
| Example 37 | 37 | A-25 (100) | — | — | — | — | OXE-01 (5) | DPHA (40) | DAA PGMEA |

TABLE 6-continued

| | Composition | | | | | | | | |
|---|---|---|---|---|---|---|---|---|---|
| Example 38 | 38 | A-26 (100) | — | — | — | — | | | |
| Example 39 | 39 | A-27 (100) | — | — | — | — | | | |
| Example 40 | 40 | A-28 (100) | — | — | — | — | | | |
| Example 41 | 41 | A-29 (100) | — | — | — | — | | | |
| Example 42 | 42 | A-28 (100) | — | — | — | — | OXE-01 (5) IC-907 (3) | | |
| Comparative Example 1 | 43 | XPS-4958G*1 (100) | — | — | — | D-2 (40) | — | — | PGMEA GBL |

| | | | Photosensitive properties and properties of fired film | | | | | | |
|---|---|---|---|---|---|---|---|---|---|
| | Composition | Content of inorganic particles based on whole solid content [wt %] | Film thickness loss value of unexposed area [μm] | Sensitivity [mJ/cm²] | Firing temperature [° C.] | Resolution [μm] | 1% Weight-loss temperature [° C.] | Cracking-resistant film thickness [μm] | Film thickness value of peak top of Al ion implantation depth [μm] |
| Example 37 | 37 | 0 | 0.060 | 40 | 300 | 5.0 | 310 | 3.2 | 1.00 |
| Example 38 | 38 | 0 | 0.050 | 50 | 300 | 4.0 | 315 | 3.4 | 1.00 |
| Example 39 | 39 | 24.1 | 0.040 | 50 | 300 | 6.0 | 325 | 3.6 | 0.80 |
| Example 40 | 40 | 24.1 | 0.030 | 60 | 300 | 5.0 | 330 | 3.8 | 0.80 |
| Example 41 | 41 | 24.1 | 0.030 | 60 | 300 | 5.0 | 330 | 3.8 | 0.80 |
| Example 42 | 42 | 23.6 | 0.020 | 50 | 300 | 5.0 | 330 | 3.8 | 0.80 |
| Comparative Example 1 | 43 | 0 | 0.100 | 30 | 120 | 2.0 | 160 | >3.0 | 0.80 |

*1XPS-4958G is a novolak resin.

REFERENCE SIGNS LIST

1: n⁺ Type SiC substrate
2: n⁻ Type SiC epilayer
3: First photosensitive ion implantation mask pattern
4: p Type base region
5: Second photosensitive ion implantation mask pattern
6: n Type source region
7: Gate insulating film
8: Gate electrode
21: SiC wafer
22: SiO₂ film
23: Photosensitive resist
24: Photomask
25: UV
26: Ion implantation region
27: Photosensitive resin composition for ion implantation mask

INDUSTRIAL APPLICABILITY

The photosensitive resin composition of the present invention can be suitably used as a mask in an ion implantation step. According to the photosensitive resin composition of the present invention, it is possible to realize a process-saving high temperature ion implantation process as compared with a conventional ion implantation mask process. According to a method for producing a semiconductor device of the present invention, it is possible to provide a process for producing a power semiconductor with high productivity at low cost as compared with a conventional ion implantation mask process.

The invention claimed is:

1. A photosensitive resin composition which exhibits positive or negative photosensitivity and is used as a mask in an ion implantation step, the photosensitive resin composition comprising:

(A) as a resin, a polysiloxane that includes an organosilane unit having an acidic group selected from a carboxy group, an acid anhydride group, a sulfonic acid group, and a hydroxyimide group; and (C) inorganic particles, wherein the polysiloxane (A) is a polysiloxane obtained by hydrolyzing one or more organosilanes selected from an organosilane represented by the below-mentioned general formula (1) and an organosilane represented by the below-mentioned general formula (2), followed by condensation:

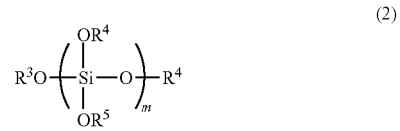

wherein, in formula (1), $R^1$ in the organosilane represents a group selected from hydrogen, an alkyl group having 1 to 10 carbon atoms, a cycloalkyl group having 1 to 10 carbon atoms, an alkenyl group having 2 to 10 carbon atoms and an aryl group having 6 to 15 carbon atoms, and a plurality of $R^1$s may be respectively the same or different;

$R^2$ represents a group selected from hydrogen, an alkyl group having 1 to 6 carbon atoms, an acyl group having 2 to 6 carbon atoms and an aryl group having 6 to 15 carbon atoms, a plurality of $R^2$s being respectively the same or different, the alkyl group, acyl group and aryl group being optionally substituted; and n represents an integer of 1 to 3; and wherein, in formula (2), $R^3$ to $R^6$ each independently represents a group selected from hydrogen, an alkyl group having 1 to 6 carbon atoms, an acyl group having 2 to 6 carbon atoms and an aryl group having 6 to 15 carbon atoms, the alkyl group, acyl group and aryl group being optionally substituted; and m represents an integer of 1 to 8.

2. The photosensitive resin composition according to claim 1, wherein the inorganic particles (C) are silica particles.

3. The photosensitive resin composition according to claim 1, wherein the content of the inorganic particles (C) is 15% by weight or more based on the whole solid content excluding a solvent in the photosensitive resin composition.

4. The photosensitive resin composition according to claim 1, wherein the polysiloxane (A) is an inorganic particle-containing polysiloxane obtained by reacting an organosilane with inorganic particles.

5. The photosensitive resin composition according to claim 1, further comprising at least any one selected from (B1) a photoacid generator, (B2) a photobase generator, (B3) a thermal acid generator, and (B4) a thermal base generator.

6. The photosensitive resin composition according to claim 1, further comprising (D) a naphthoquinone diazide compound.

7. The photosensitive resin composition according to claim 1, further comprising a compound selected from (E1) a photopolymerization initiator and (E2) a photosensitizer.

8. The photosensitive resin composition according to claim 1, further comprising (F) a photopolymerizable compound.

9. The photosensitive resin composition according to claim 1, wherein the acidic group is selected from a carboxy group and an acid anhydride group.

10. A method for producing a semiconductor device, which comprises steps of:
forming a pattern of a photosensitive resin composition as defined in claim 1 on a semiconductor substrate;
firing the pattern of the resin composition to obtain a fired pattern;
implanting ions into the region of the semiconductor substrate where the fired pattern does not exist, using the fired pattern as an ion implantation mask; and
removing the ion implantation masks.

11. The method for producing a semiconductor device according to claim 10, wherein the step of implanting ions is performed at 200 to 1,000° C.

12. The method for producing a semiconductor device, according to claim 10, wherein the semiconductor substrate is a silicon carbide substrate, a gallium nitride substrate, or a diamond substrate.

13. The method for producing a semiconductor device according to claim 10, wherein the content ratio of an organosilane unit having an aromatic group in the polysiloxane is 5 mol % or more.

14. A photosensitive resin composition comprising:
(A) a polysiloxane, (C) inorganic particles, and (D) a naphthoquinone diazide compound,
wherein the polysiloxane (A) is a polysiloxane obtained by hydrolyzing one or more organosilanes selected from an organosilane represented by the general formula (1) and an organosilane represented by the general formula (2), and an organosilane having an acidic group selected from a carboxy group, an acid anhydride group, a sulfonic acid group and a hydroxyimide group, followed by dehydration condensation, and
the content of the inorganic particles (C) is 15% by weight or more based on the whole solid content excluding a solvent in the photosensitive resin composition

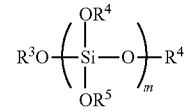

wherein, in formula (1), $R^1$ in the organosilane represents a group selected from hydrogen, an alkyl group having 1 to 10 carbon atoms, a cycloalkyl group having 1 to 10 carbon atoms, an alkenyl group having 2 to 10 carbon atoms and an aryl group having 6 to 15 carbon atoms, and a plurality of R's may be respectively the same or different;

$R^2$ represents a group selected from hydrogen, an alkyl group having 1 to 6 carbon atoms, an acyl group having 2 to 6 carbon atoms and an aryl group having 6 to 15 carbon atoms, a plurality of $R^2$s being respectively the same or different, the alkyl group, acyl group and aryl group being optionally substituted; and n represents an integer of 1 to 3; and wherein, in formula (2), $R^3$ to $R^6$ each independently represents a group selected from hydrogen, an alkyl group having 1 to 6 carbon atoms, an acyl group having 2 to 6 carbon atoms and an aryl group having 6 to 15 carbon atoms, the alkyl group, acyl group and aryl group being optionally substituted; and m represents an integer of 1 to 8.

* * * * *